(12) United States Patent
Kajimoto et al.

(10) Patent No.: US 7,339,227 B2
(45) Date of Patent: Mar. 4, 2008

(54) NONVOLATILE SEMICONDUCTOR MEMORY

(75) Inventors: Minori Kajimoto, Fujisawa (JP); Mitsuhiro Noguchi, Yokohama (JP); Hiroshi Maejima, Chigasaki (JP); Takahiko Hara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/488,093

(22) Filed: Jul. 18, 2006

(65) Prior Publication Data

US 2006/0267069 A1 Nov. 30, 2006

Related U.S. Application Data

(63) Continuation of application No. 10/983,617, filed on Nov. 9, 2004, now Pat. No. 7,145,199.

(30) Foreign Application Priority Data

Nov. 10, 2003 (JP) ............................ P2003-379988

(51) Int. Cl.
  *H01L 29/76* (2006.01)
(52) U.S. Cl. ..................... 257/314; 257/773
(58) Field of Classification Search ................ 257/314, 257/390, 368, 758, 773
  See application file for complete search history.

(56) References Cited

U.S. PATENT DOCUMENTS 6,160,297 A  12/2000 Shimizu et al.

7,145,199 B2 * 12/2006 Kajimoto et al. ........... 257/314
2005/0128843 A1  6/2005 Kajimoto et al.

FOREIGN PATENT DOCUMENTS

| JP | 09-190696 | 7/1997 |
|---|---|---|
| JP | 11-260076 | 9/1999 |
| JP | 11-354758 | 12/1999 |

* cited by examiner

*Primary Examiner*—Mark V. Prenty
(74) *Attorney, Agent, or Firm*—Finnegan, Henderson, Farabow, Garrett & Dunner, L.L.P.

(57) ABSTRACT

A nonvolatile semiconductor memory according to the present invention includes memory cell units, which include data select lines formed in parallel to each other, data transfer lines crossing the data select lines and aligned in parallel to each other, and electrically rewritable memory cell transistors disposed at intersections of the data transfer lines and the data select lines. It further includes: a memory cell array block in which the memory cell units are disposed along the data select lines; first source lines, connected to one end of the memory cell units, and aligned along the data select lines; and second source lines electrically connected to the first source lines, and disposed along the data select lines.

19 Claims, 79 Drawing Sheets

NONVOLATILE SEMICONDUCTOR MEMORY

CROSS REFERENCE TO RELATED APPLICATIONS

This is a continuation of application Ser. No. 10/983,617, now U.S. Pat. No. 7,145,199, filed on Nov. 9, 2004, which claims the benefit of priority to Japanese Patent Application No. P2003-379988, filed on Nov. 10, 2003, all of which are incorporated herein by reference in their entireties.

BACKGROUND OF THE INVENTION

1. Field of the Invention

The present invention relates to metal interconnect layers in a nonvolatile semiconductor memory, which are used for patterning and layout of metal interconnects, such as aluminum (Al) interconnects, tungsten (W) interconnects, or copper (Cu) interconnects, for block-type memory cell transistors such as a NAND EEPROM or an AND EEPROM.

2. Description of the Related Art

FIGS. 1 through 9 show a NAND EEPROM fabricated by a method of the related art of the present invention. FIG. 1 schematically shows an enlarged aerial pattern diagram of a memory cell array region. FIGS. 2 through 4 are schematic cross-sectional diagrams cut along the lines I-I, II-II, and III-III of FIG. 1, respectively. In addition, FIG. 5 shows an overall aerial pattern diagram of the memory cell array region 1. FIG. 6 is a detailed aerial pattern diagram of the memory cell array region 1 formed wide source lines SL2. FIGS. 7 through 9 are schematic cross-sectional diagrams cut along the lines IV-IV, V-V, and VI-VI of FIG. 6, respectively.

As shown in FIG. 1, the nonvolatile semiconductor memory includes data transfer lines BL, data select lines WL disposed orthogonal to the data transfer lines BL, a device region 10 and a device isolating region 12, extending along the data transfer lines BL, select gate lines SSL and SGL, source line contacts CS, data transfer line contacts CB, via contacts 16, a first source line SL0, and second source lines SL2. As shown in FIG. 1, circular or elliptical source line contacts CS and data transfer line contacts CB are aligned orthogonal to the data transfer lines BL. The contacts are aligned along the line III-III in extremely close intervals of 2 to 3F, where F denotes the minimum fabrication dimension depending on the widths of a device region 10 and a device isolating region 12. On the other hand, the data transfer line contacts CB and the source line contacts CS are aligned along the line I-I, which is orthogonal to the line III-III, at longer intervals than the intervals along the line III-III, for example, 40 to 100F in the case of a NAND flash memory. Note that x denotes the width of each of the second source lines SL2, and u denotes the intervals therebetween in FIG. 1.

As shown in FIG. 2, the cross section cut along the line I-I of the nonvolatile semiconductor memory shows a p-well region or a semiconductor substrate 26, diffused layers 18, memory cell transistors 20, select gate transistors SGS and SGD, a barrier insulator film 22, a data transfer line contact CB, a source line contact CS, a first source line SL0, a data transfer line extended region 14, a via contact 16, a data transfer line BL, and interlayer insulator films 23 and 24. Moreover, as shown in FIGS. 3 and 4, the cross sections cut along the lines II-II and III-III of the nonvolatile semiconductor memory, respectively, show a p-well region or a semiconductor substrate 26, diffused layers 18, a barrier insulator film 22, data transfer line contacts CB, source line contacts CS, a first source line SL0, data transfer line extended regions 14, a first via contact 16, data transfer lines BL, a source shunt line SH1, a well shunt line SH2, a second via contact 17, a second source line SL2, and interlayer insulator films 23 and 27. Note that y denotes the distance between the semiconductor substrate 26 surface and the second source line SL2, and x denotes the width of the second source line SL2 in FIG. 4.

The data transfer line contacts CB and the first via contact 16 are filled with phosphorus (P) or the like highly-doped polycrystalline silicon or a metal such as W, and the data transfer line extended regions 14 and the first source line SL0 are filled with a metal such as W. Accordingly, the data transfer line extended regions 14, being longer than 7F along the data transfer lines BL, are considered as the interconnect layers. Alternatively, a linear, longer fine metal pattern is naturally available for the interconnect layers, and the following description is also applicable to a configuration where the first via contacts 16 and the data transfer line extended regions 14 are omitted, and contacts are directly formed by regarding the data transfer lines BL as the interconnects. The data transfer lines BL, the second via contact 17, and the second source lines SL2 are made of a metal such as Al, Cu, or the like.

The data transfer lines BL are aligned orthogonal to the line III-III in extremely close intervals of 2 to 3F where F denotes the minimum fabrication dimension, forming a single memory cell array block with approximately five hundred thirty data transfer lines BL, for example. Assuming that serially aligned 16-bit memory cell transistors form a single NAND memory cell unit, for example, a single NAND memory cell block includes five hundred thirty NAND memory cell units arranged in parallel along the line II-II. In addition, the source shunt line SH1, which is connected to the contact SB for the semiconductor substrate 26 and the contacts for the source line SL, and the well shunt line SH2, which is connected to the contact for the well, are disposed between the memory cell array blocks (e.g., for approximately every five hundred thirty data transfer lines BL). Note that the source line SL0 is formed along the line II-II, which is used as the ground interconnect for the source line SL between the data transfer lines BL. In addition, as shown in the cross section cut along the line II-II, the source line SL2 is used as the ground interconnect for the source line extending along the line I-I orthogonal to the line II-II. The source line SL2 and the source line SL0 allow formation of grid-shaped ground interconnects formed by the source lines. For example, the interconnect of approximately 15 to 20F wide, which is the source line SL2, is disposed to extend along the line I-I above the source shunt line SH1 so that it does not overlap the area of the memory cell array. In addition, assuming that serially aligned 16-bit memory cell transistors disposed between the bit line side select gate transistor SGD and the source line side select gate transistor SGS form a single NAND memory cell unit, approximately 2048 blocks are disposed along the line I-I; therefore, it is considered that the source line SL2 becomes a sufficiently long interconnect in order to realize the approximately 2048 blocks as an example.

A first problem of the related art is an increase in the interconnect resistance due to a decrease in the space between the memory cell arrays and a decrease in the interconnect width due to miniaturization. When the source line SL2 is linearly disposed between the memory cell arrays as in the related art, a decrease in the space between the memory cell arrays refers to a decrease in the source interconnect width that can be provided therebetween. In addition, when further miniaturization is required, miniaturization of the interconnect results in a decrease in the space between the memory cell arrays; however, since the interconnect width is reduced in either case, it is impossible to prevent the interconnect resistance from increasing.

As shown in FIG. 5, the overall aerial pattern of the memory cell array region is configured with a semiconductor chip 6, a memory cell array region 1 indicated by a dashed line, source lines SL2, data select line control circuits 2, a sense amplifier or a data latch 4, source line shunt transistors 3, and a power supply interconnect pad 5. As particularly shown in FIG. 5, when the power supply interconnect pad 5 region is disposed on only one side of the semiconductor chip 6, a thick power supply interconnect cannot be disposed on the periphery when the chip area is reduced. This is because the data select line control circuits 2 and the sense amplifier or the data latch 4 are formed close to the memory cell array region 1. Especially, in the case of a nonvolatile semiconductor memory that erases data by having positive potential applied to the p-well region 26 in which the memory cell array region 1 is formed, the second source lines SL2 connected to the memory cell transistors must be kept at a positive voltage greater than the voltage of the p-well region 26 so as to prevent leakage current from the source lines SL2 from developing. Therefore, as shown in FIG. 5, the source line shunt transistors 3 are needed on the periphery of the memory cell array region 1 to bring the source lines SL2 and the power supply interconnect pad 5 at ground potential into or out of conduction. It is desirable for reduction in the interconnect area and the chip area that the source line shunt transistors 3 be disposed on only one side of the memory cell array, so as to permit reduction in the thick interconnect area between the source line shunt transistors 3 and the power supply interconnect pad 5. In this case, in the memory cell array region 1 disposed in the upper portion of FIG. 5, since the source lines SL2 are long interconnects almost equivalent to the length of one side of the semiconductor chip 6, serious problems occur, such as a drop in voltage due to the interconnect resistance and, depending on location, a change in memory cell transistor operation. For example, such drop in voltage may cause an increase in the source line voltage when reading during a write-verify operation, resulting in an apparent increase in write threshold voltages (e.g., see Japanese Patent Application Laid-Open No. Hei 11-260076). More specifically, disposing the memory cell array in this location may cause an insufficient programming in a memory cell transistor using multi-value thresholds requiring precise threshold control.

A second problem is that the source lines SL2 partially cover NAND strings in the memory cell array region 1 when the width of each source line SL2 is increased so as to reduce the interconnect resistance for solving the first problem. FIGS. 6 through 9, which correspond to FIGS. 1 through 4, show the case of making the width of each source line SL2 wider where the source lines SL2 partially cover the NAND strings. In particular, FIG. 9 shows the cross section of a region where the source lines SL2 in the corresponding cross section in FIG. 4 cover the NAND strings. Note that description of the components based on the related art in FIGS. 6 through 9, which are substantially the same as those shown in FIGS. 1 through 4, is omitted. There is a difference in that the width of each second source line SL2 is extended to the memory cell array region 1 so as to be wider and an SiN film 7 is used as an uppermost passivation film.

According to the related art, as shown in FIG. 1 and FIG. 4, if y denotes the distance between the source line SL2 and a tunnel insulator film 44 (see FIGS. 10 and 11 for enlarged diagrams) in a memory cell transistor, x denotes the width of each of the source lines SL2, and u denotes the distance therebetween, the width of each source line SL2 (x) and the space therebetween (u) have been made wider so as to satisfy $y<x/2$ and $y<u/2$ and reduce the source line SL2 resistance. A passivation film such as the silicon nitride film (SiN film) 7 is typically formed after formation of the source lines SL2, and hydrogen developed during that formation is diffused in to the memory cell transistors. When the source lines SL2 do not cover the memory cell array region 1, diffused hydrogen easily reaches the tunnel insulator film 44 or the gate insulator film of the select gate transistor SGD or SGS, and is then trapped in the tunnel insulator film 44 or the gate insulator film, resulting in restoration of a part of the defects of the tunnel insulator film 44 or the gate insulator film. In addition, since the interface between the tunnel insulator film 44 or the gate insulator film and the semiconductor substrate 26 is also contacted by the diffused hydrogen, the interface state is terminated, the threshold of an nMOS transistor decreases, and the subthreshold coefficient decreases. On the other hand, when the source lines SL2 overlap the memory cell array region 1, diffused hydrogen is trapped in a barrier metal layer of the source lines SL2 made of Ti, TiN, or the like, and does not reach the tunnel insulator film 44 or the gate insulator film. More specifically, in the case of isotropic diffusion of hydrogen as with the case of forming a passivation film such as the SiN film 7 and then carrying out a thermal treatment, when $y<x/2$ is satisfied, the diffused hydrogen may reach the tunnel insulator film 44 or the gate insulator film in the region where no source line SL2 is formed, when the hydrogen diffusion length is between y and x/2; whereas, the diffused hydrogen may not reach the tunnel insulator film 44 in the center of the source line SL2. Accordingly, it is apparent that the hydrogen density distribution in the tunnel insulator film 44 is location dependent. As a result, there is a problem of the difference in reliability of NAND strings of memory cell transistors with the source lines SL2 formed thereover and not formed thereover. In addition, when anisotropic etching (RIE) is used to process the source lines SL2, the probability of forming the source lines SL2 over the NAND strings greatly differs. As a result, since the etched region is damaged due to etching ions, a problem of the difference in memory cell transistor reliability also arises.

Furthermore, in the case of FIGS. 6 through 9, the electrical capacitance of the data transfer lines BL, which are connected to the NAND strings covered by the source lines SL2, relative to the source lines SL2, is extremely increased for the number of NAND strings multiplied by the number of NAND blocks in comparison with data transfer lines BL connected to the NAND strings, which are covered by no source line SL2. This causes a variation in the value of the electrical capacitance among the data transfer lines, resulting in differences in RC time constant among the data transfer lines during reading, where R denotes the value of the parasitic resistance of the data transfer line and C denotes the value of the parasitic capacitance of the data transfer line. Therefore, a greater timing margin for reading is needed.

The metal interconnects of on the related art are linearly disposed between the memory cell arrays, which are formed with the minimum fabrication dimension, without covering the memory cell arrays. However, there has been a problem of an increase in the metal interconnect resistance due to miniaturization of the metal interconnects and the spaces between the memory cell arrays as miniaturization increases.

SUMMARY OF THE INVENTION

An aspect of the present invention inheres in a nonvolatile semiconductor memory including: (a) memory cell units including parallel data select lines, data transfer lines crossing the data select lines and aligned in parallel to each other, and electrically rewritable memory cell transistors disposed at intersections of the data transfer lines and the data select lines; (b) a memory cell array block in which the memory cell units are disposed along the data select lines; (c) first source lines connected to one end of the memory cell units, and aligned along the data select lines; and (d) second source lines electrically connected to the first source lines, and disposed along the data select lines.

Another aspect of the present invention inheres in a nonvolatile semiconductor memory including: (a) memory cell units including parallel data select lines, data transfer lines crossing the data select lines and aligned in parallel to each other, and electrically rewritable memory cell transistors disposed at intersections of the data transfer lines and the data select lines; (b) a memory cell array block in which the memory cell units are disposed along the data select lines; (c) first source lines connected to one end of the memory cell units, and aligned along the data select lines; and (d) second source lines electrically connected to the first source lines and disposed along the data select lines, wherein (e) the second source lines disposed along the first source lines and the data select lines are provided above the first source lines.

Yet another aspect of the present invention inheres in a nonvolatile semiconductor memory including: (a) memory cell units including parallel data select lines, data transfer lines crossing the data select lines and aligned in parallel to each other, and electrically rewritable memory cell transistors disposed at intersections of the data transfer lines and the data select lines; (b) a memory cell array block in which the memory cell units are disposed along the data select lines; (c) first source lines connected to one end of the memory cell transistors, and aligned along the data select lines; and (d) second source lines electrically connected to the first source lines and disposed along the data select lines, wherein (e) the second source lines disposed along the first source lines and the data select lines are provided above the memory cell transistors.

DETAILED DESCRIPTION OF THE EMBODIMENTS

Figure 1:
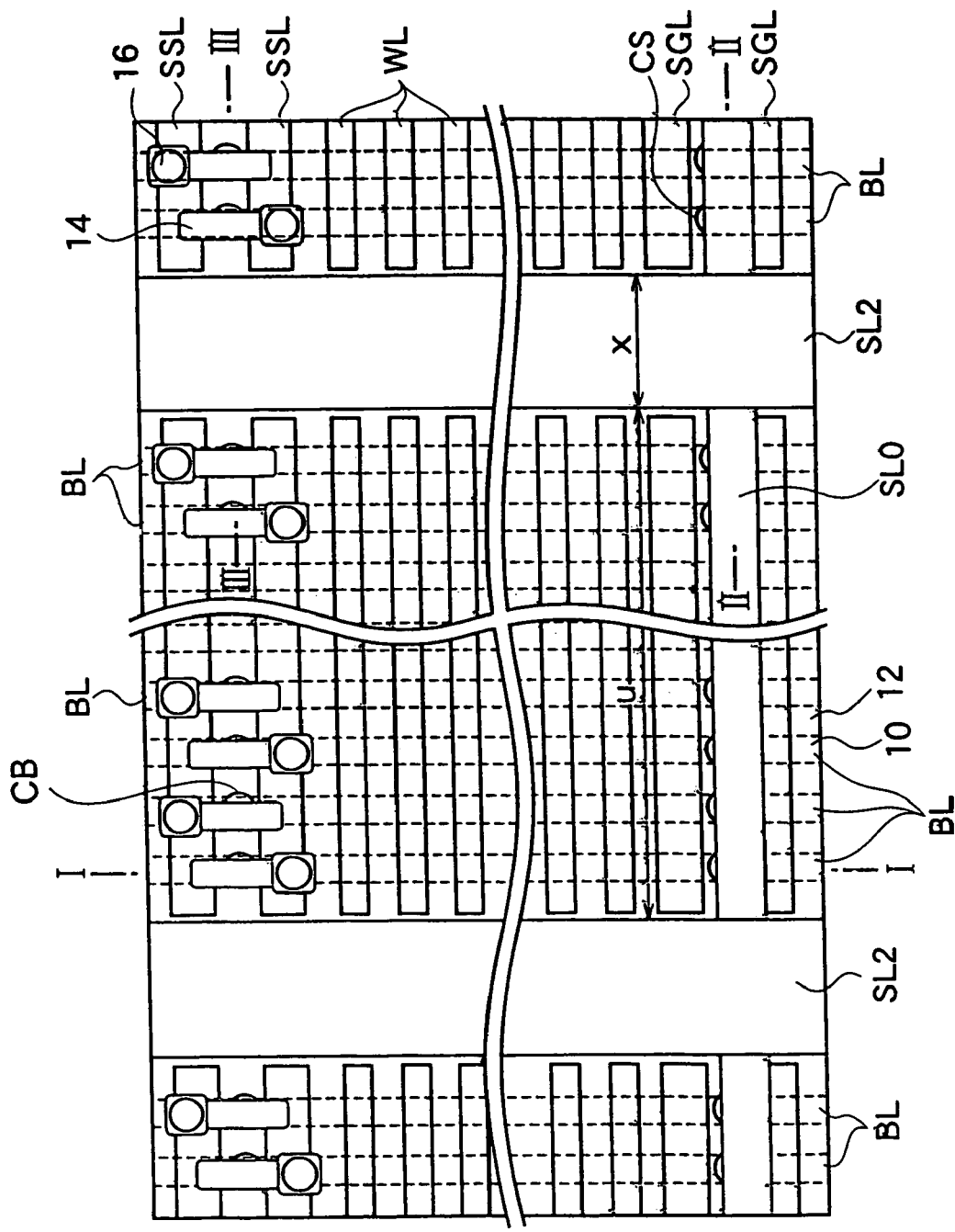
FIG. 1 is a detailed aerial pattern diagram of a memory cell array region of a nonvolatile semiconductor memory of the related art of the present invention.
Figure 2:
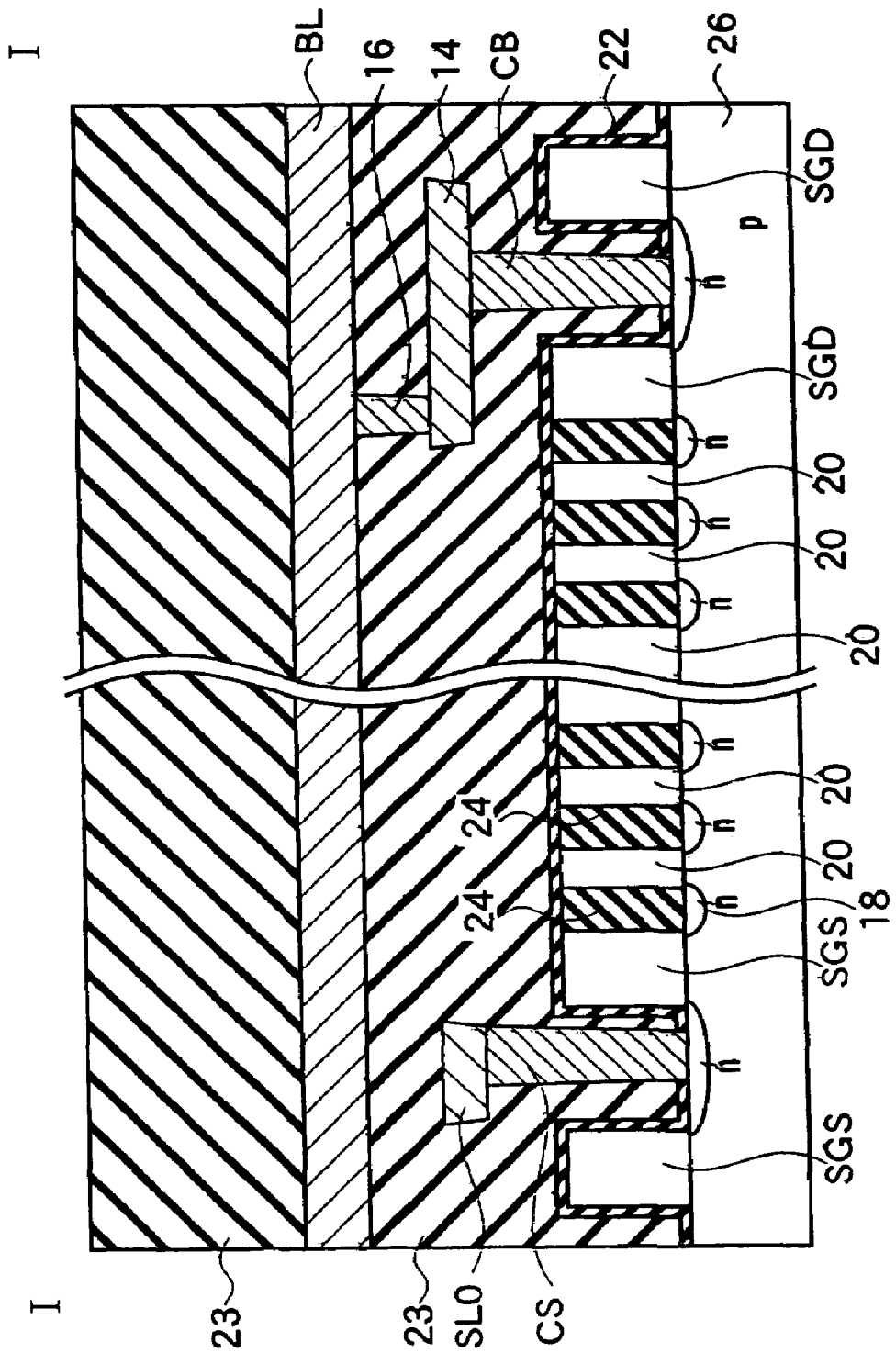
FIG. 2 is a schematic cross-sectional diagram cut along the line I-I of FIG. 1.
Figure 3:
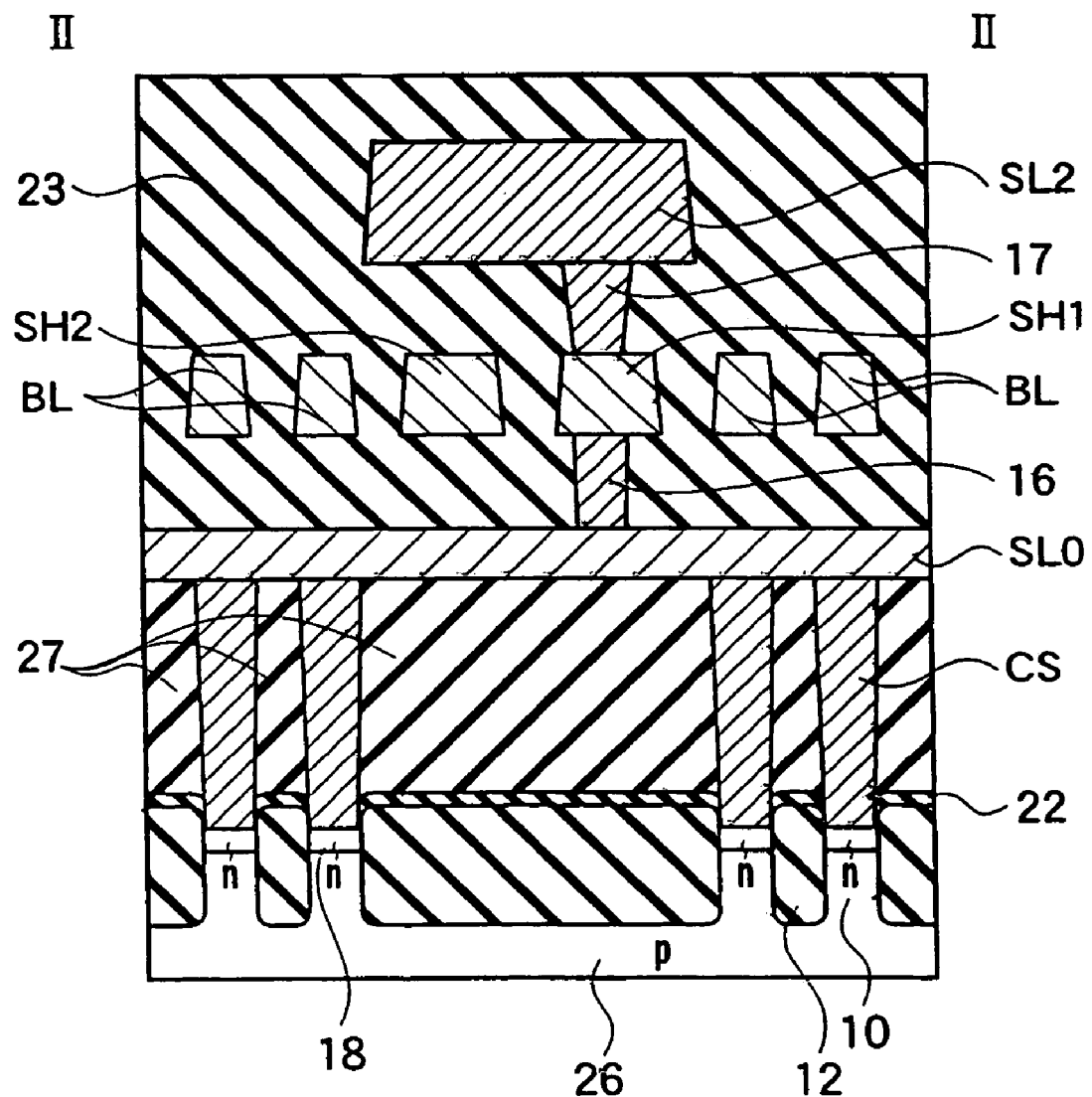
FIG. 3 is a schematic cross-sectional diagram cut along the line II-II of FIG. 1.
Figure 4:
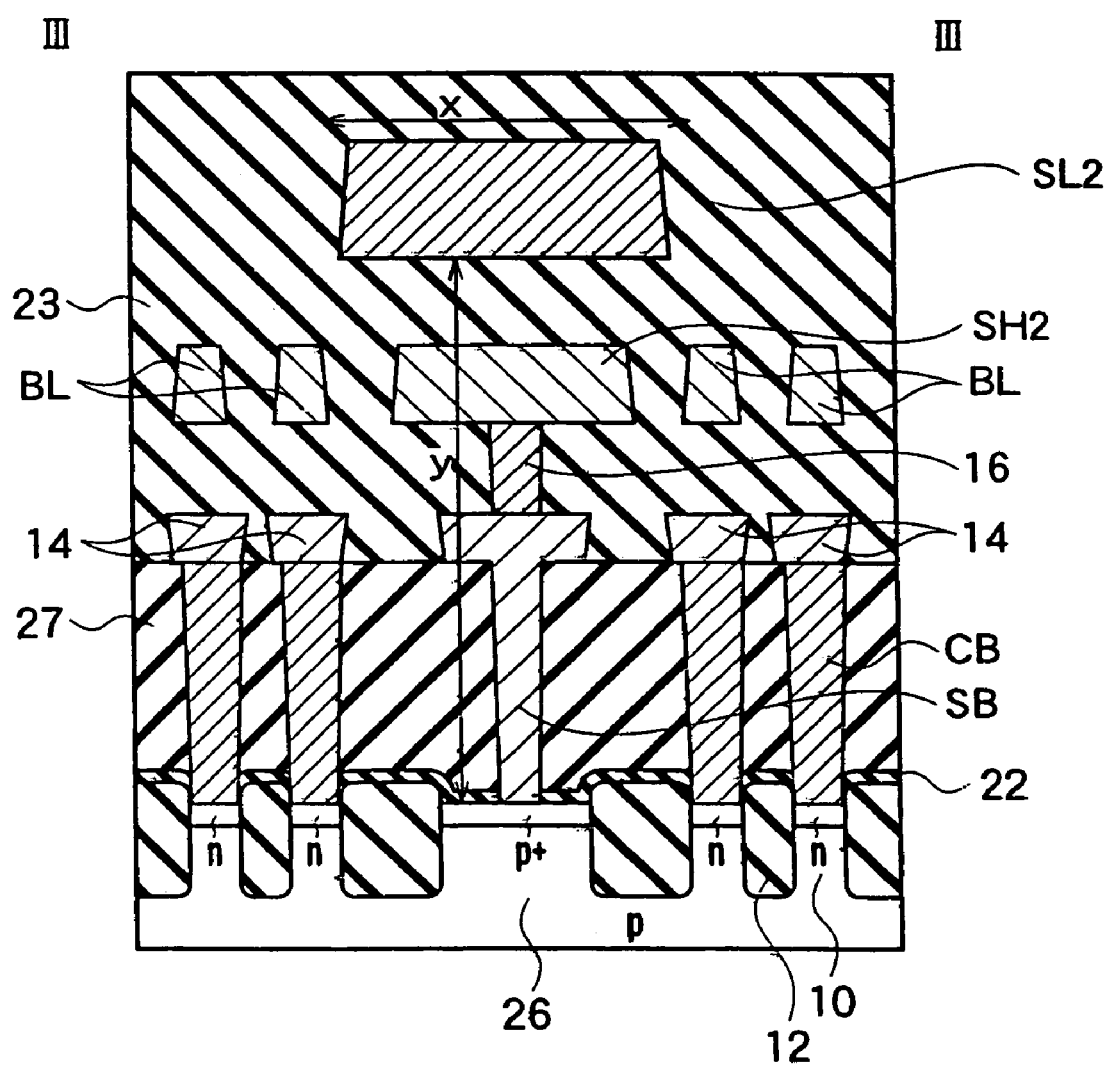
FIG. 4 is a schematic cross-sectional diagram cut along the line III-III of FIG. 1.
Figure 5:
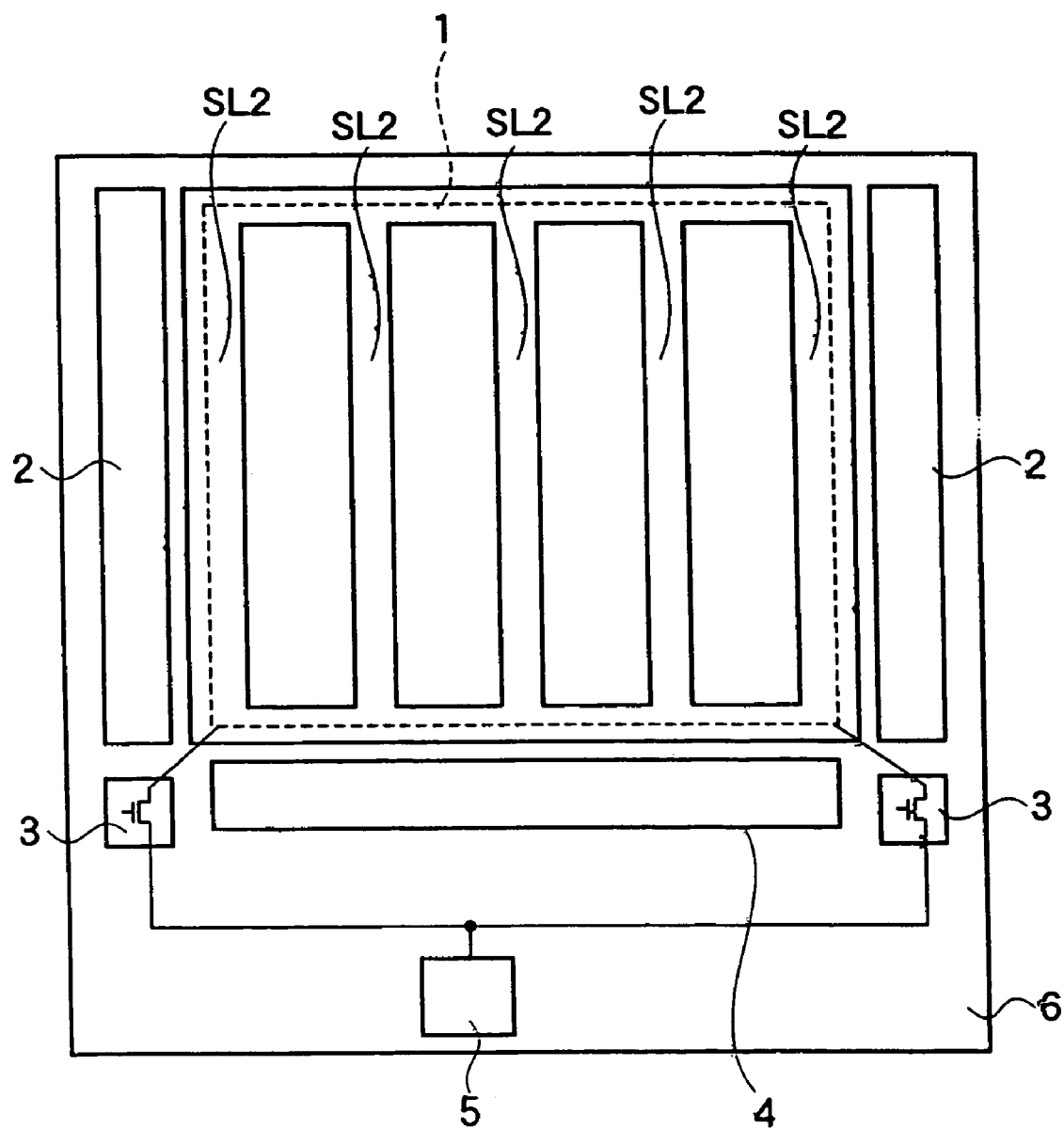
FIG. 5 is an overall aerial pattern diagram of the memory cell array region of the nonvolatile semiconductor memory of the related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as is conventional in the representation of circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

First Embodiment

The embodiments of the present invention provide a nonvolatile semiconductor memory, which equalizes influences from externally diffused hydrogen on a single memory cell transistor and layouts so as to prevent the variations of the value of parasitic capacitances from differing among data transfer lines. This is achieved by designing a pattern and a layout of a source electrode interconnect to which ground potential or low-level potential Vss is supplied, so as to connect conventional linear interconnects in a ladder shape to improve the metal interconnect resistance as well as disposing those interconnects at the same intervals.

The first through the sixth embodiment of the present invention are described below while referencing the drawings. The same or similar reference numerals are attached to identical or similar parts among the following drawings. Note that the drawings show schematic examples, therefore, the relationship between thicknesses and aerial dimensions, ratio of thicknesses of the respective layers, and the like may be different from the actual ones. Accordingly, specific thicknesses and dimensions must be determined in consideration of the following descriptions. In addition, the drawings naturally include different ratios and relationships of dimensions from each other.

The first through the sixth embodiment given below exemplify apparatuses and methods that are used to implement the technical ideas according to the present invention, and do not limit the technical ideas according to the present invention to those such as materials, shapes, structures, and arrangement of components that appear below. Those technical ideas according to the present invention may receive a variety of modifications that fall within the claims.

Figure 10:
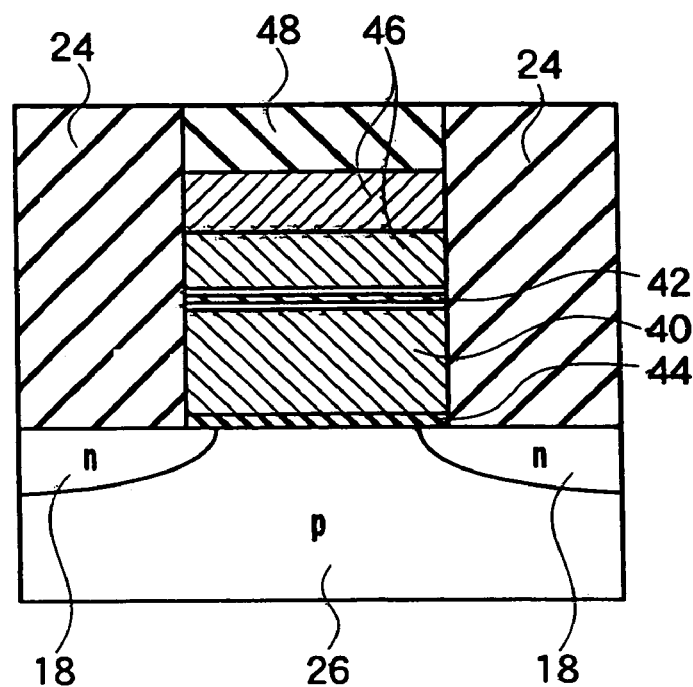
FIG. 10 is a schematic cross-sectional diagram of a floating-gate memory cell transistor used for a nonvolatile semiconductor memory of the present invention.
Figure 11:
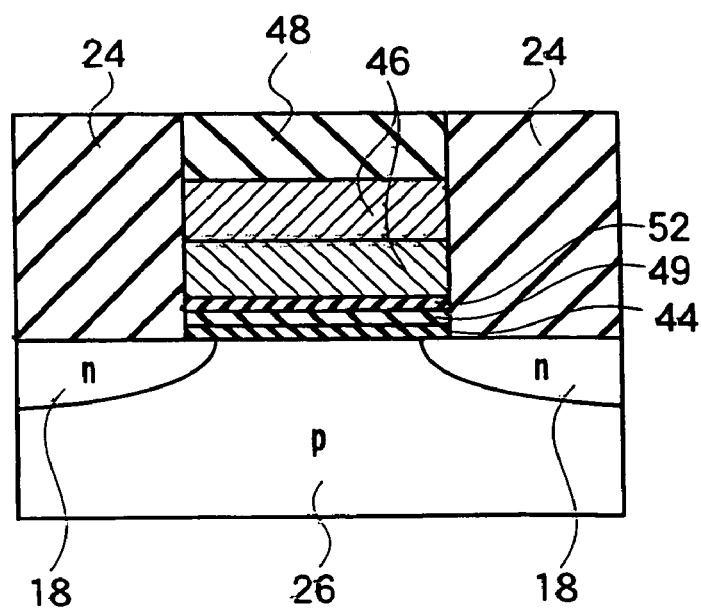
FIG. 11 is a schematic cross-sectional diagram of a MONOS memory cell transistor used for the nonvolatile semiconductor memory of the present invention.
Figure 12:
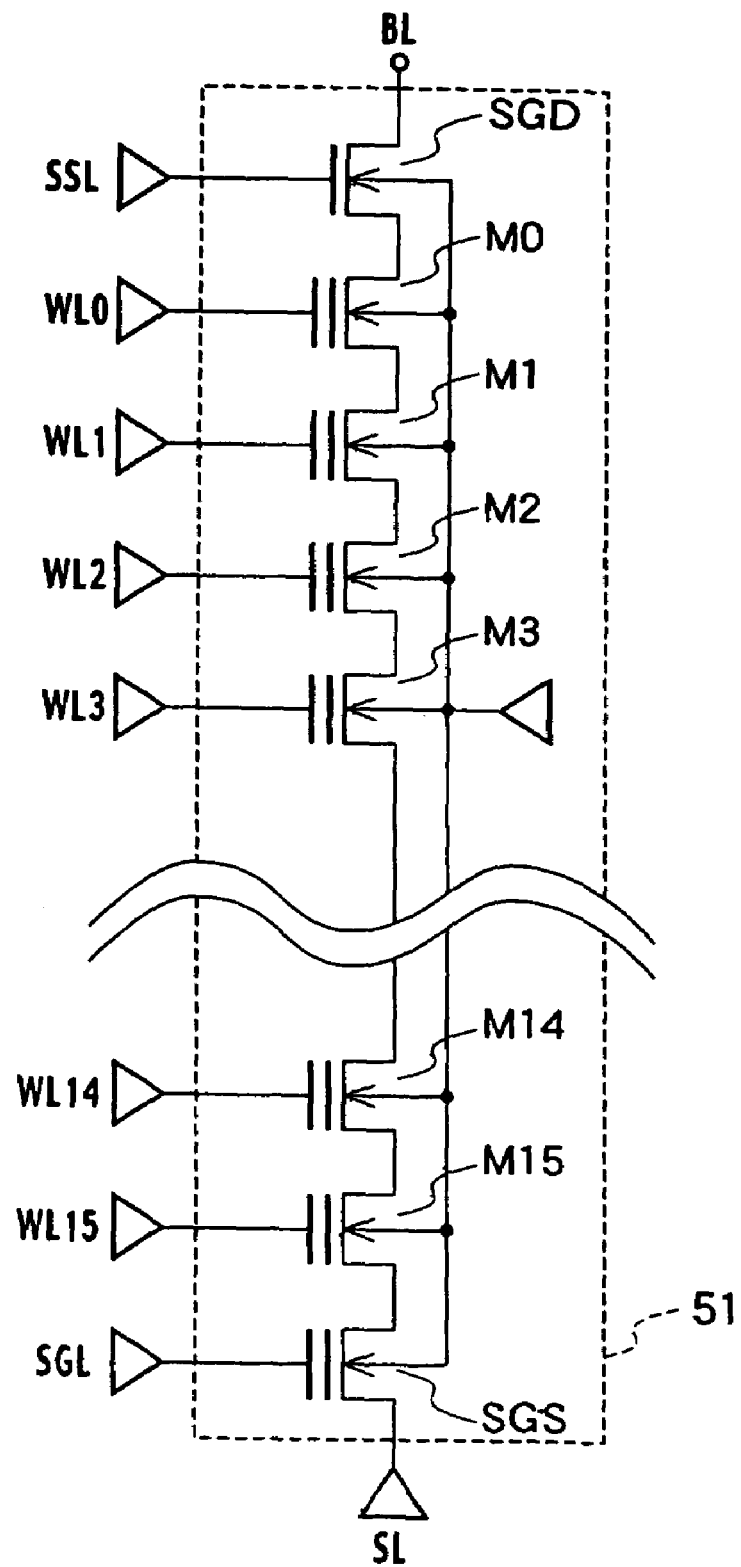
FIG. 12 is a circuit diagram of a NAND memory cell unit used for the nonvolatile semiconductor memory of the present invention.
Figure 13:
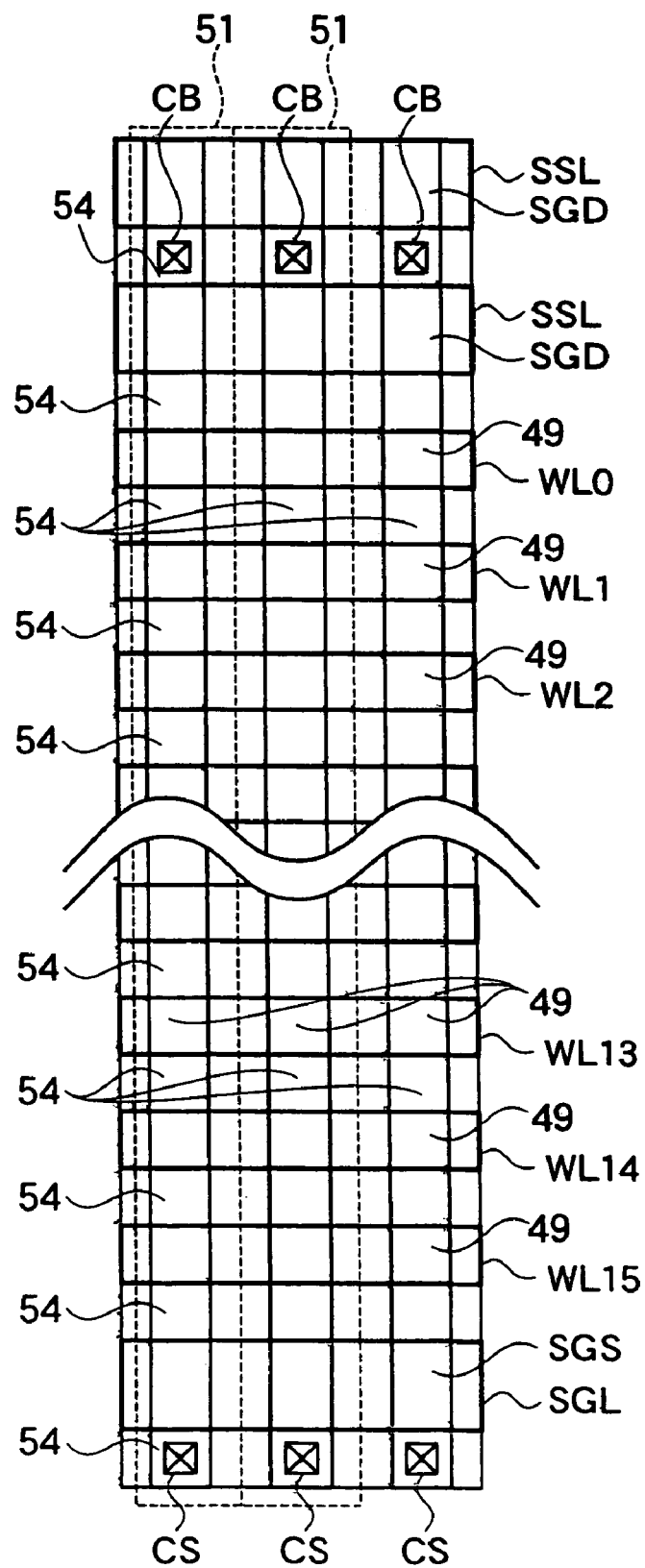
FIG. 13 is an aerial pattern diagram of the NAND memory cell unit used for the nonvolatile semiconductor memory of the present invention.

A first embodiment of a NAND EEPROM, which is a typical nonvolatile memory, is described while referencing FIGS. 10 through 18. FIGS. 12 and 13 show an equivalent circuit diagram of memory cell transistors and an aerial view thereof, respectively; and FIGS. 10 and 11 are cross-sectional diagrams thereof. In the equivalent circuit diagram, while select gate transistors SGD and SGS have different configurations than the memory cell transistors M0 to M15, each of the select gate transistors SGD and SGS may have a charge storage layer 49 as with the configurations of the memory cell transistors M0 to M15.

As shown in FIG. 13, multiple memory cell transistors M0 to M15 are connected in series via the select gate transistors SGS and SGD between the source line contacts CS and the data transfer line contacts CB. The memory cell transistors M0 to M15 may be a type having a floating gate 40 as shown in FIG. 10, or a type having an insulator film with the charge storage layer 49 as shown in FIG. 11. As shown in FIG. 10, a memory cell transistor with the floating gate 40 includes diffused layers 18 or a source and a drain region formed in a p-well region or a semiconductor substrate 26, a tunnel insulator film 44 formed on the p-well region or the semiconductor substrate 26, the floating gate 40, an inter-polysilicon insulator film 42, a control gate electrode 46, a mask insulator film 48, and interlayer insulator films 24.

On the other hand, as shown in FIG. 11, a memory cell transistor with an insulator film with the charge storage layer 49 includes diffused layers 18 or a source and a drain region formed in a p-well region or a semiconductor substrate 26, a tunnel insulator film 44 formed on the p-well region or the semiconductor substrate 26, the charge storage layer 49, a block insulator film 52, a control gate electrode 46, a mask insulator film 48, and interlayer insulator films 24.

In FIG. 11, a silicon nitride film, an oxynitride film, or an alumina film may be used as the charge storage layer 49. In this case, the memory cell transistor has the charge storage layer 49 to/from which charges are injected or ejected through the source or the drain diffused layer 18 or the p-well region or the semiconductor substrate 26 in accordance with the data to be stored. In addition, with the NAND structure of the nonvolatile semiconductor memory according to the first embodiment, multiple memory cell transistors M0 to M15 are formed and are capable of being re-written with data.

As shown in FIG. 12, the nonvolatile memory cell transistors are connected in series, and one end of a source or a drain electrode 54 of the memory cell transistor M0 is electrically connected to the select gate transistor SGD and a data transfer line BL via a data transfer line contact CB. On the other hand, one end of the source or the drain electrode 54 of the memory cell transistor M15 is electrically connected to the select gate transistor SGS and a common source line SL via a source line contact CS. Moreover, each of the transistors is formed on the same p-well region 26. In addition, the memory cell transistor control electrodes are connected to the data select lines, which are identified as WL0 to WL15, respectively. Furthermore, to select a single NAND memory cell unit 51 from a NAND memory cell block including multiple NAND memory cell units aligned along the data transfer lines BL so as to connect the selected one to the data transfer lines BL, the control electrode of the select gate transistor SGD is connected to a block select gate line SSL. In addition, the control electrode of the select gate transistor SGS is connected to a block select gate line GSL, forming a so-called NAND memory cell block. In this case, in order to establish a high density structure, the memory cell block should have at least one block select gate line SSL and one block select gate line GSL, which are formed along the data select lines WL0 to WL15. In addition, a plurality of memory cell transistors to be connected to the data transfer line and the data select lines should be provided, more specifically, $2^n$ (n denotes a positive integer) is desirable for decoding addresses.

Furthermore, each NAND memory cell unit 51 shown in FIG. 12 is formed adjacent to each other in a matrix along the data transfer line BL and the data select lines WL0 to WL15. More specifically, as shown in FIG. 13, similar memory cell arrays are formed horizontally, and share the SSL, the WL0 to WL15, the GSL, and the SL. In addition, the similar memory cell arrays are formed vertically as shown in FIG. 13, and are connected to memory cell arrays formed on the upper area via the data transfer lines (BL). With such layout, each data transfer line BL running between the adjacent memory cell transistors, and each of the interconnects of the data transfer line extended regions 14 must be connected to the n-type drain diffusion layer of the corresponding select gate transistor SGD for memory cell transistors so that individual pieces of data can be stored in the corresponding memory cell transistors. The NAND structure described in detail in Japanese Patent Application Laid-Open No. 2002-150783 may be used for the structure beneath the data transfer lines BL, and description thereof is omitted here from.

Figure 14:
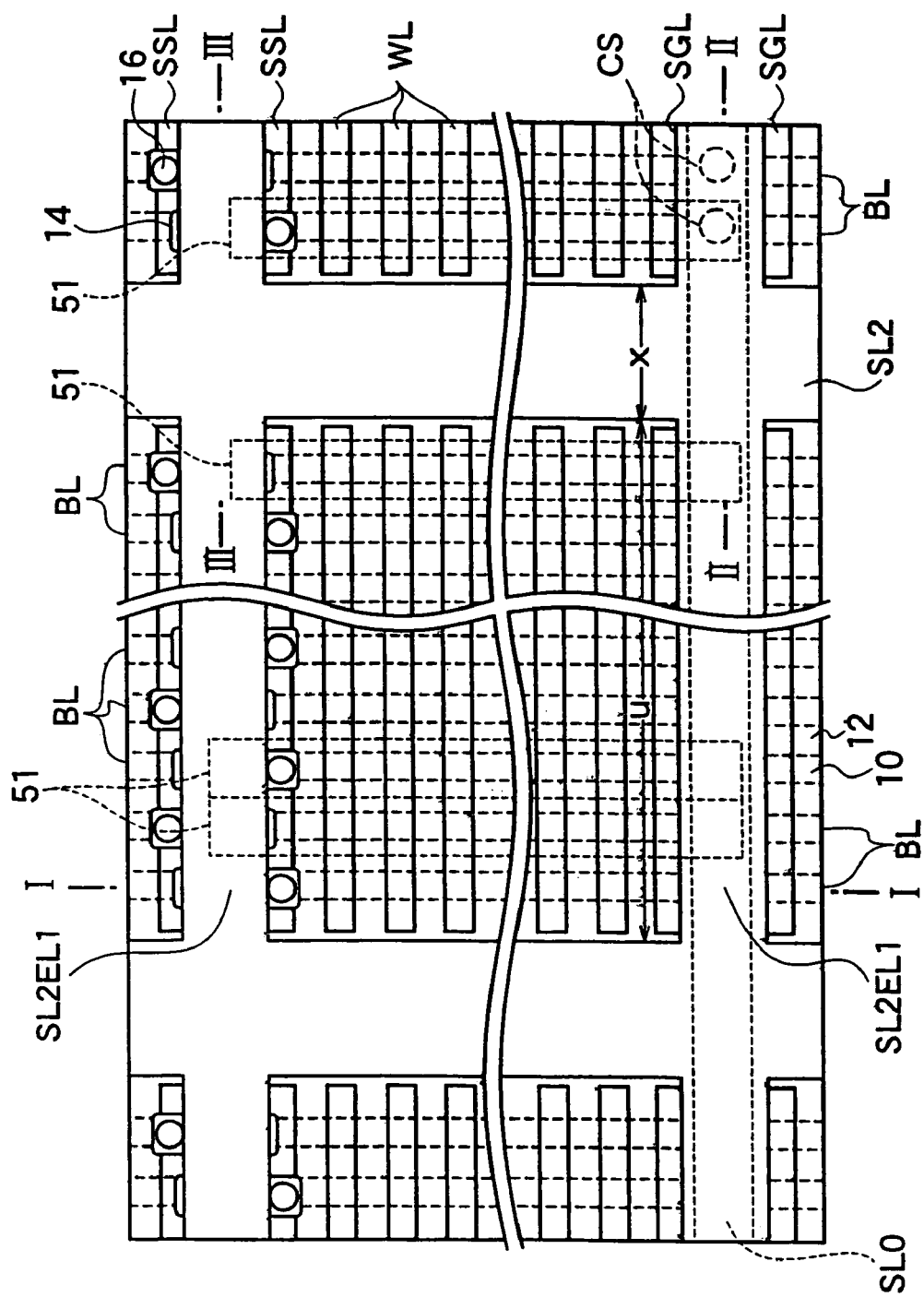
FIG. 14 is a detailed aerial pattern diagram of a memory cell array region of a nonvolatile semiconductor memory according to a first embodiment of the present invention.
Figure 15:
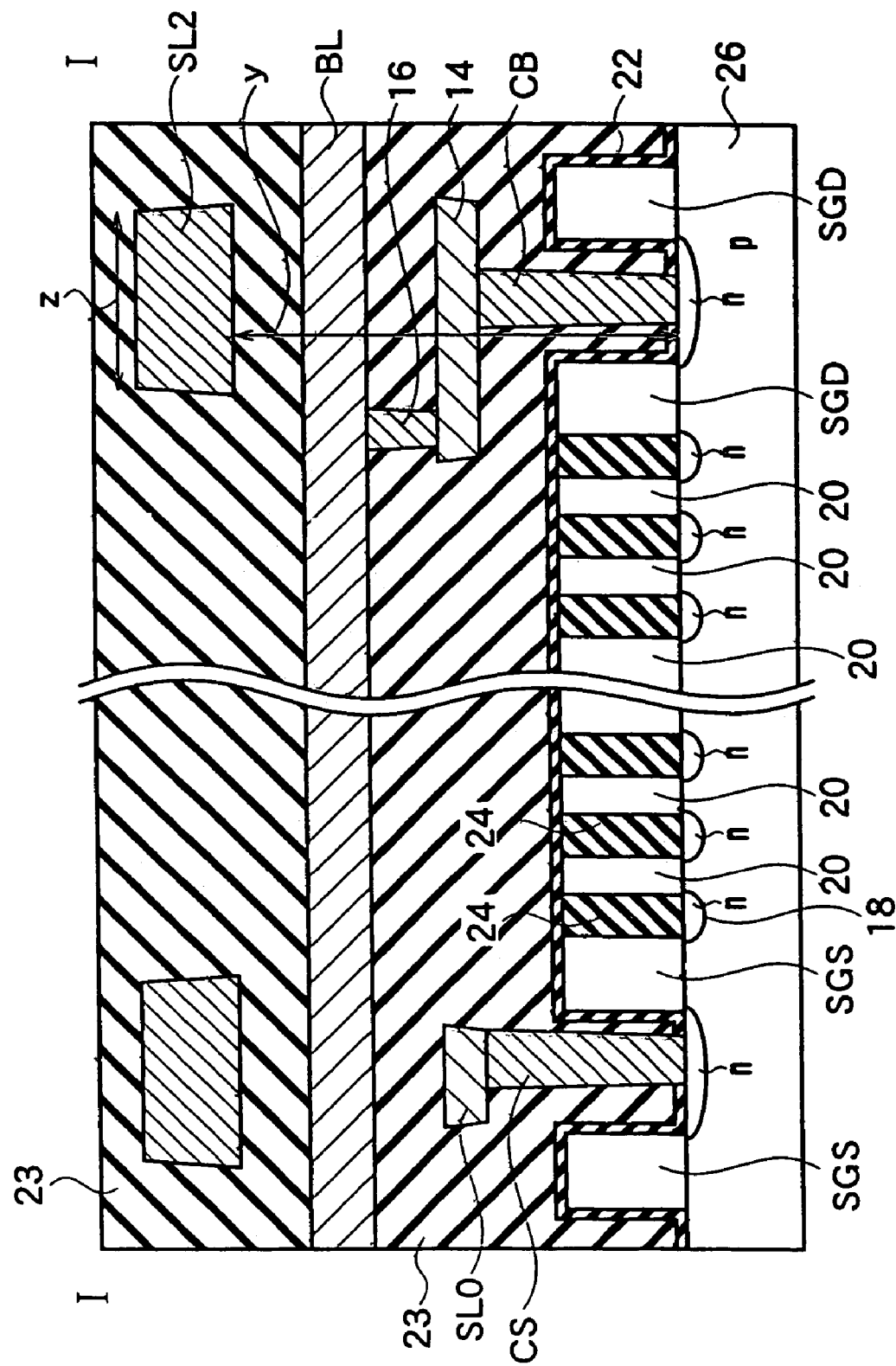
FIG. 15 is a schematic cross-sectional diagram cut along the line I-I of FIG. 14.
Figure 16:
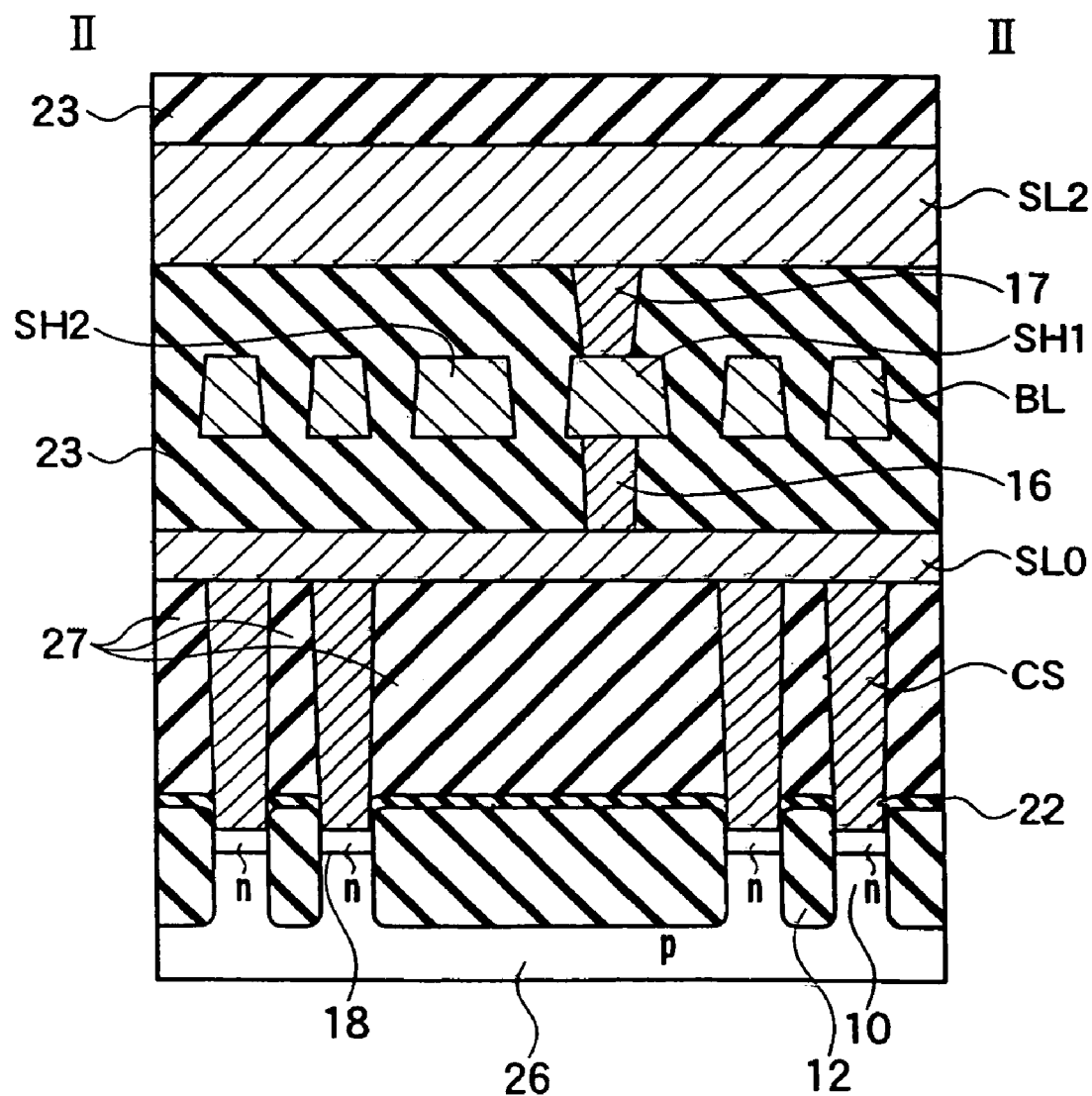
FIG. 16 is a schematic cross-sectional diagram cut along the line II-II of FIG. 14.
Figure 17:
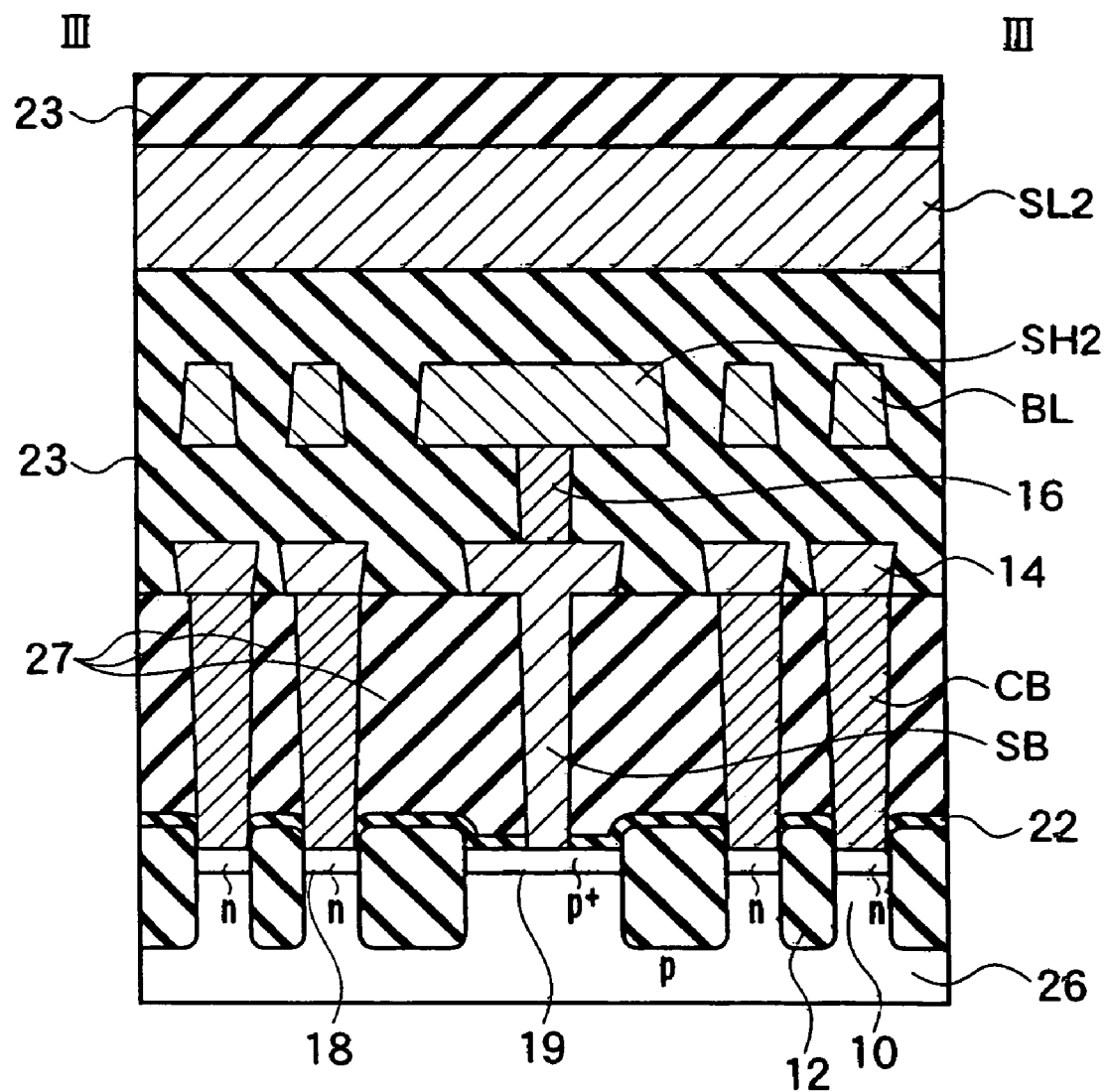
FIG. 17 is a schematic cross-sectional diagram cut along the line III-III of FIG. 14.
Figure 18:
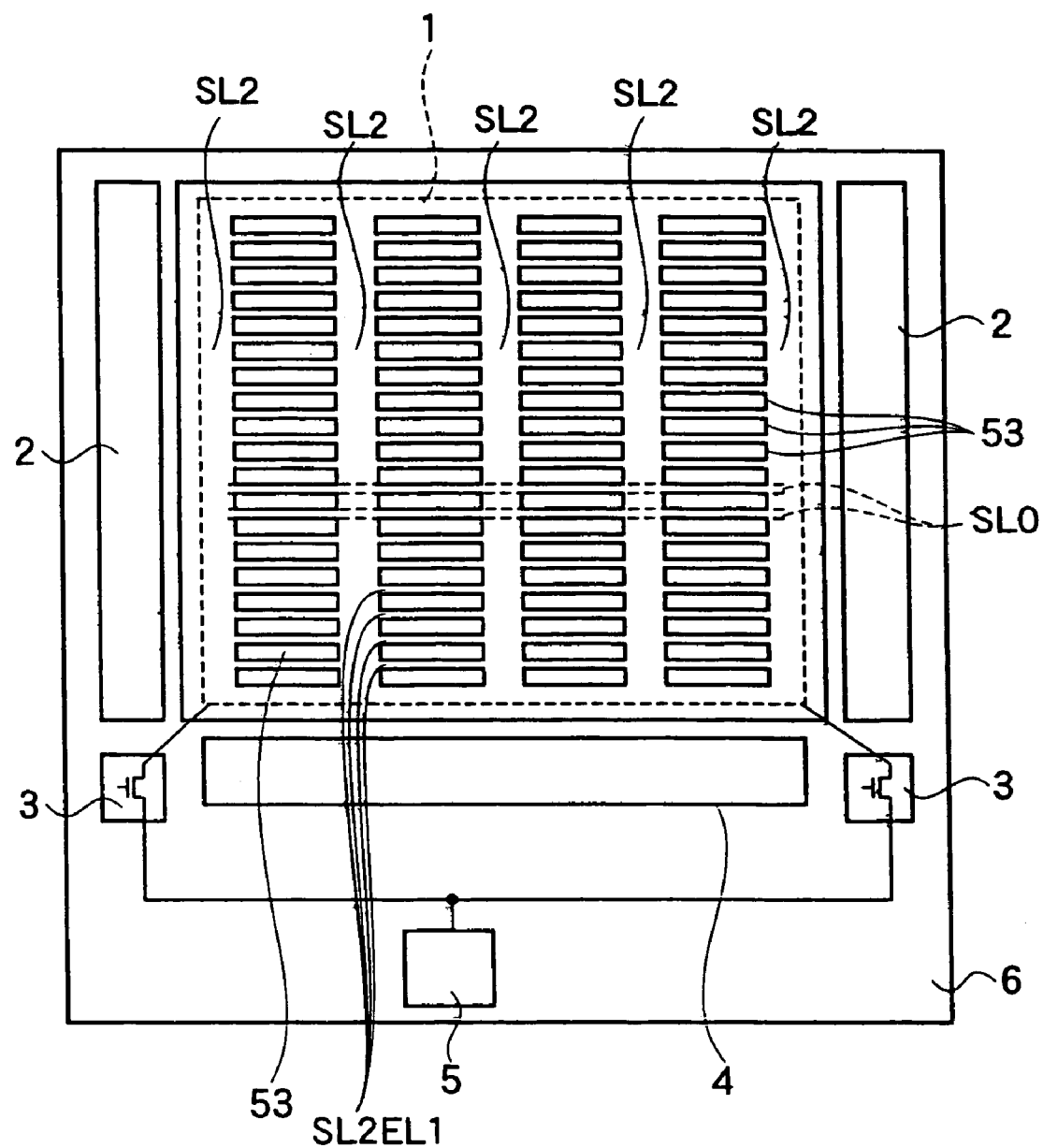
FIG. 18 is an overall aerial pattern diagram of the memory cell array region of the nonvolatile semiconductor memory according to the first embodiment of the present invention.

FIGS. 14 through 18 show detailed diagrams of the first embodiment of the present invention. FIGS. 14 through 18 show an exemplary NAND EEPROM, which is the nonvolatile semiconductor memory according to the first embodiment of the present invention. FIG. 14 schematically shows an enlarged aerial pattern diagram of a memory cell array region. FIGS. 15 through 17 are schematic cross-sectional diagrams cut along the lines I-I, II-II, and III-III of FIG. 14, respectively. FIG. 18 shows an overall aerial pattern diagram of the memory cell array region.

As shown in FIG. 14, the nonvolatile semiconductor memory according to the first embodiment of the present invention includes data transfer lines BL, data select lines WL, which are disposed orthogonal to the data transfer lines BL, bit line side select gate lines SSL, source line side select gate lines SGL, multiple memory cell units 51, a device region 10 and a device isolating region 12, which extend along the data transfer lines BL, select gate transistors SGD and SGS, source line contacts CS, data transfer line contacts CB, via contacts 16, data transfer line extended regions 14, a first source line SL0, and second source lines SL2.

As shown in FIG. 14, circular or elliptical source line contacts CS and data transfer line contacts CB are aligned orthogonal to data transfer lines BL. The contacts are aligned along the line III-III in extremely close intervals of 2 to 3F where F denotes the minimum fabrication dimension depending on the widths of the device region 10 and the device isolating region 12. On the other hand, the contacts are aligned along the line I-I, which is orthogonal to the line III-III, in longer intervals than the intervals those along the line III-III, for example, 40 to 100F in the case of NAND flash memory. Note that x denotes the width of each second source line SL2, and u denotes the interval therebetween in FIG. 14.

As shown in FIG. 15, the cross section along the line I-I of the nonvolatile semiconductor memory according to the first embodiment of the present invention includes a p-well region or a semiconductor substrate 26, diffused layers 18, memory cell transistors 20, select gate transistors SGS and SGD, a barrier insulator film 22, a data transfer line contact CB, a source line contact CS, a source line SL0, a data transfer line extended region 14, a via contact 16, a data transfer line BL, source lines SL2, and interlayer insulator films 23 and 24. On the other hand, as shown in FIGS. 16 and 17, the cross sections along the lines II-II and III-III, respectively, of the nonvolatile semiconductor memory according to the first embodiment of the present invention include a p-well region or a semiconductor substrate 26, diffused layers 18 and 19, a barrier insulator film 22, data transfer line contacts CB, source line contacts CS, a first source line SL0, data transfer line extended regions 14, a first via contact 16, data transfer lines BL, a source shunt line SH1, a well shunt line SH2, a second via contact 17, a second source line SL2, and interlayer insulator films 23 and 27. As shown in FIG. 15, the memory cell transistors 20 are covered with the barrier insulator film 22, such as a silicon nitride film, a silicon oxynitride film, or an alumina film, which is used as an etching stopper that prevents the data transfer line contacts CB and the source line contacts CS from invading the device isolating trenches. Note that y denotes the distance between the semiconductor substrate 26 surface and each second source line SL2, and z denotes the width of each second source line elements 1 (SL2EL1) in FIG. 15.

As shown in FIG. 18, an overall aerial pattern on the memory cell array region 1 is configured with a semiconductor chip 6, a memory cell array region 1 indicated by a dashed line, multiple memory cell array blocks 53, which are disposed within the memory cell array region 1, multiple first source lines SL0, second source lines SL2, source line 2 elements 1 (SL2EL1 discussed in detail below), which connect the second source lines to each other in a grid, data select line control circuits 2, a sense amplifier or a data latch 4, source line shunt transistors 3, and a power supply interconnect pad 5. The power supply line is connected to the power supply interconnect pad 5. More specifically, as shown in FIG. 18, the source lines SL2 include the source line 2 elements 1 (SL2EL1) on the upper area of the source lines SL0 along the data select lines WL, and are disposed entirely in a grid. In addition, multiple memory cell units 51 are aligned along the data select lines WL within each memory cell array block 53 as with the description of FIG. 14.

The data transfer line contacts CB and the via contacts 16 are filled with phosphorus (P) or the like highly-doped polycrystalline silicon or a metal such as W, and the data transfer line extended regions 14 and the source lines SL0 are filled with a metal such as W. Here, the data transfer line extended regions 14 being longer than 7F along the data transfer lines BL are considered as the interconnect layers. Alternatively, a linear, longer fine metal pattern is available, and the following description also applies to a configuration where the via contacts 16 and the data transfer line extended regions 14 are omitted and the contacts are directly formed with the data transfer lines BL as the interconnects. The data transfer lines BL, the via contact 17, and the source lines SL2 are made of a metal such as Al, Cu, or the like.

The data transfer lines BL are aligned orthogonal to the line III-III at extremely close intervals of 2 to 3F where F denotes the minimum fabrication dimension to form a single memory cell array with approximately five hundred thirty data transfer lines BL, for example. In addition, the well shunt lines SH2 and the source shunt lines SH1 to be connected to semiconductor substrate 26 contacts and source line SL contacts are disposed between the memory cell arrays (e.g., for approximately every five hundred thirty data transfer lines BL). Note that the source lines SL0 are formed along the line II-II, which are the source line SL ground interconnects between the data transfer lines BL. In addition, as shown in the cross section cut along the line II-II, the source lines SL2 form source line ground interconnects along the line I-I orthogonal to that line II-II. The source lines SL2, the SL2E1, and the source lines SL0 form source line ground interconnects in a grid. The source lines SL2 are disposed in a direction orthogonal to the line III-III above the source shunt lines SH1 so that the interconnects, each having a width of approximately 15 to 20F, do not overlap the memory cell arrays. In addition, assuming the serially aligned 16-bit memory cell transistors between the bit line side select gate transistor SGD and the source line side select gate transistor SGS to form a single block, approximately 2048 blocks are disposed along the line I-I. Therefore, the source lines SL2 becomes a sufficiently long interconnect in order to realize the approximately 2048 blocks as an example.

As with the related art, the source lines SL2 are disposed between the memory cell arrays in a direction orthogonal to the line III-III. In addition, in the first embodiment, the source lines SL2 are disposed along the line III-III. Hereafter, the source lines SL2 disposed along the line III-III are referred to as 'source line SL2 elements 1 (SL2EL1)'. In addition, the source line SL2 elements 1 formed extending along the line III-III are disposed at certain intervals, which are integral multiples of the interval of the NAND strings along the line I-I, which are disposed only on the bit line side select gate transistor SGD and the source line side select gate transistor SGS or in the region between the bit line side select gate transistors SGD and also the region between the source line side select gate transistors SGS along the line III-III so that the source lines SL2 do not cover the memory cell arrays. It is desirable for reduced resistance along the line III-III that the source line 2 elements 1 be disposed in all regions between the bit line side select gate transistors SGD, and between the source line side select gate transistors SGS. This arrangement allows substantially the same coverage rates of the source line 2 elements 1 (SL2E1) of the NAND strings and also substantially the same influences from formation of the source line 2 elements 1 (SL2E1). Alternatively, the following features may be achieved by disposing the source line 2 elements 1 at certain intervals, which are integral multiples of the interval of the NAND strings along the line I-I. Alternatively, the source line 2 elements 1 may be formed in only a region between the source line side gate transistors. SGS or a region between the bit line side select gate transistors SGD. A difference from the related art in that the source line 2 elements 1 (SL2E1) are formed so as to extend into the memory cell arrays.

In this embodiment, the source lines SL2 never cover the memory cell arrays. This prevents hydrogen diffused from above the memory cell transistors from being blocked by the source lines SL2, so as to provide the same reliability throughout the memory cell transistors. Furthermore, the interconnect resistance can be reduced since the source interconnects 2 are also connected in a grid.

In addition, since the source lines SL2 can be disposed on both the bit line side select gate transistor SGD and the source line side select gate transistor SGS, the value of the interconnect resistance of the source lines SL2 can be reduced less than 0.5 times lower than the value of the interconnect resistance of the source lines SL2 in the related art, even when the interconnect widths of the source lines SL0 and the source lines SL2 along the line III-III are the same. Furthermore, the resistance between the source lines can further be reduced using a low-resistance interconnect material, such as Al, or Cu for the source lines SL2, and using, a high melting point metal, such as W, TiN, or WSi, or a barrier metal for the source lines SL0, which is an interconnect material with a resistivity at least twice that of the source lines SL2. In addition, it is unnecessary to form thick source lines SL0 so as to achieve low resistance along the line III-III, as with the related art, which tries to achieve low resistance only with the source lines SL0. Accordingly, it is unnecessary to form the source lines SL0 over the memory cell transistors, and as shown in FIGS. 14 and 16, increase in the source line voltages can be controlled only by forming the source lines SL0 over the select gate line SGL. Therefore, variations in the characteristics of the memory cell transistors due to blockage of hydrogen diffused can be reduced to less than that in the related art due to the source line SL0 pattern. In addition, a problem of change in the potential of the memory cell transistors due to the potential of the source lines SL0 can also be prevented. More specifically, in a nonvolatile semiconductor memory that erases data by applying positive potential to the well region in which a memory cell transistor is formed, the source lines connected to the memory cell transistors must be kept at a positive voltage greater than the voltage of the well region to prevent leakage current from flowing from the source lines.

As a result, as shown in FIG. 18, the source line shunt transistors 3 are needed to bring the source lines SL2 and the power supply interconnect pad 5 at ground potential into and out of conduction. In this case, as shown in FIG. 18, when the source line shunt transistors 3, the number of which is less than that of the source lines SL2 aligned vertically as shown in FIG. 18, are disposed, for example, at the end of each memory cell array, the source lines SL2 along the line III-III, having a higher conductance, are desirable because there is less increase in source line potential. With this embodiment, the interconnect conductance along the line III-III can increase more than that of the related art by the value of the number of added source line 2 elements 1 (SL2E1) multiplied by the number of added elements, and a higher reduction effect of the value of parasitic resistance than in the case of adding the interconnects along the line III-III only at the end of each memory cell array, as with the related art, can be achieved.

Furthermore, since the source line 2 elements 1 (SL2E1) are formed in a grid, cross sections of the interconnects exist along both lines of lines I-I and III-III. Therefore, even when using a material with poor adhesiveness, such as an interlayer fluorine-doped silicon insulator film (SiOF), SiC, HSQ, or MSQ, for an insulator between or below the interconnects, the surface area of the cross-sectional region increases, improving adhesion. This prevents the problem of peeling off the material with poor adhesiveness, such as the interlayer fluorine-doped silicon insulator film (SiOF), SiC, HSQ, or MSQ, for an interconnect foundation.

In addition, as shown in FIG. 15, it is desirable that the width z of each source line 2 elements 1 (SL2E1) be formed to satisfy z/2<y; where y denotes the distance between each source line SL2 and the interface between the tunnel insulator film of a memory cell transistor and the semiconductor substrate 26; and it is desirable that z fall within the range of between 0.1 „m and 2 „m. In general, a passivation film such as a silicon nitride film is formed after formation of the source lines SL2, and hydrogen generated during that formation also diffuses into the memory cell transistors. When the source lines SL2 do not cover the memory cell array region, diffused hydrogen can easily reach the gate insulator film and then be trapped in that insulator film, so as to restore a part of defects of that insulator film. In addition, by providing for the diffused hydrogen to reach the interface between the insulator film and the substrate termination of the interface state, decrease in the thresholds of nMOS transistors, and decrease in the subthreshold coefficient is achieved. In the case of hydrogen having isotropically diffused after formation of a passivation film as with the case of having carried out thermal treatment, when z/2<y is satisfied, the hydrogen diffusion length from the passivation film is longer than y, and thus the diffused hydrogen reaches the transistor gate insulator film beneath the source line 2 elements 1 (SL2E1). This allows elimination of location dependency of the hydrogen density distribution within the gate insulator films of the select gate transistors SGD and SGS, and formation of a more reliable semiconductor memory.

Furthermore, as is apparent in FIG. 14, the source lines SL2 uniformly cover a region between the select gate lines SSL or a region between the select gate lines SGL. Accordingly, all data transfer lines BL may maintain almost constant interlayer parasitic capacitances with the source lines SL2 in the region between the select gate lines SSL or the region between the select gate lines SGL. As a result, variation in parasitic capacitances of the data transfer lines BL decreases, which reduces variation in CR time constants for the data transfer lines during reading. Accordingly, the read timing margin can further decrease, which reduces in a faster semiconductor memory. In addition, a small amount of electrical charges to charge/discharge the data transfer lines can be maintained, which reduces in a high-speed read-out operation with low power consumption. Furthermore, as for the data transfer lines BL in the memory cell array region, capacitive coupling of the source lines SL2 and the data transfer lines BL decreases since the source lines SL2 are formed only on the region between the select gate lines SSL or the region between the select gate lines SGL. As a result, electrical capacitances of the data transfer lines can decrease to be almost equivalent to that of the related art.

(Fabrication Method of the First Embodiment)

Figure 23:
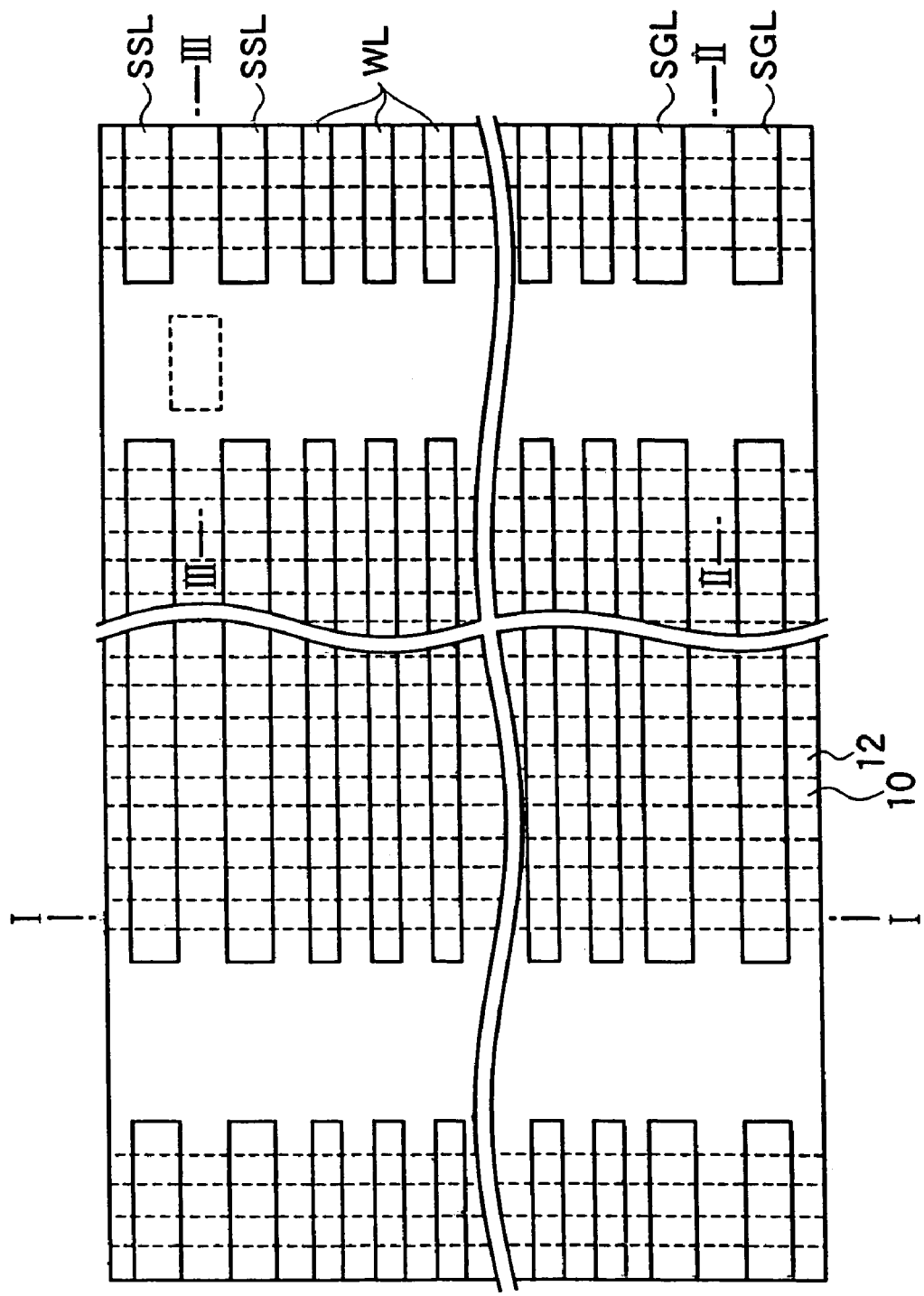
FIG. 23 is a detailed aerial pattern diagram of the memory cell array region for describing a step of a fabrication method for the nonvolatile semiconductor memory according to the first embodiment of the present invention.
Figure 24:
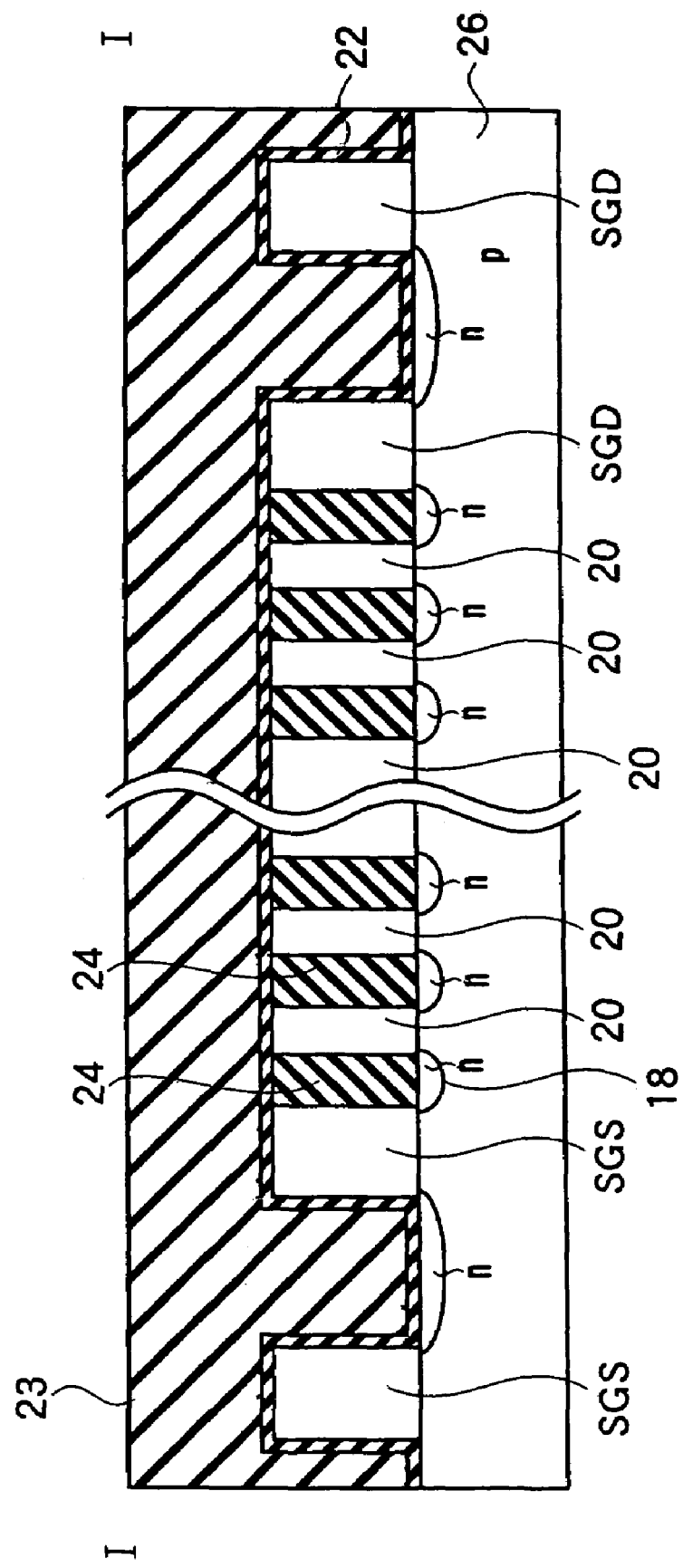
FIG. 24 is a schematic cross-sectional diagram cut along the line I-I of FIG. 23.
Figure 25:
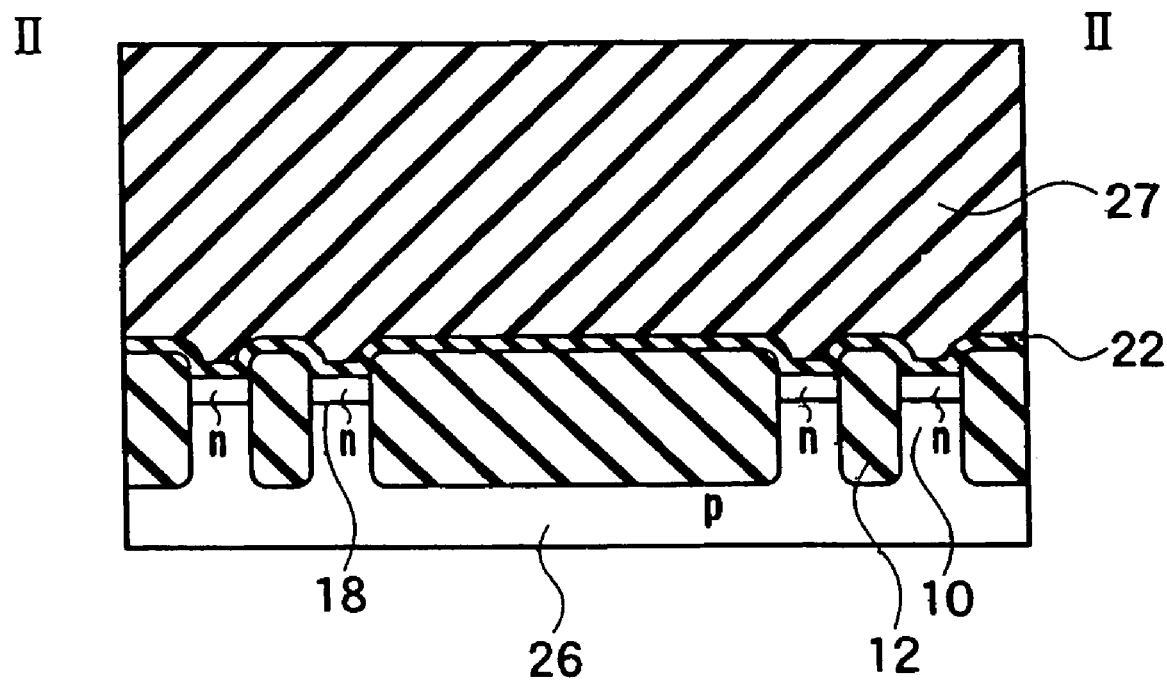
FIG. 25 is a schematic cross-sectional diagram cut along the line II-II of FIG. 23.
Figure 26:
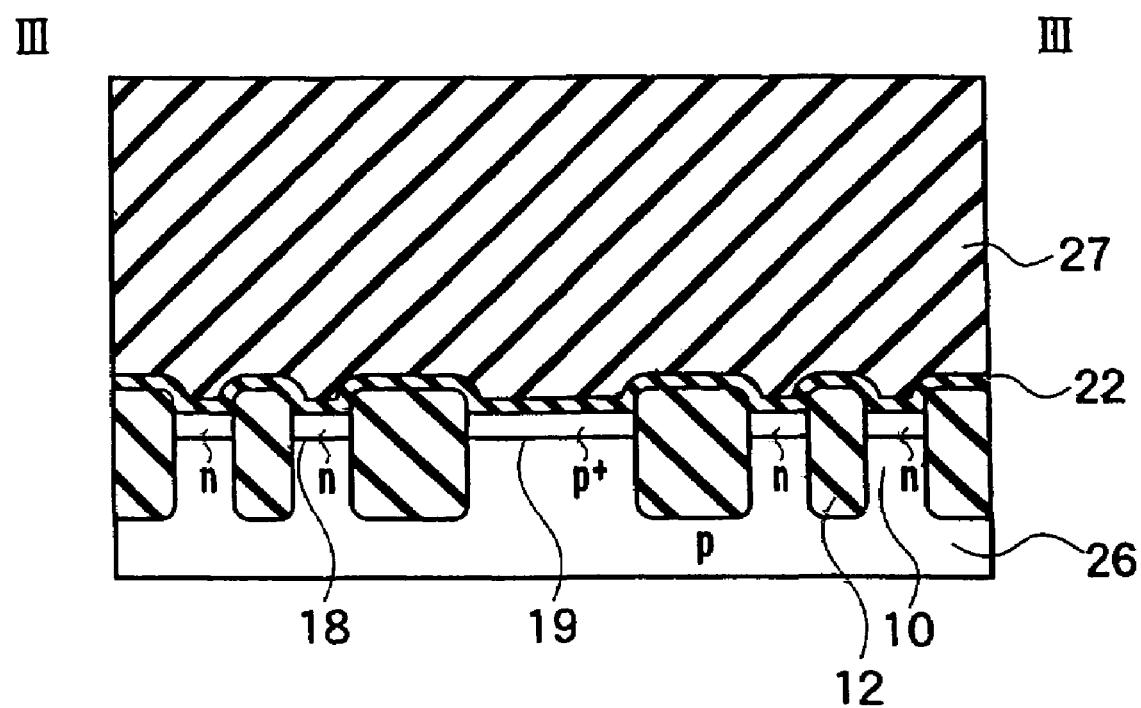
FIG. 26 is a schematic cross-sectional diagram cut along the line III-III of FIG. 23.
Figure 27:
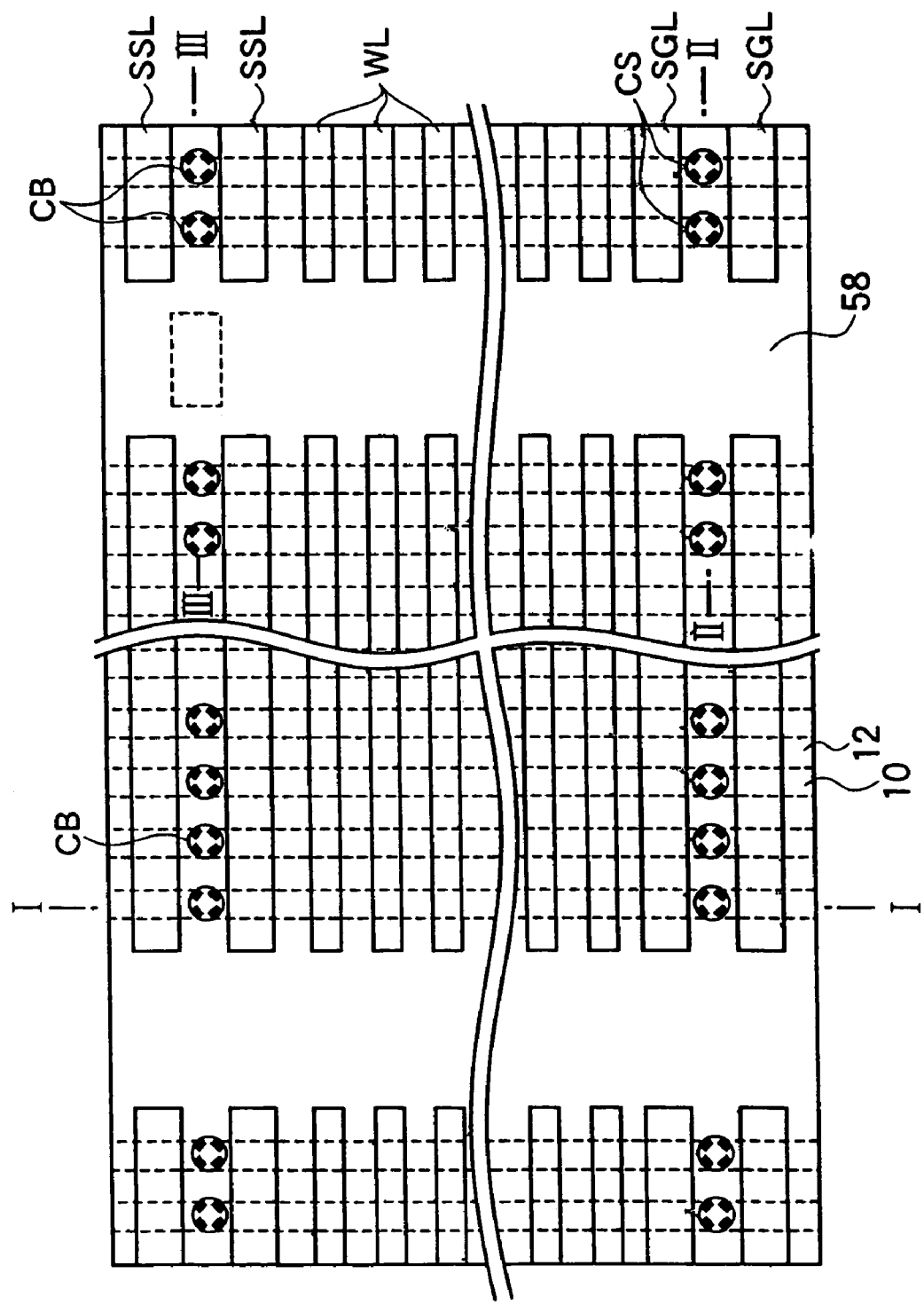
FIG. 27 is a detailed aerial pattern diagram of a memory cell array region for describing a step of the fabrication method for the nonvolatile semiconductor memory according to the first embodiment of the present invention.
Figure 28:
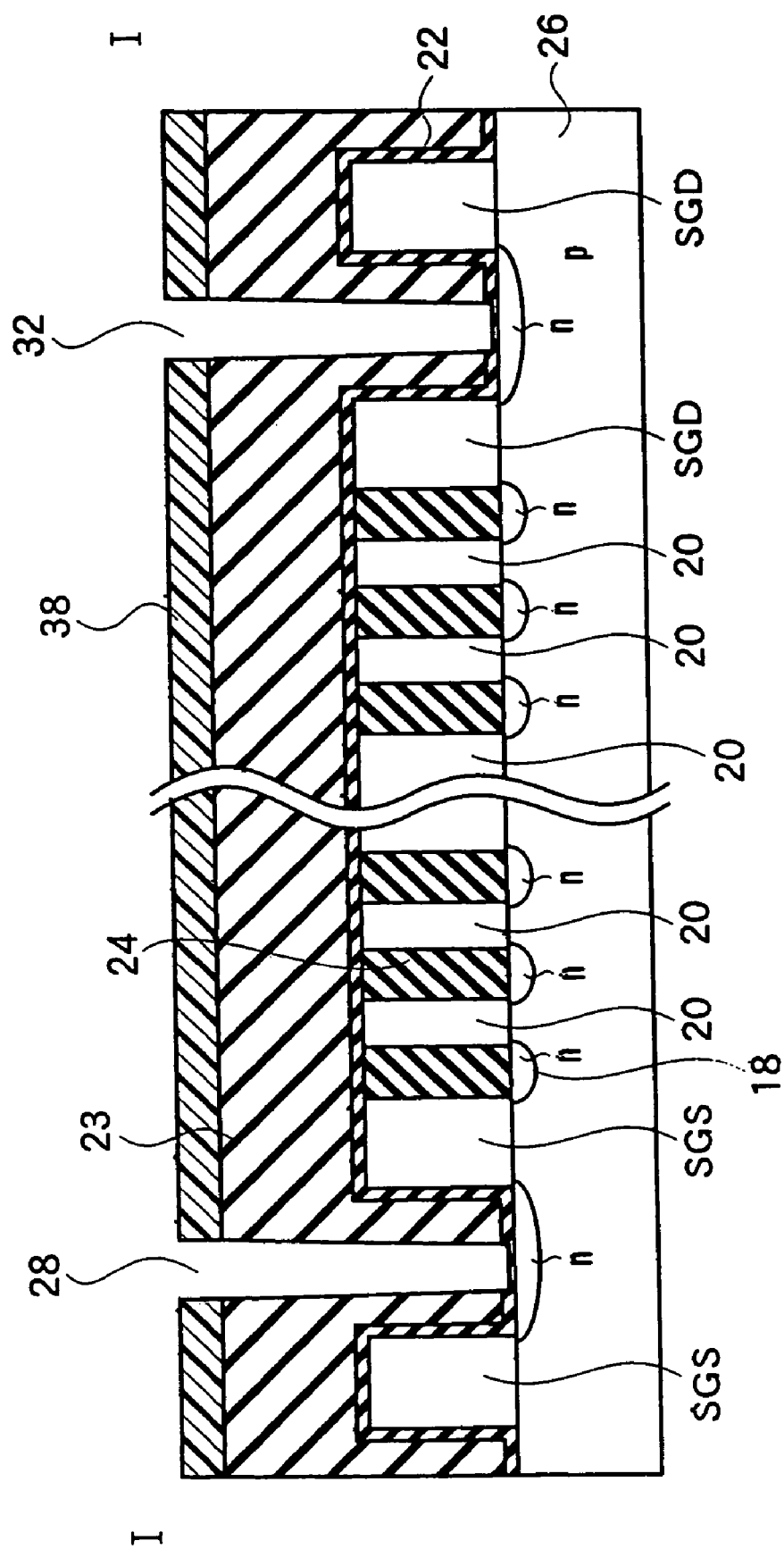
FIG. 28 is a schematic cross-sectional diagram cut along the line I-I of FIG. 27.
Figure 29:
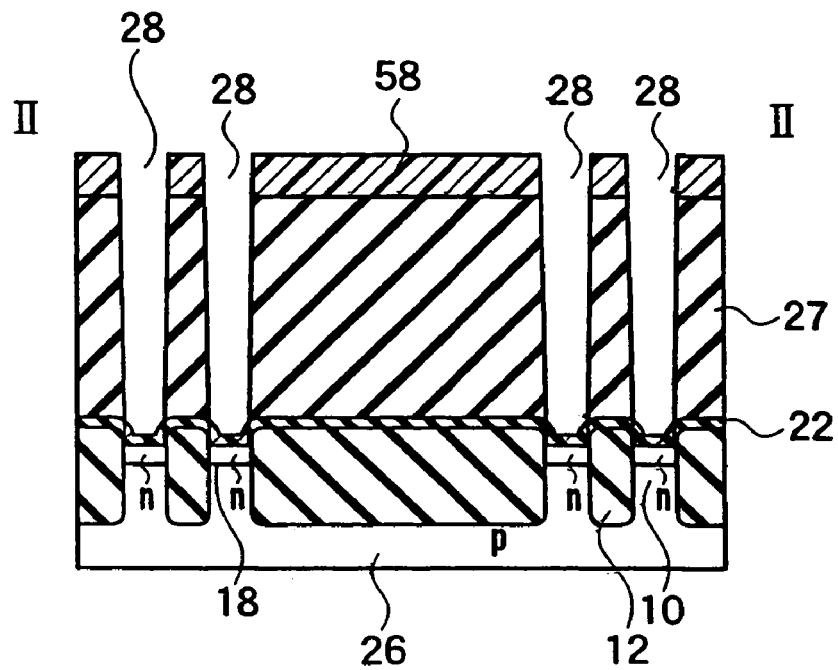
FIG. 29 is a schematic cross-sectional diagram cut along the line II-II of FIG. 27.
Figure 30:
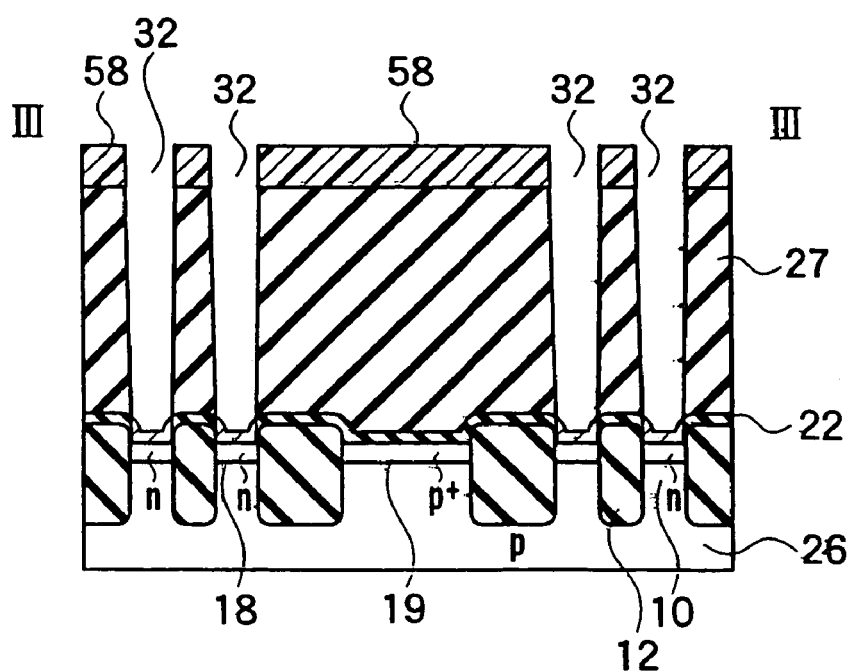
FIG. 30 is a schematic cross-sectional diagram cut along the line III-III of FIG. 27.
Figure 31:
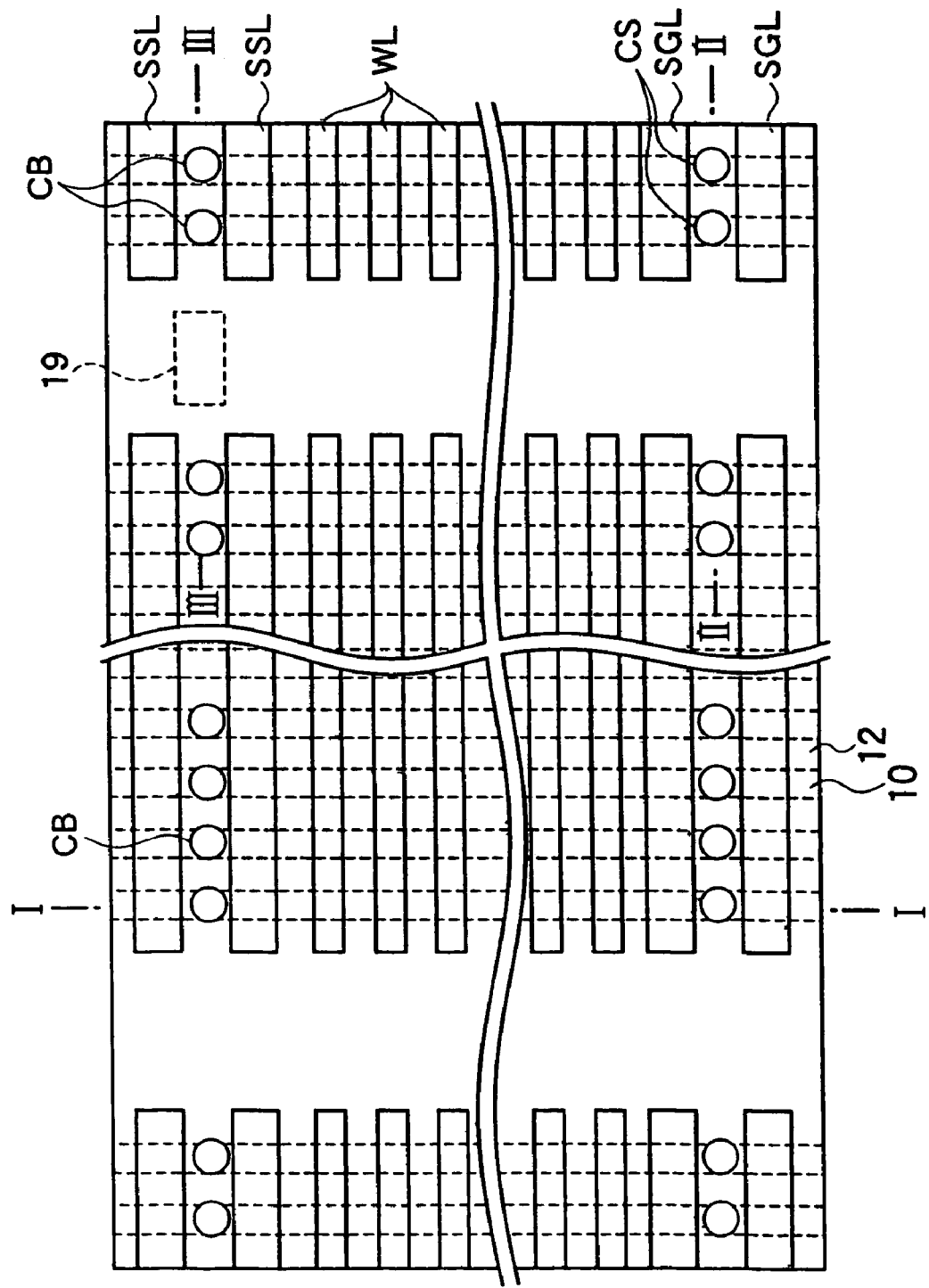
FIG. 31 is a detailed aerial pattern diagram of a memory cell array region for describing a step of the fabrication method for the nonvolatile semiconductor memory according to the first embodiment of the present invention.
Figure 32:
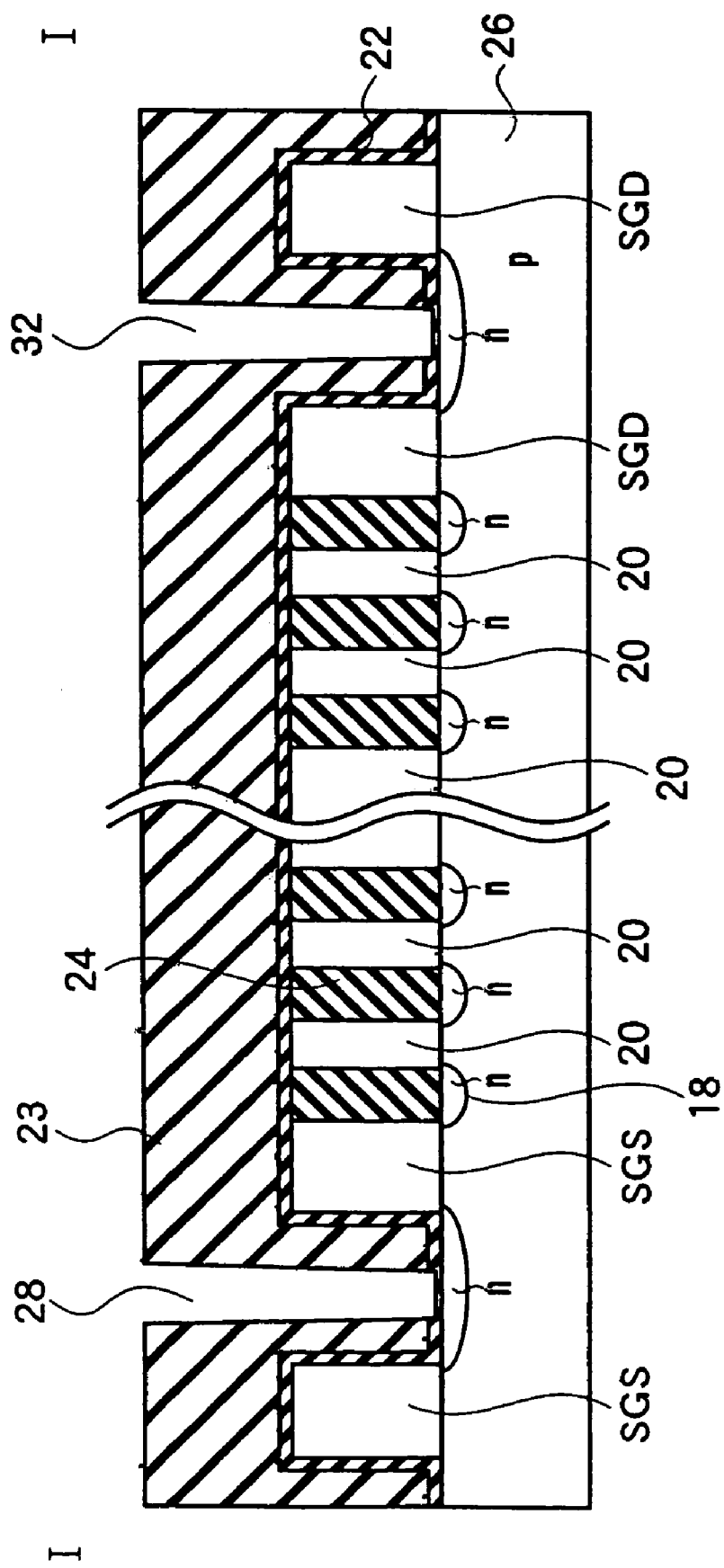
FIG. 32 is a schematic cross-sectional diagram cut along the line I-I of FIG. 31.
Figure 33:
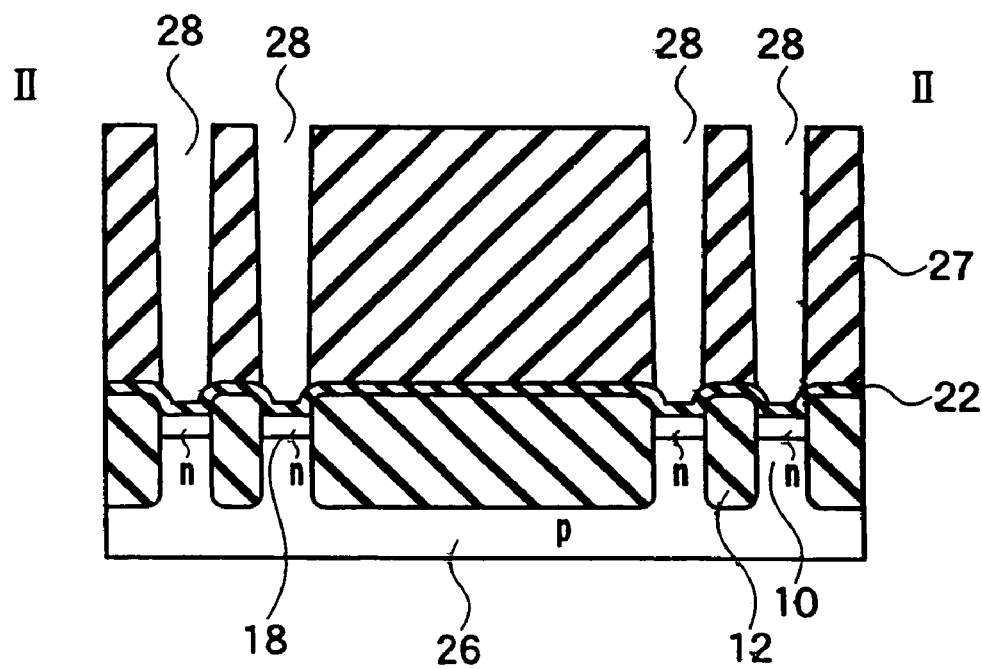
FIG. 33 is a schematic cross-sectional diagram cut along the line II-II of FIG. 31.
Figure 34:
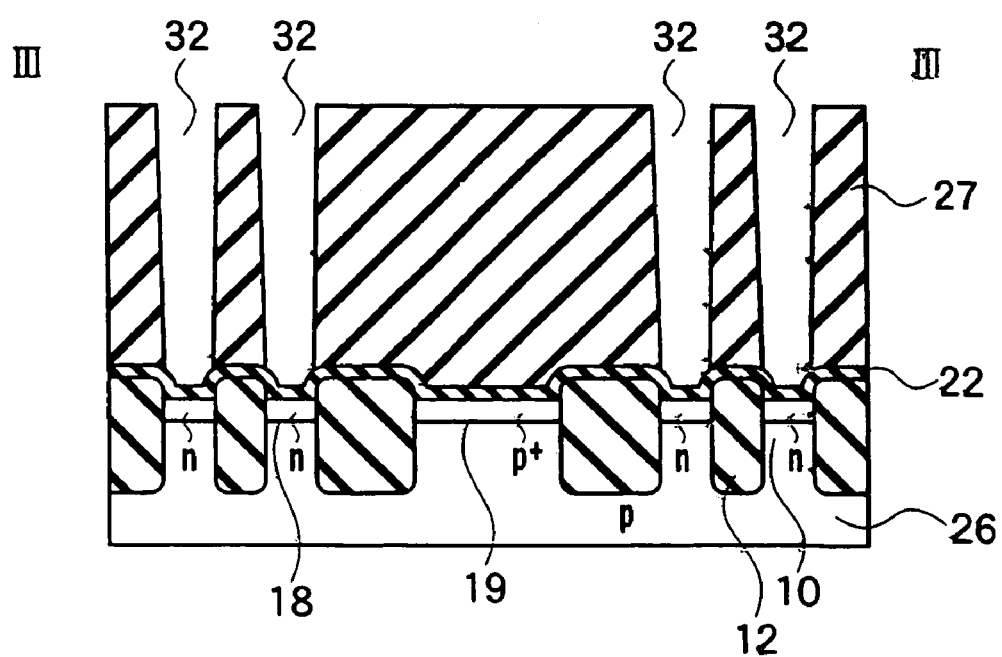
FIG. 34 is a schematic cross-sectional diagram cut along the line III-III of FIG. 31.
Figure 35:
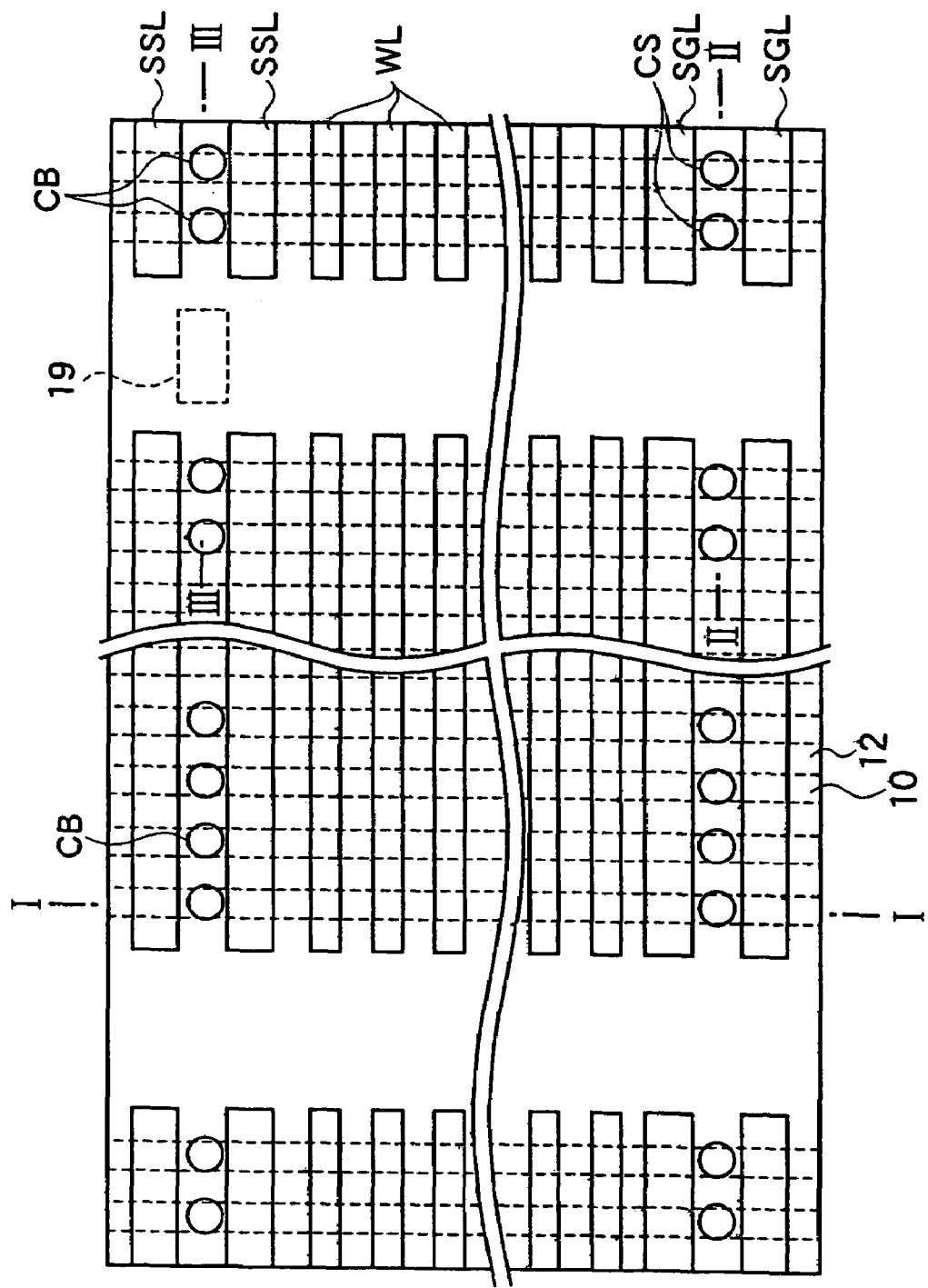
FIG. 35 is a detailed aerial pattern diagram of the memory cell array region for describing a step of the fabrication method for the nonvolatile semiconductor memory according to the first embodiment of the present invention.
Figure 36:
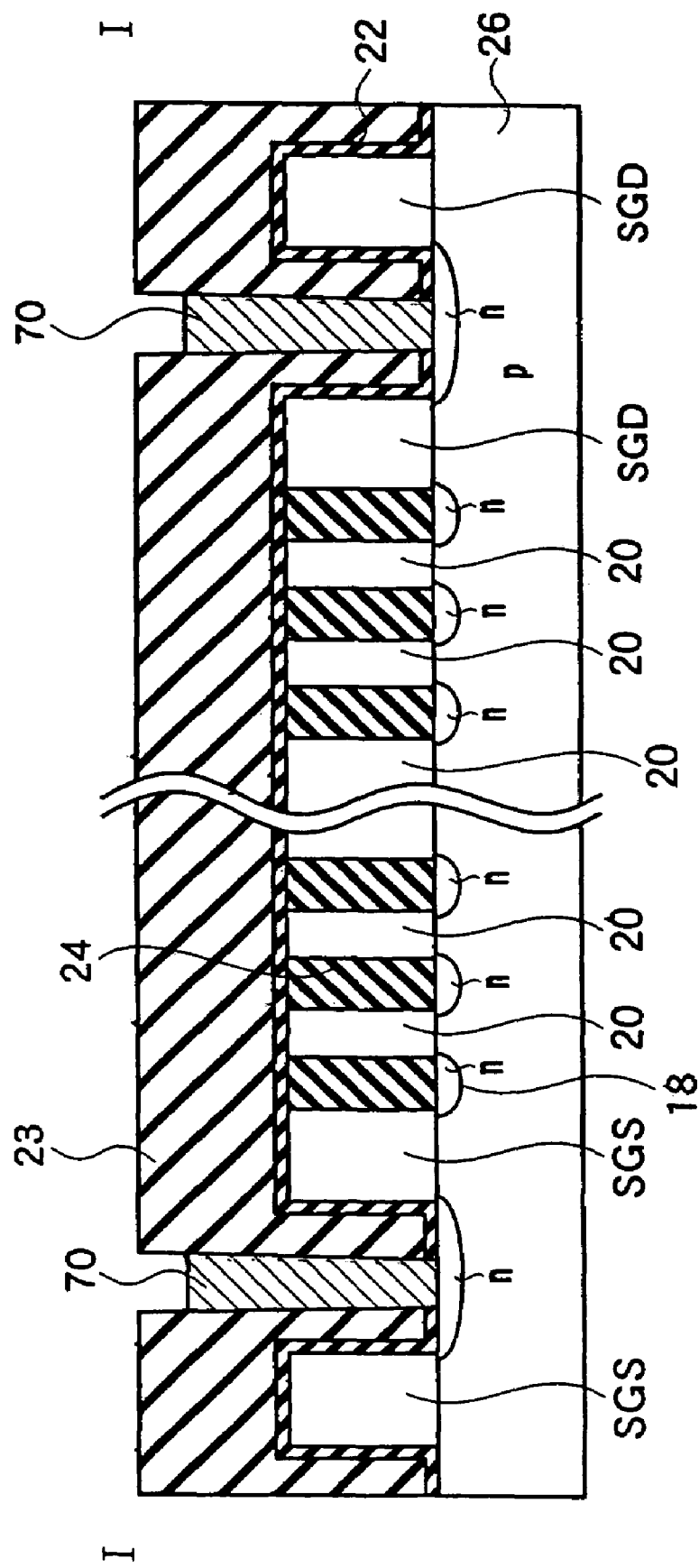
FIG. 36 is a schematic cross-sectional diagram cut along the line I-I of FIG. 35.
Figure 37:
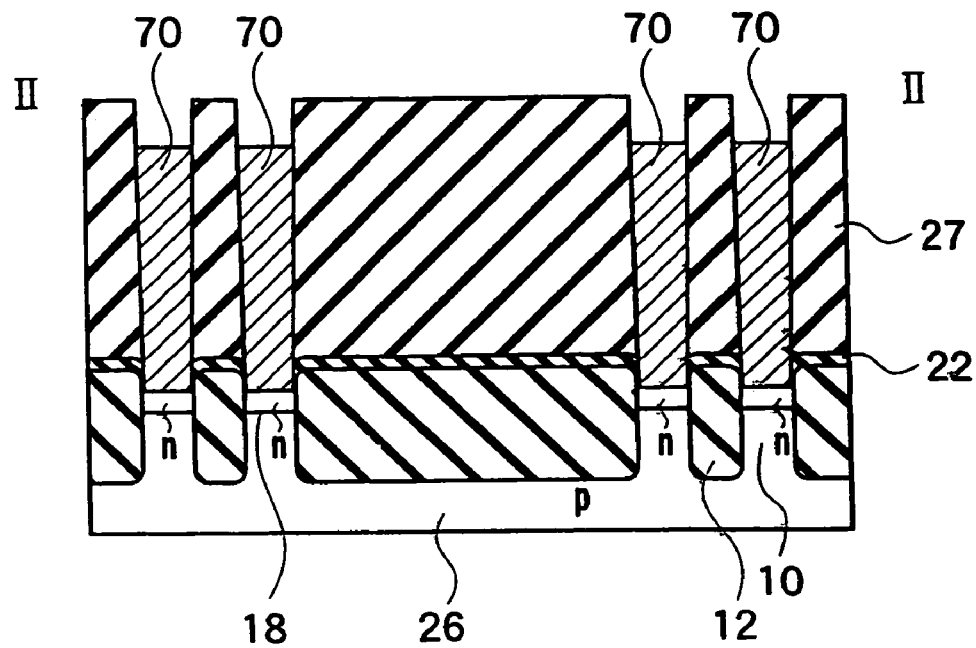
FIG. 37 is a schematic cross-sectional diagram cut along the line II-II of FIG. 35.
Figure 38:
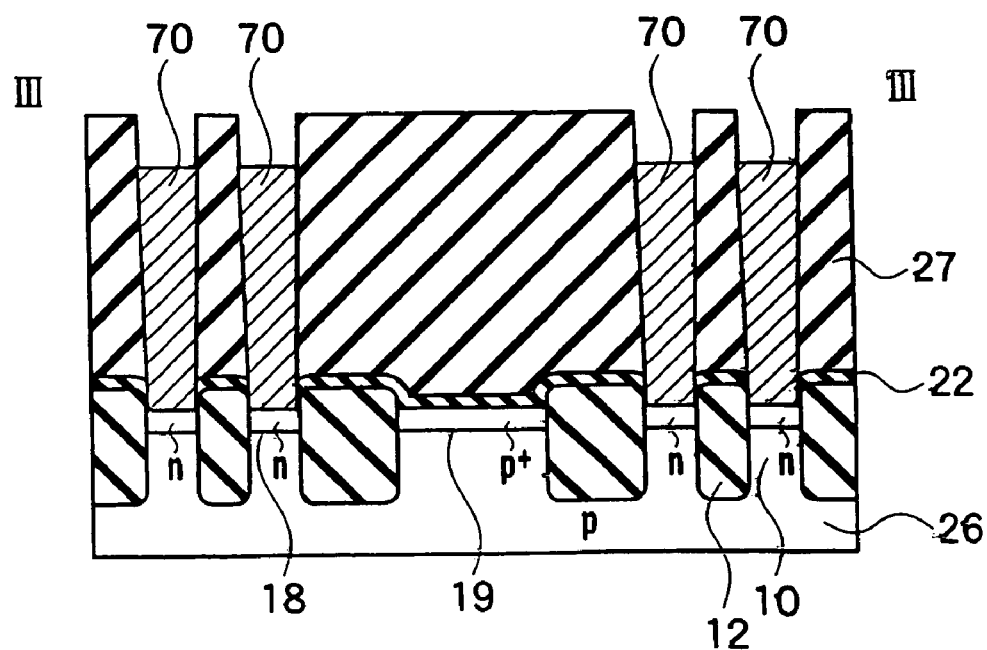
FIG. 38 is a schematic cross-sectional diagram cut along the line III-III of FIG. 35.
Figure 39:
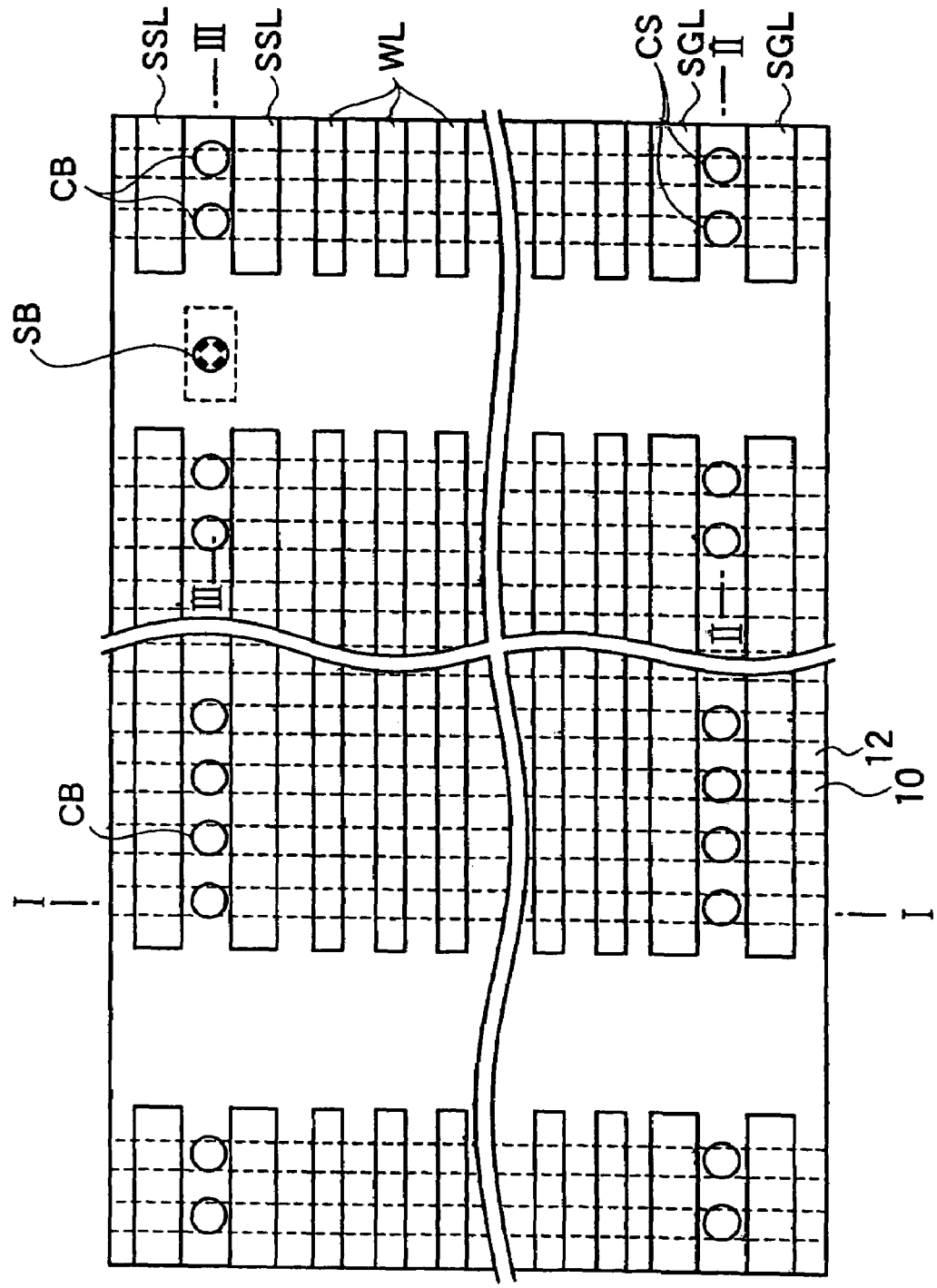
FIG. 39 is a detailed aerial pattern diagram of the memory cell array region for describing a step of the fabrication method for the nonvolatile semiconductor memory according to the first embodiment of the present invention.
Figure 40:
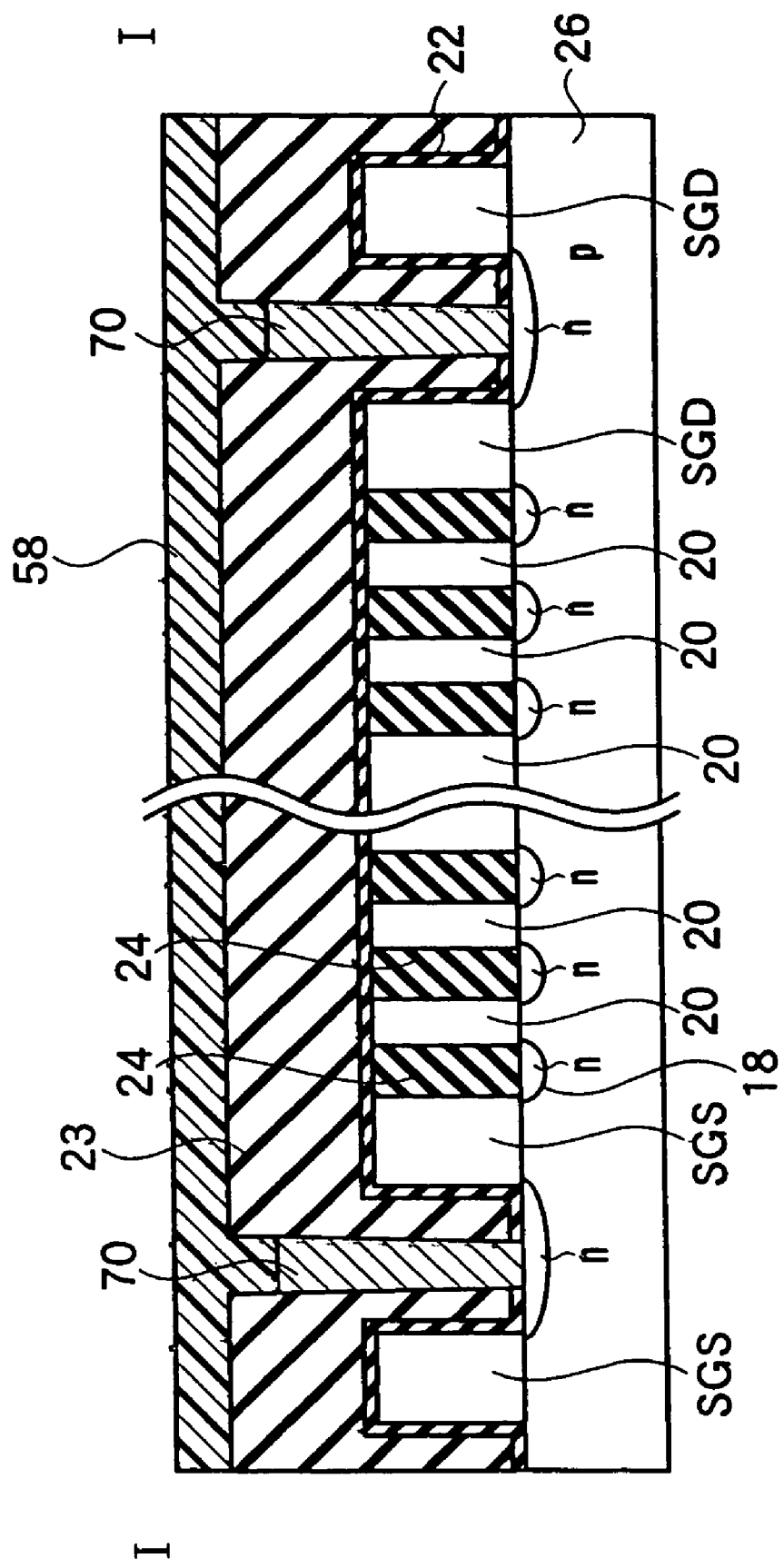
FIG. 40 is a schematic cross-sectional diagram cut along the line I-I of FIG. 39.
Figure 41:
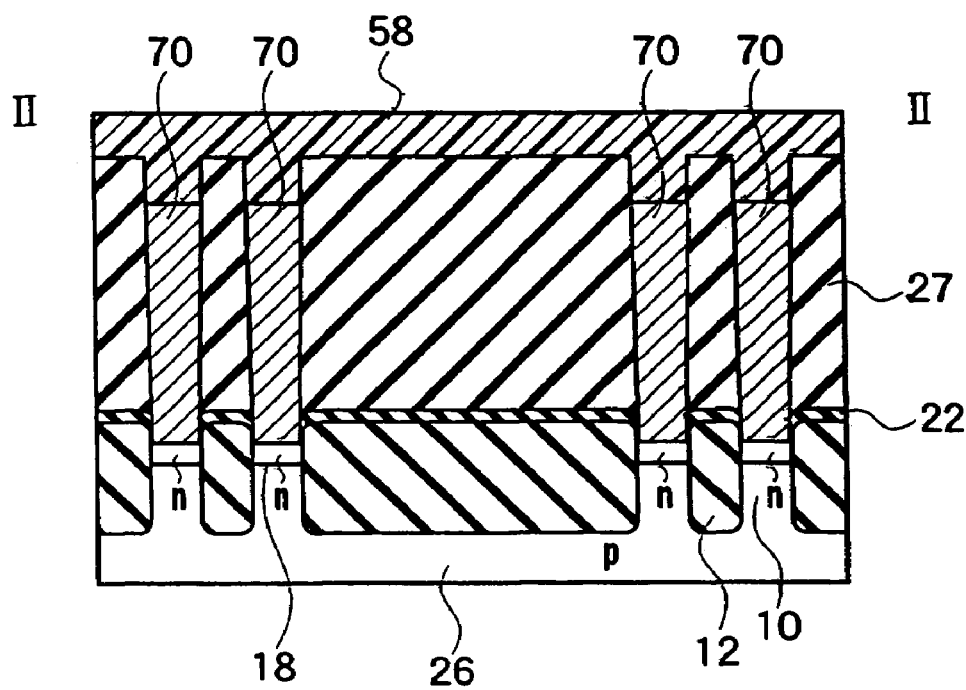
FIG. 41 is a schematic cross-sectional diagram cut along the line II-II of FIG. 39.
Figure 42:
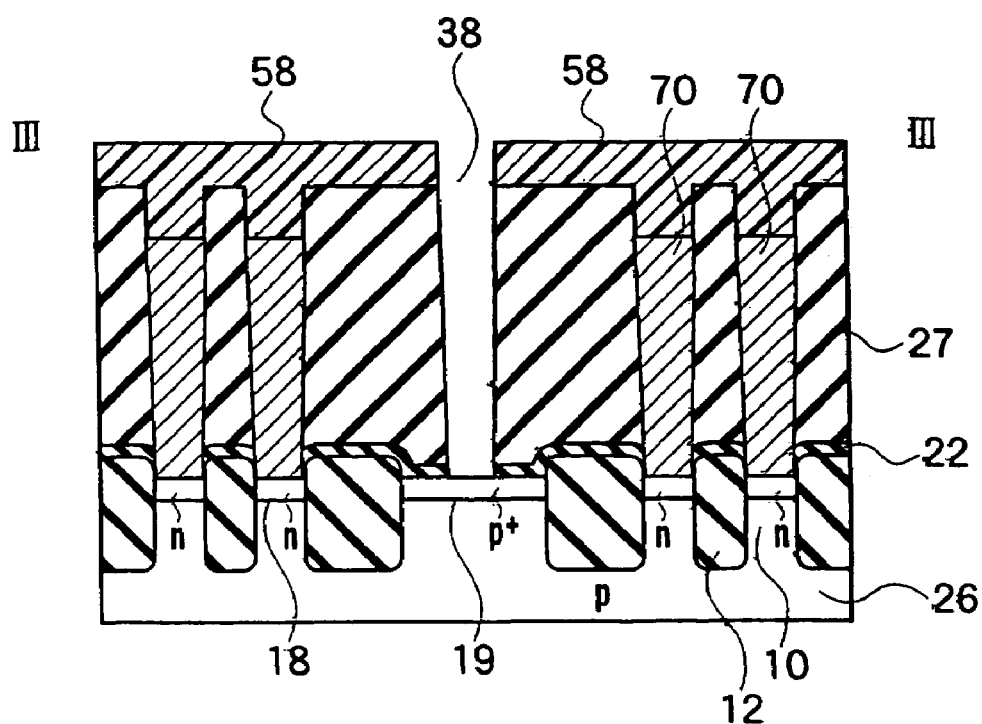
FIG. 42 is a schematic cross-sectional diagram cut along the line III-III of FIG. 39.
Figure 43:
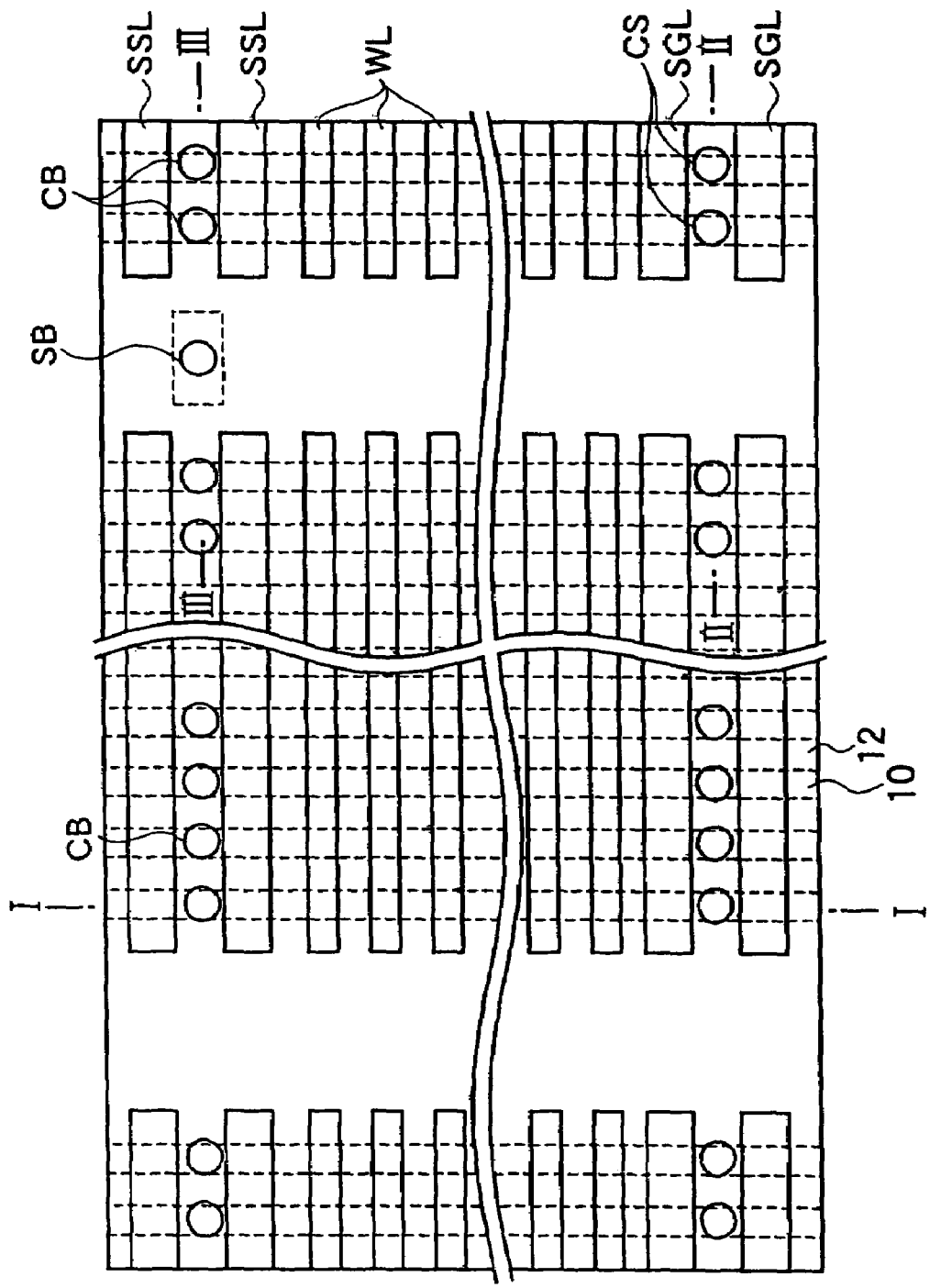
FIG. 43 is a detailed aerial pattern diagram of the memory cell array region for describing a step of the fabrication method for the nonvolatile semiconductor memory according to the first embodiment of the present invention.
Figure 44:
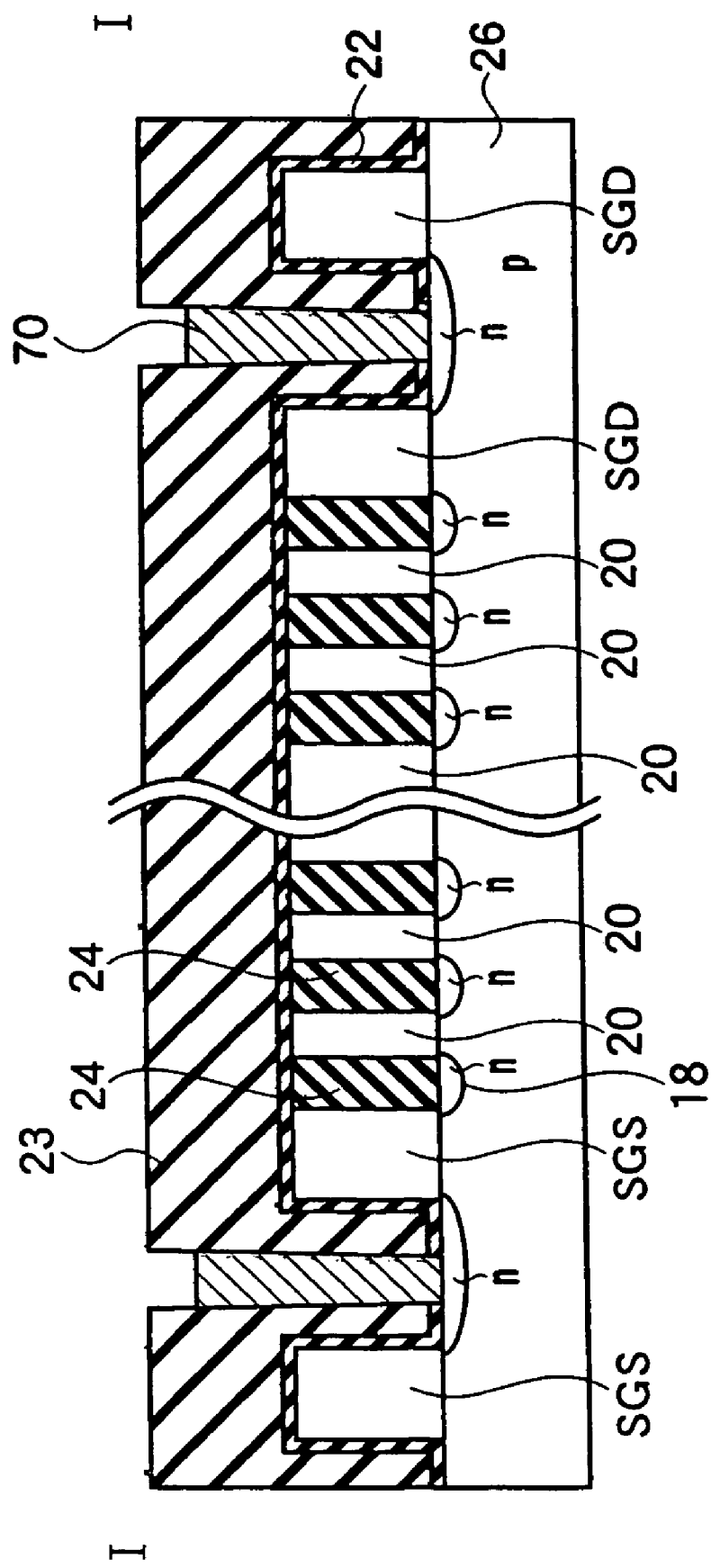
FIG. 44 is a schematic cross-sectional diagram cut along the line I-I of FIG. 43.
Figure 45:
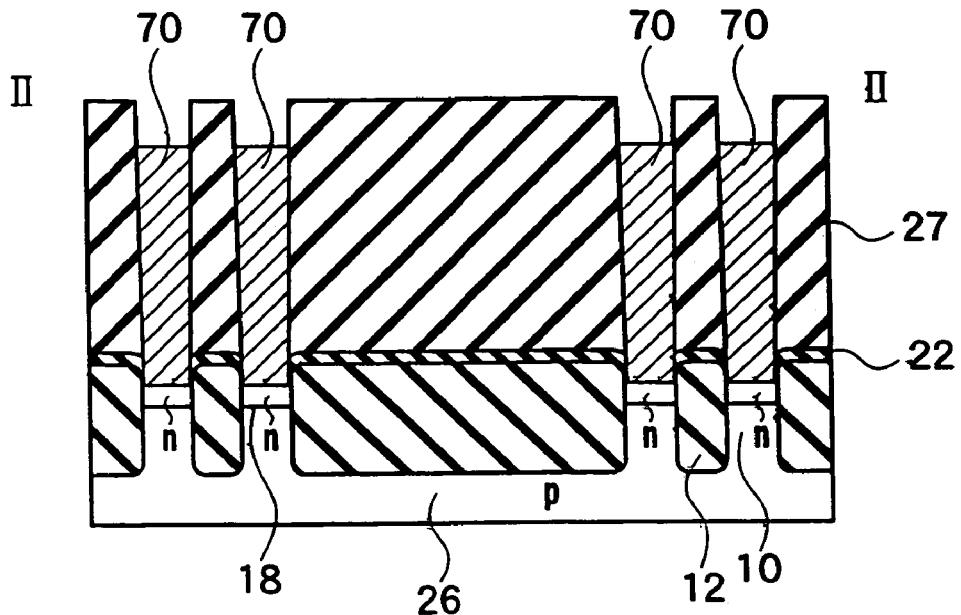
FIG. 45 is a schematic cross-sectional diagram cut along the line II-II of FIG. 43.
Figure 46:
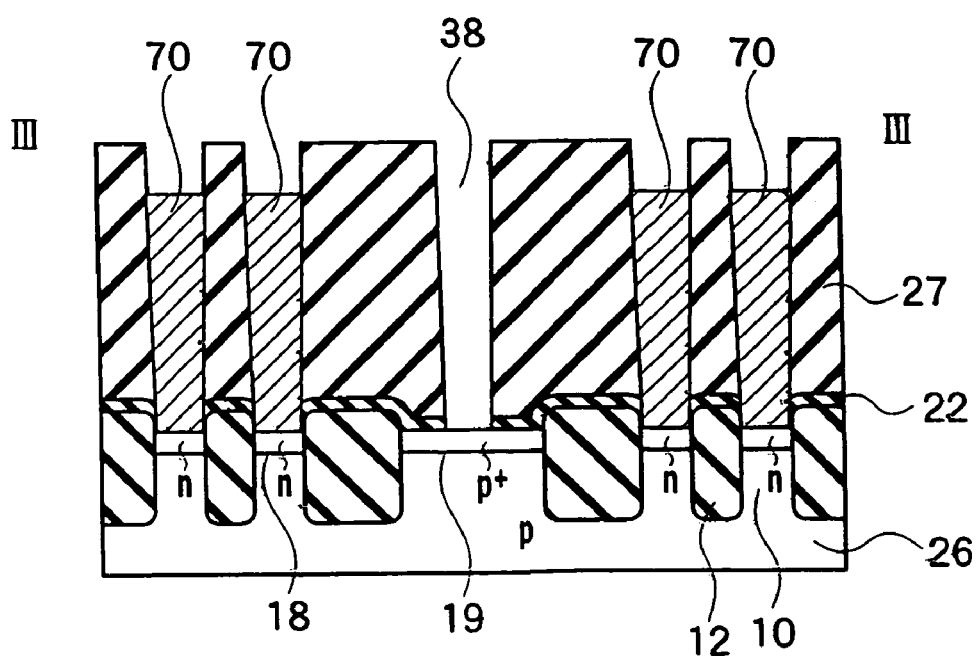
FIG. 46 is a schematic cross-sectional diagram cut along the line III-III of FIG. 43.
Figure 47:
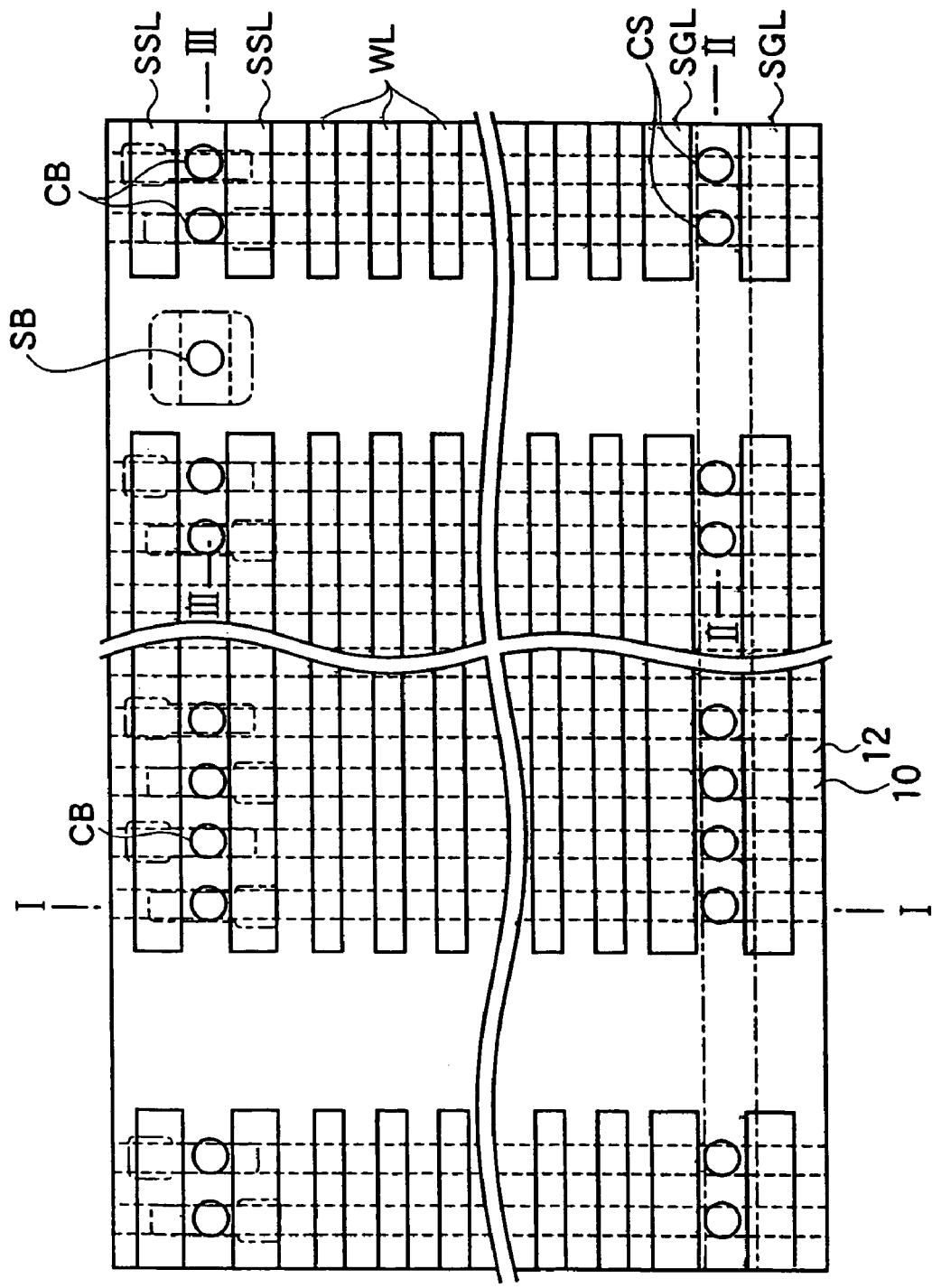
FIG. 47 is an aerial pattern diagram of the memory cell array region for describing a step of the fabrication method for the nonvolatile semiconductor memory according to the first embodiment of the present invention.
Figure 48:
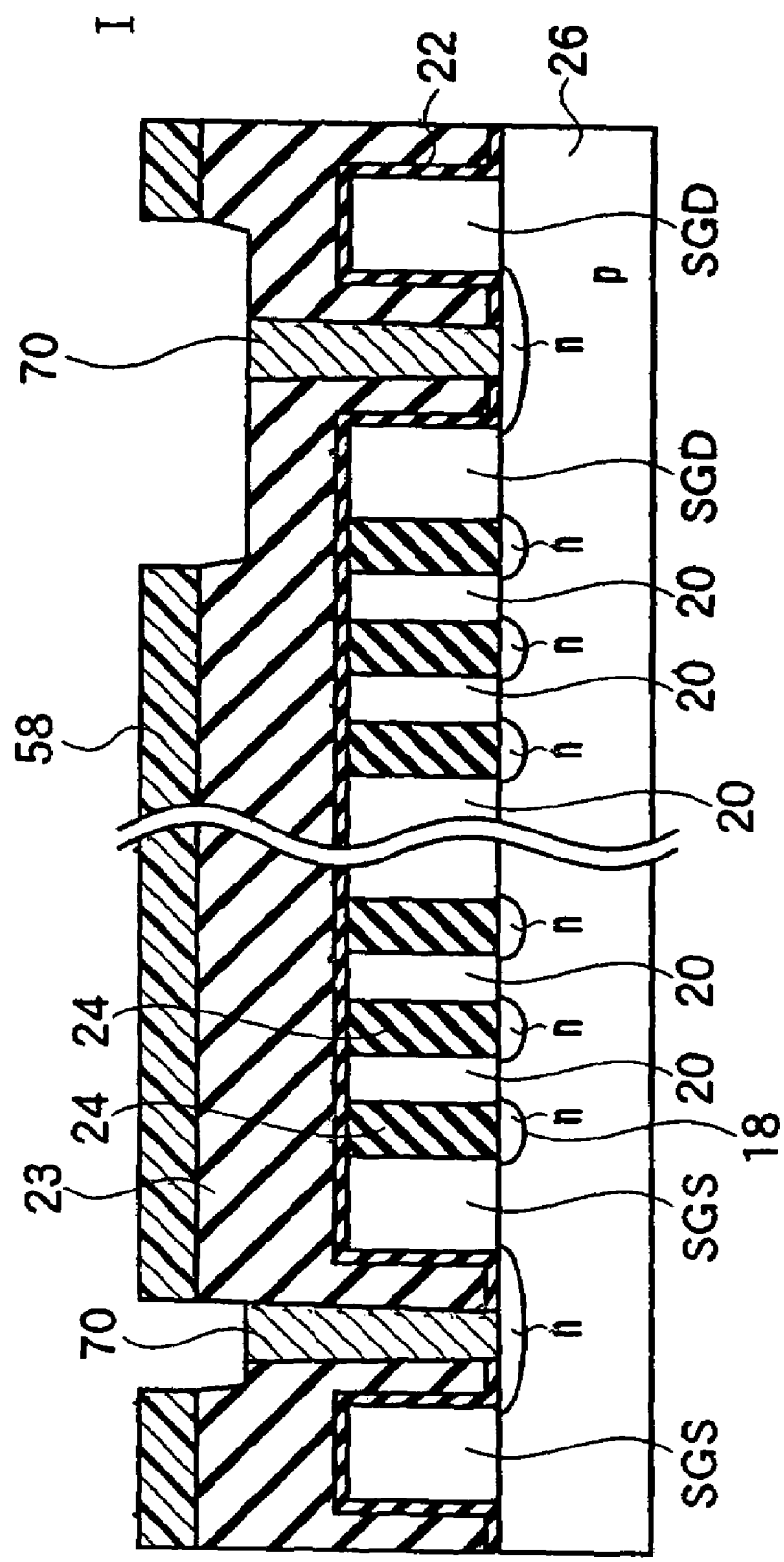
FIG. 48 is a schematic cross-sectional diagram cut along the line I-I of FIG. 47.
Figure 49:
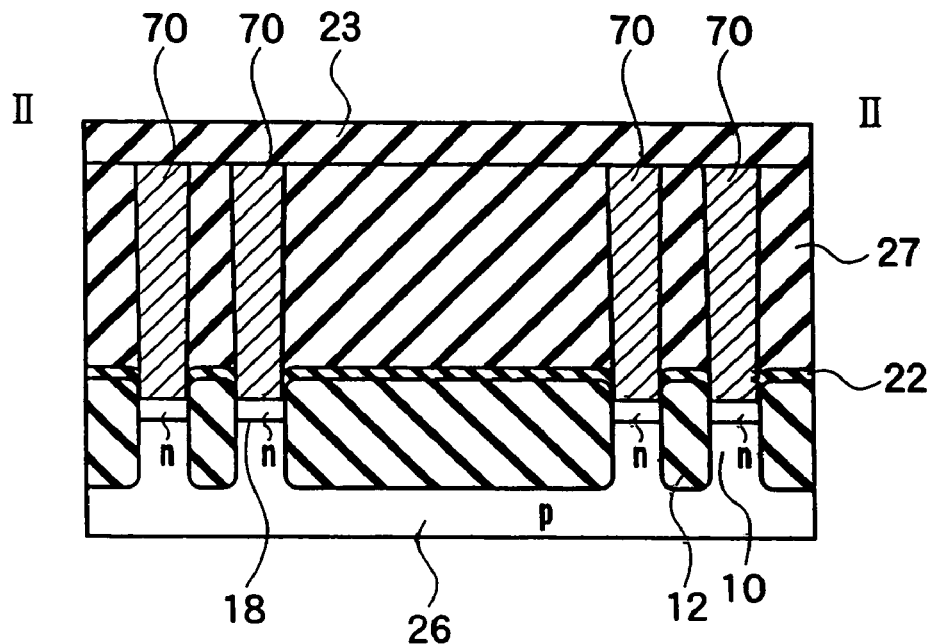
FIG. 49 is a schematic cross-sectional diagram cut along the line II-II of FIG. 47.
Figure 50:
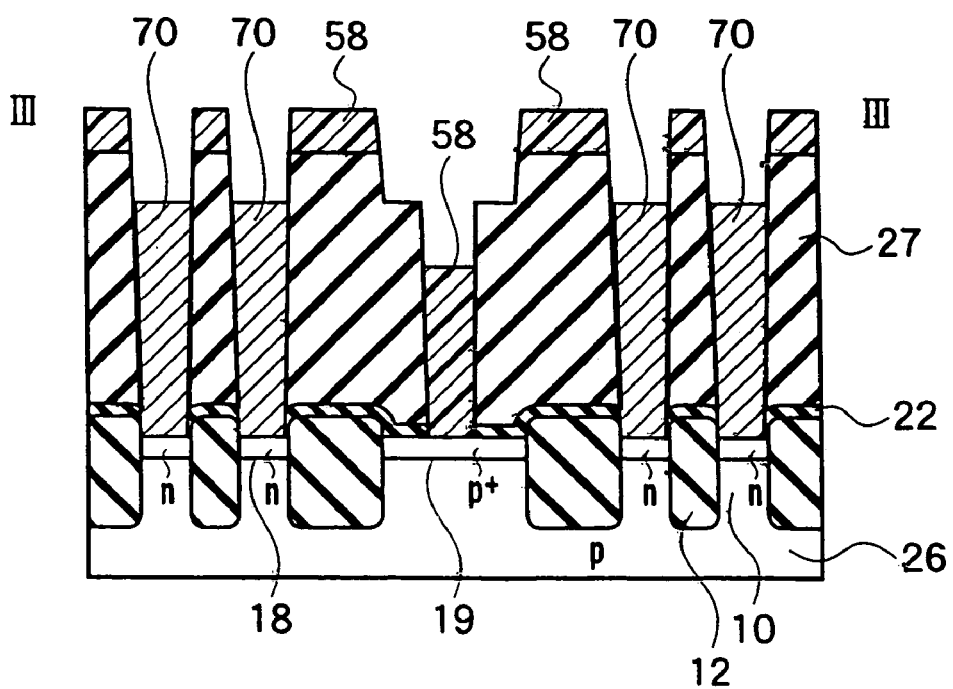
FIG. 50 is a schematic cross-sectional diagram cut along the line III-III of FIG. 47.
Figure 51:
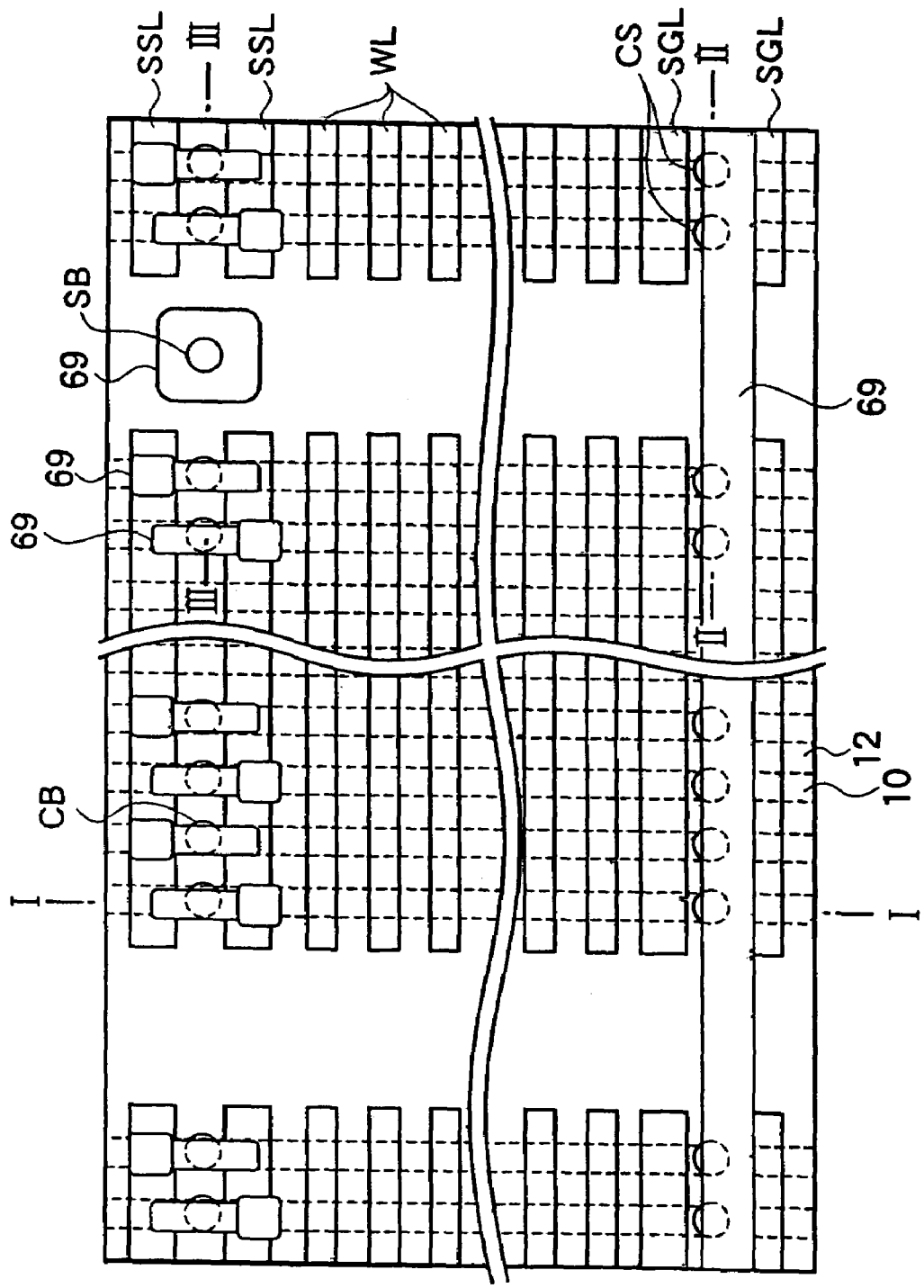
FIG. 51 is a detailed aerial pattern diagram of the memory cell array region for describing a step of the fabrication method for the nonvolatile semiconductor memory according to the first embodiment of the present invention.
Figure 52:
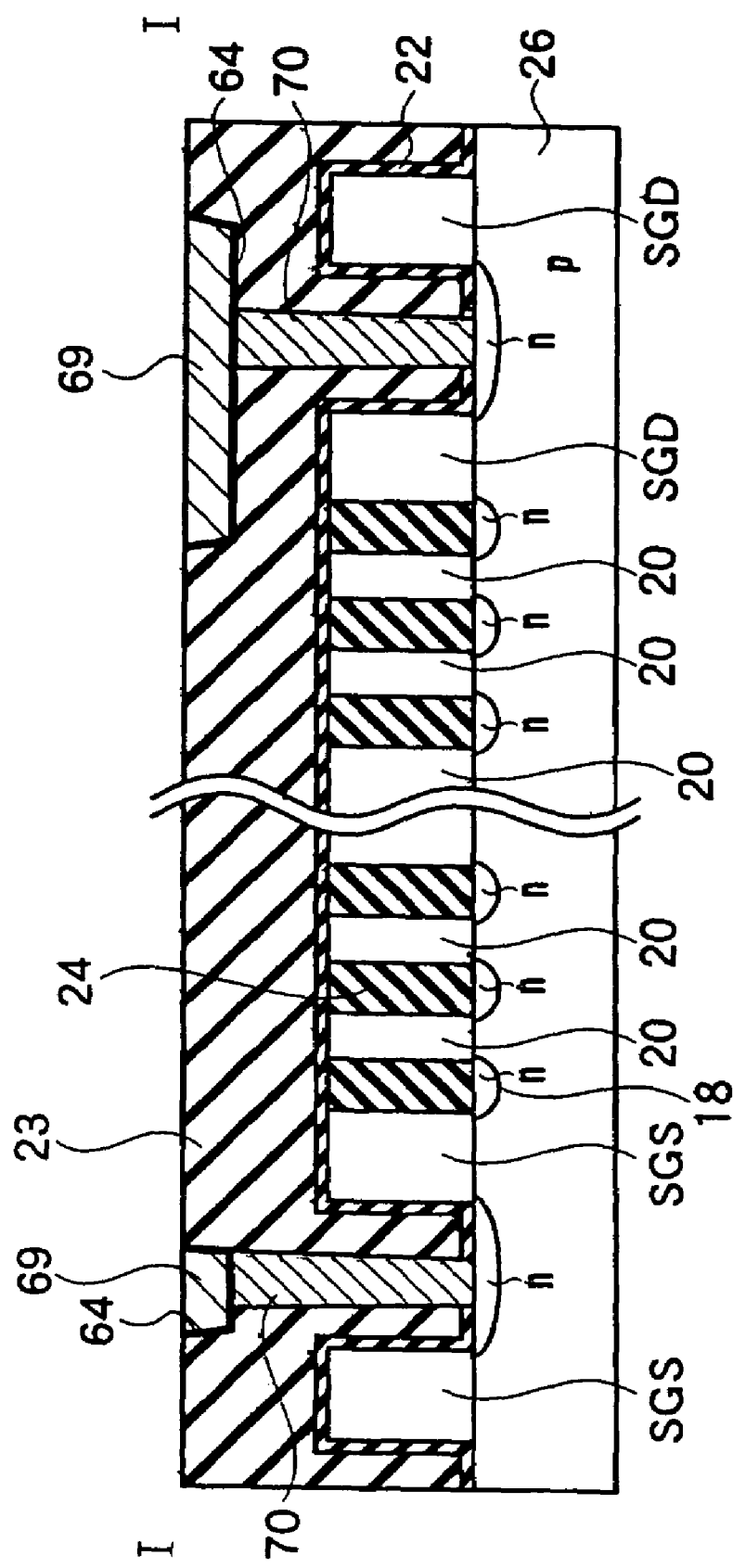
FIG. 52 is a schematic cross-sectional diagram cut along the line I-I of FIG. 51.
Figure 53:
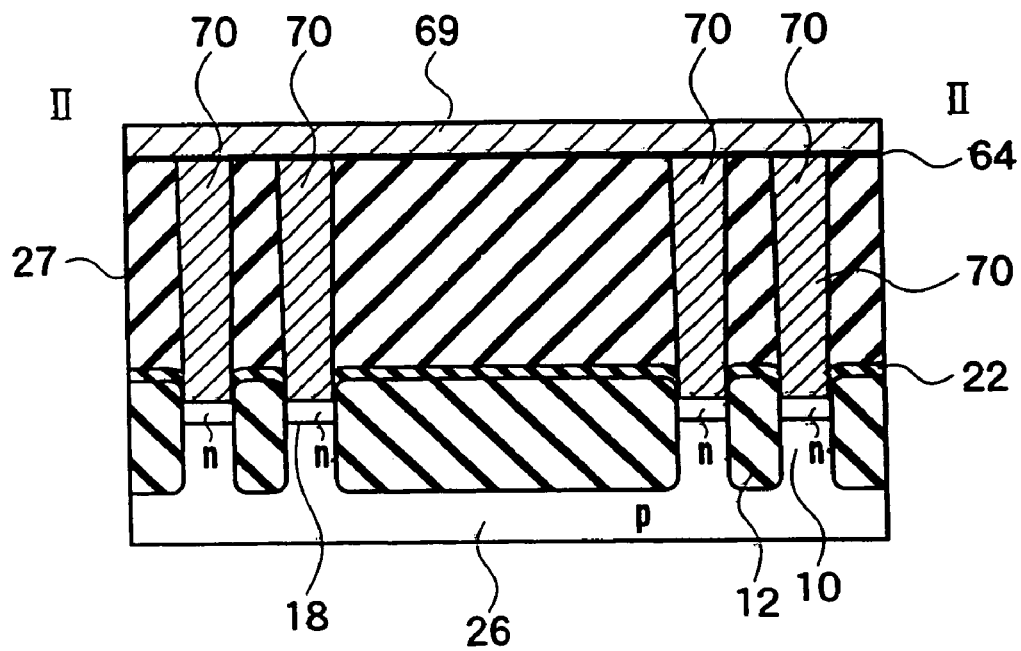
FIG. 53 is a schematic cross-sectional diagram cut along the line II-II of FIG. 51.
Figure 54:
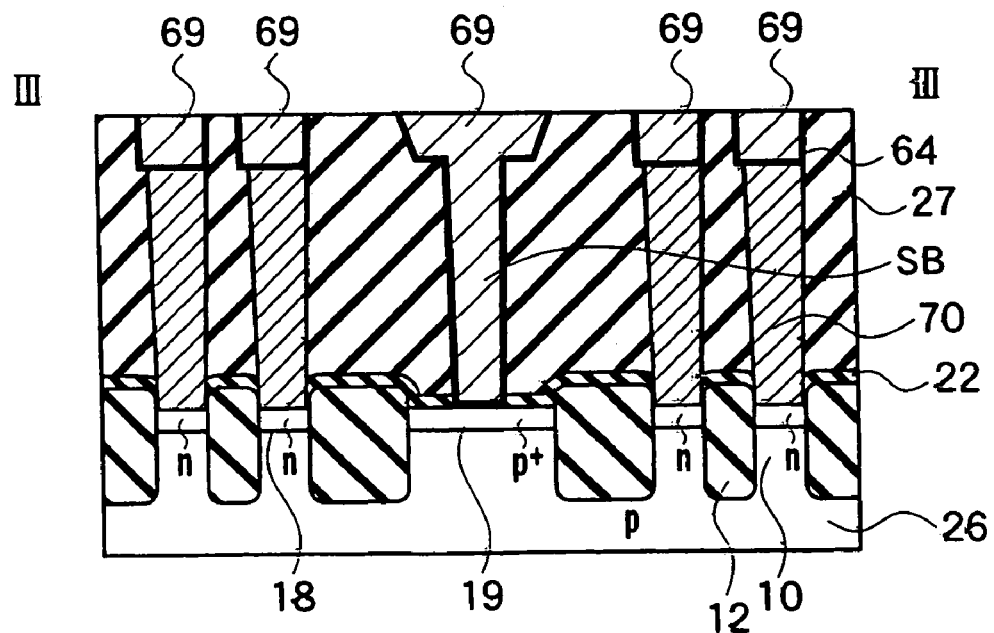
FIG. 54 is a schematic cross-sectional diagram cut along the line III-III of FIG. 51.
Figure 55:
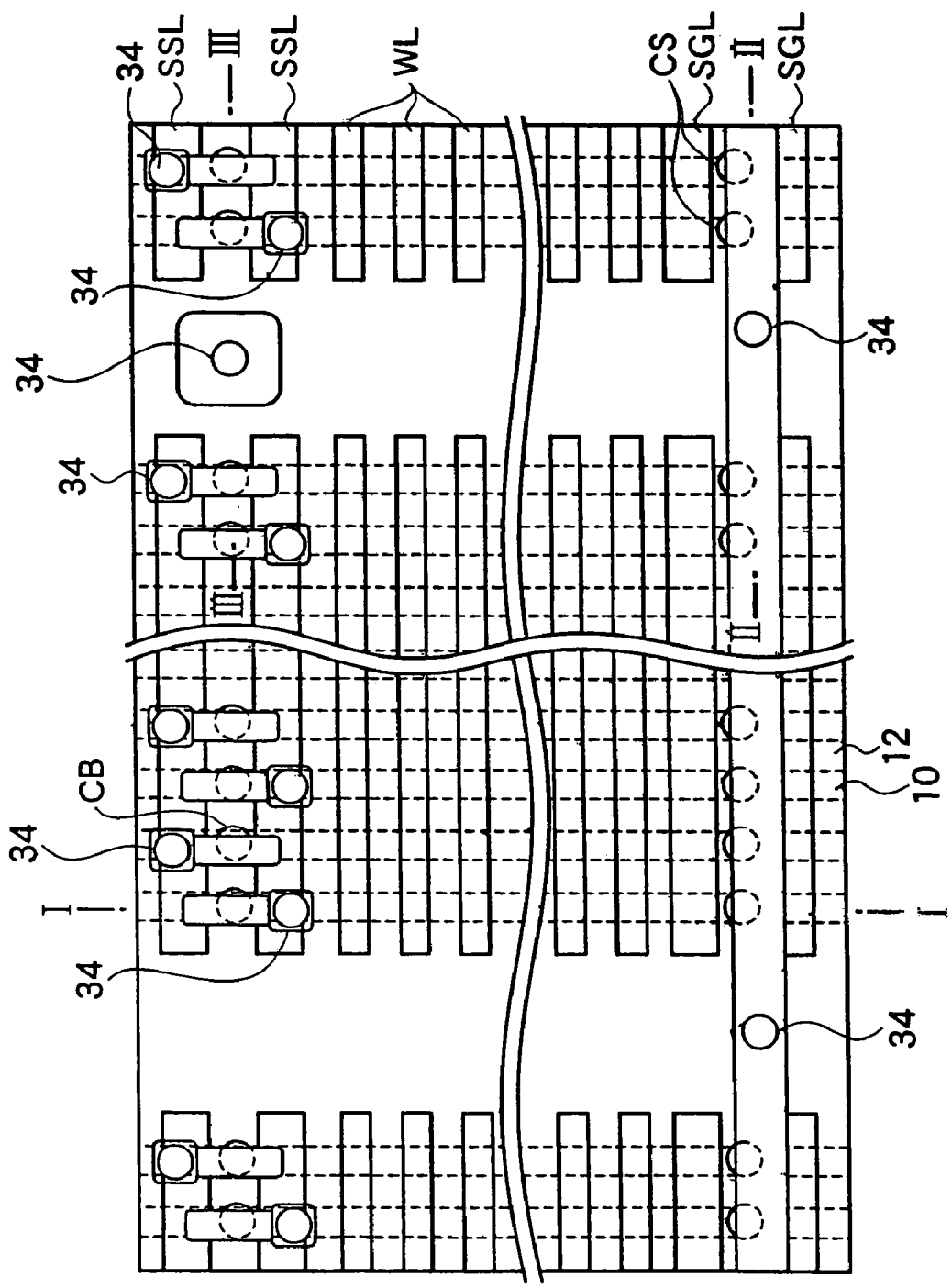
FIG. 55 is a detailed aerial pattern diagram of the memory cell array region for describing a step of the fabrication method for the nonvolatile semiconductor memory according to the first embodiment of the present invention.
Figure 56:
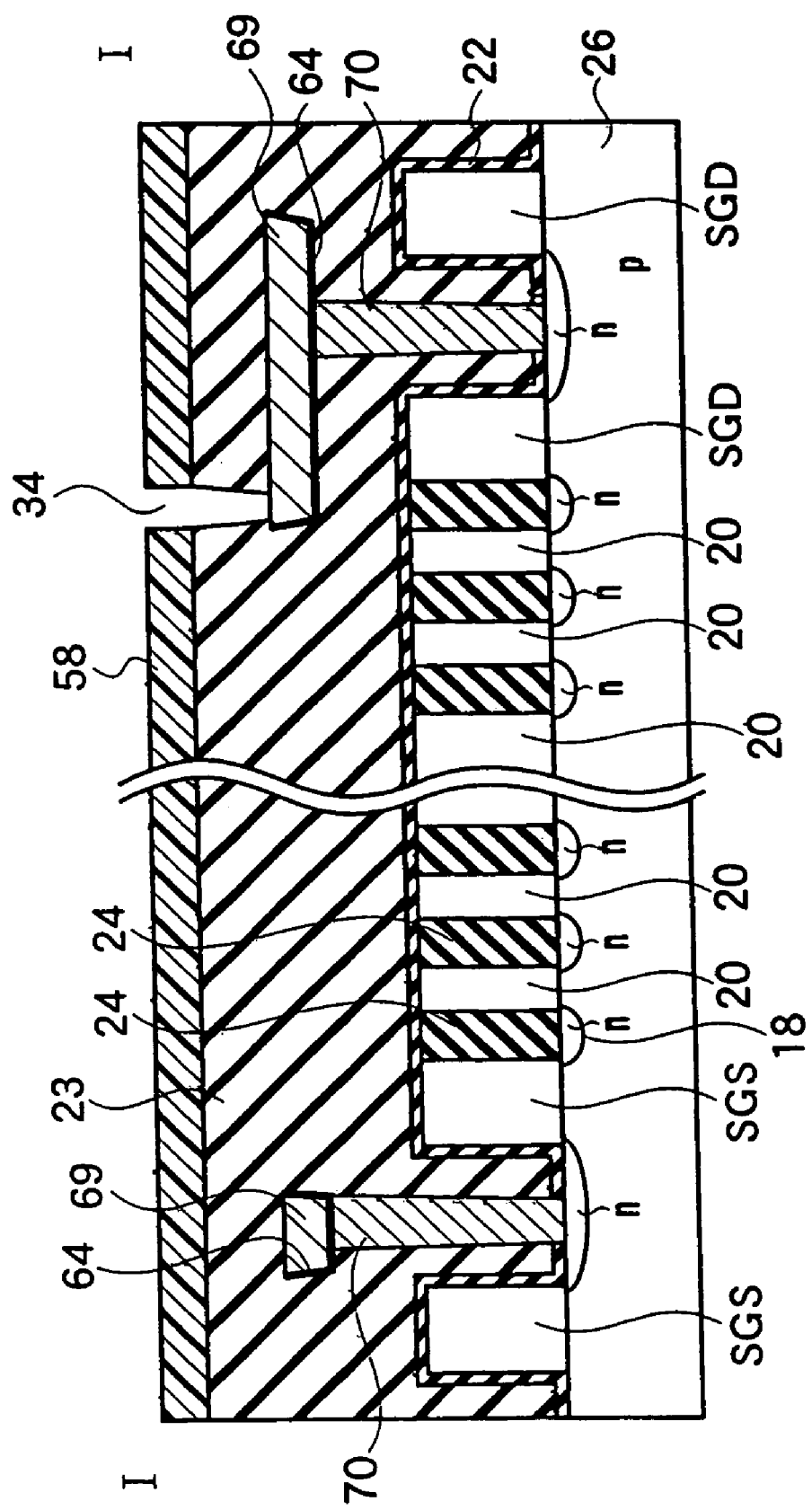
FIG. 56 is a schematic cross-sectional diagram cut along the line I-I of FIG. 55.
Figure 57:
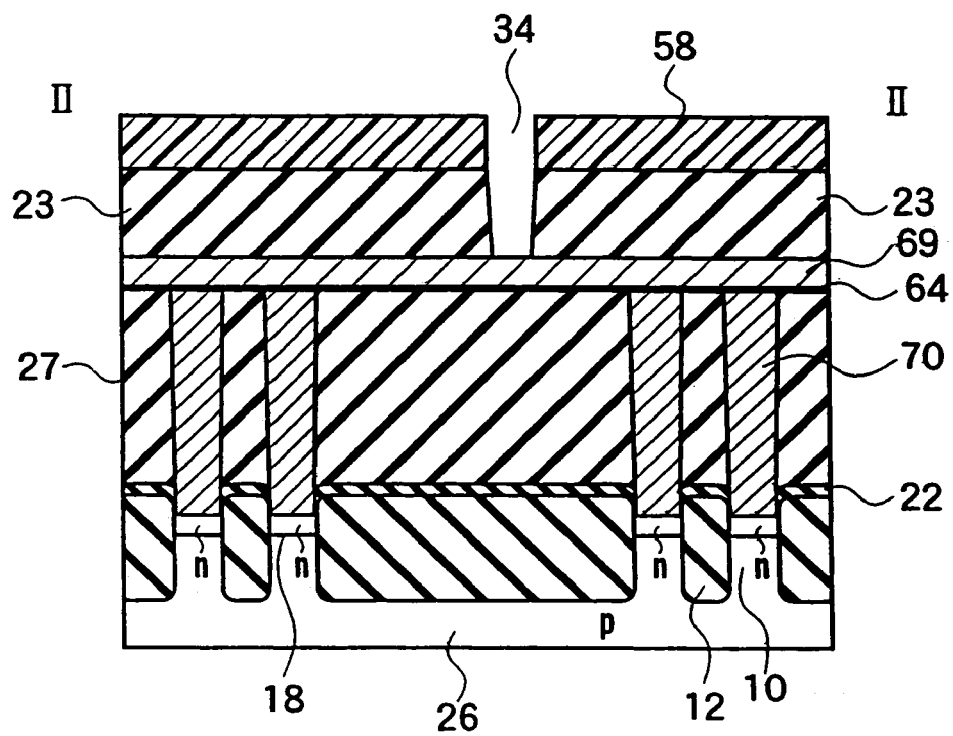
FIG. 57 is a schematic cross-sectional diagram cut along the line II-II of FIG. 55.
Figure 58:
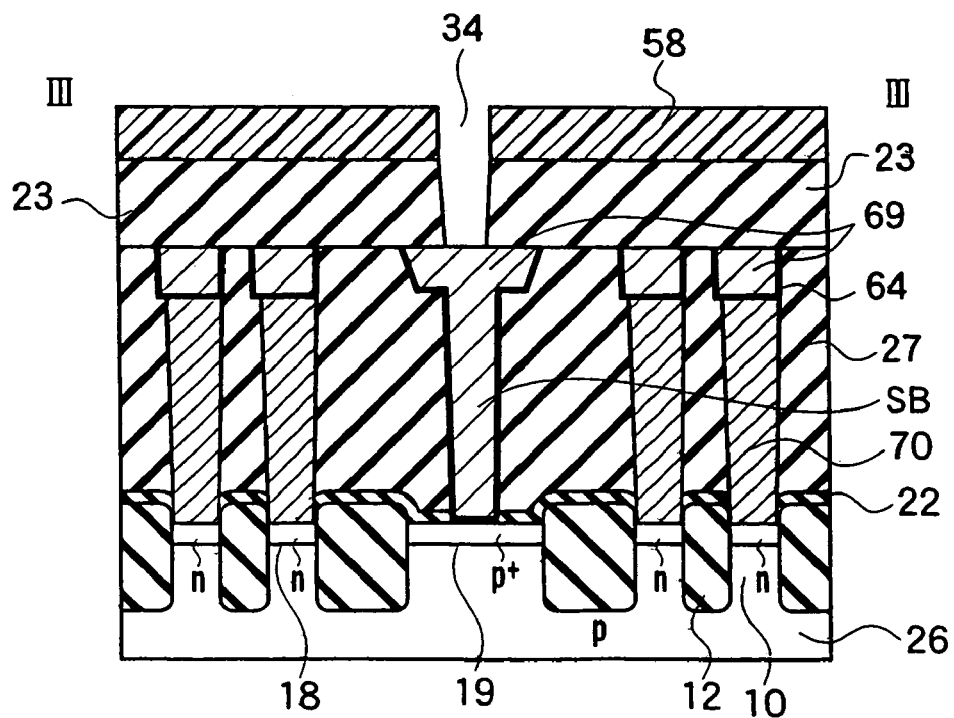
FIG. 58 is a schematic cross-sectional diagram cut along the line III-III of FIG. 55.
Figure 59:
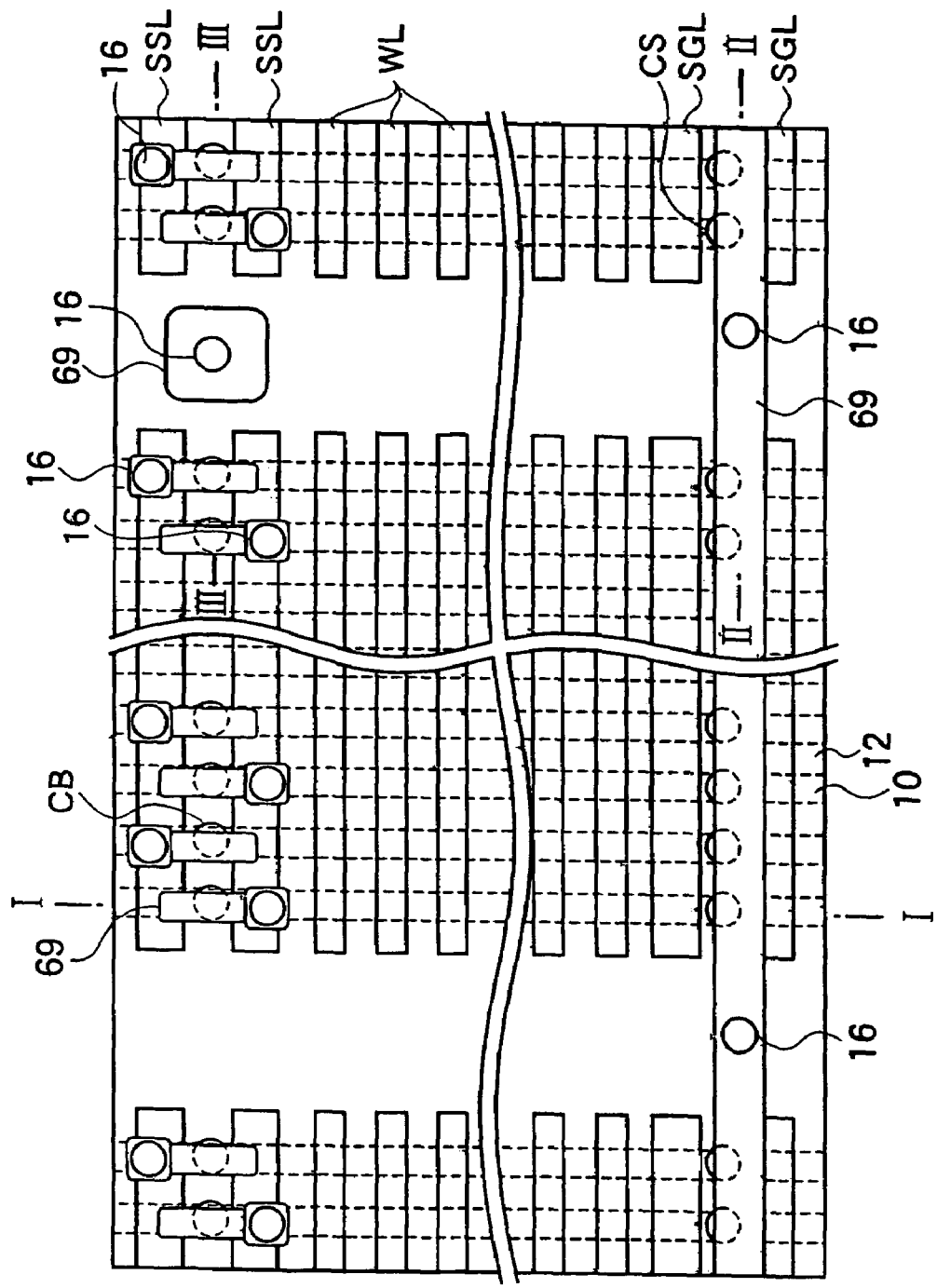
FIG. 59 is a detailed aerial pattern diagram of the memory cell array region for describing a step of the fabrication method for the nonvolatile semiconductor memory according to the first embodiment of the present invention.
Figure 60:
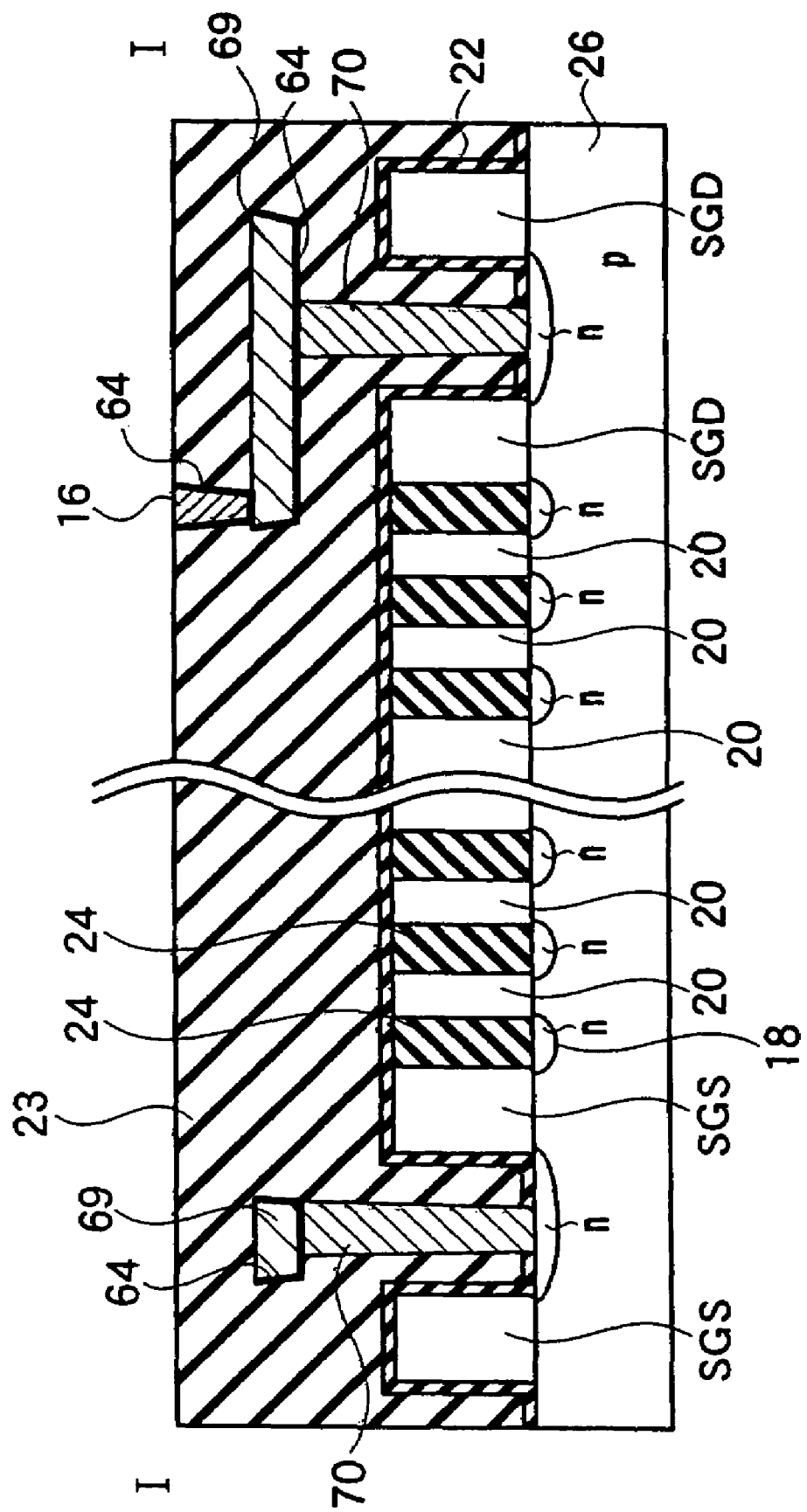
FIG. 60 is a schematic cross-sectional diagram cut along the line I-I of FIG. 59.
Figure 61:
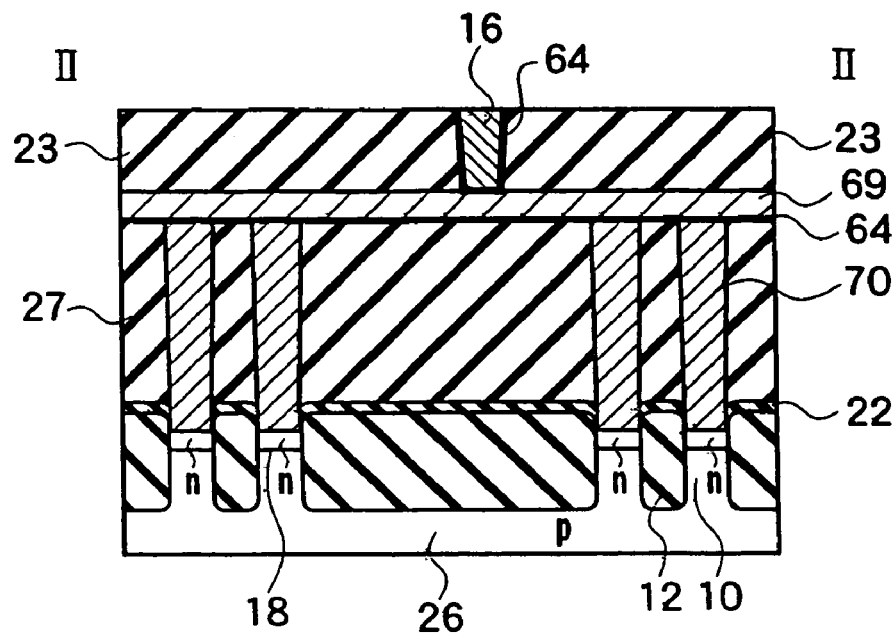
FIG. 61 is a schematic cross-sectional diagram cut along the line II-II of FIG. 59.
Figure 62:
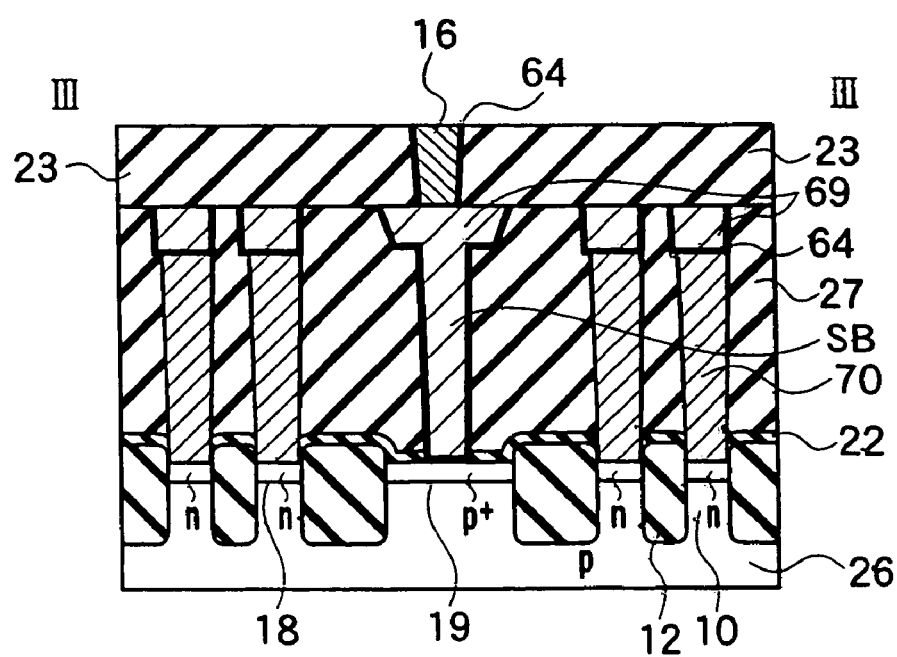
FIG. 62 is a schematic cross-sectional diagram cut along the line III-III of FIG. 59.
Figure 63:
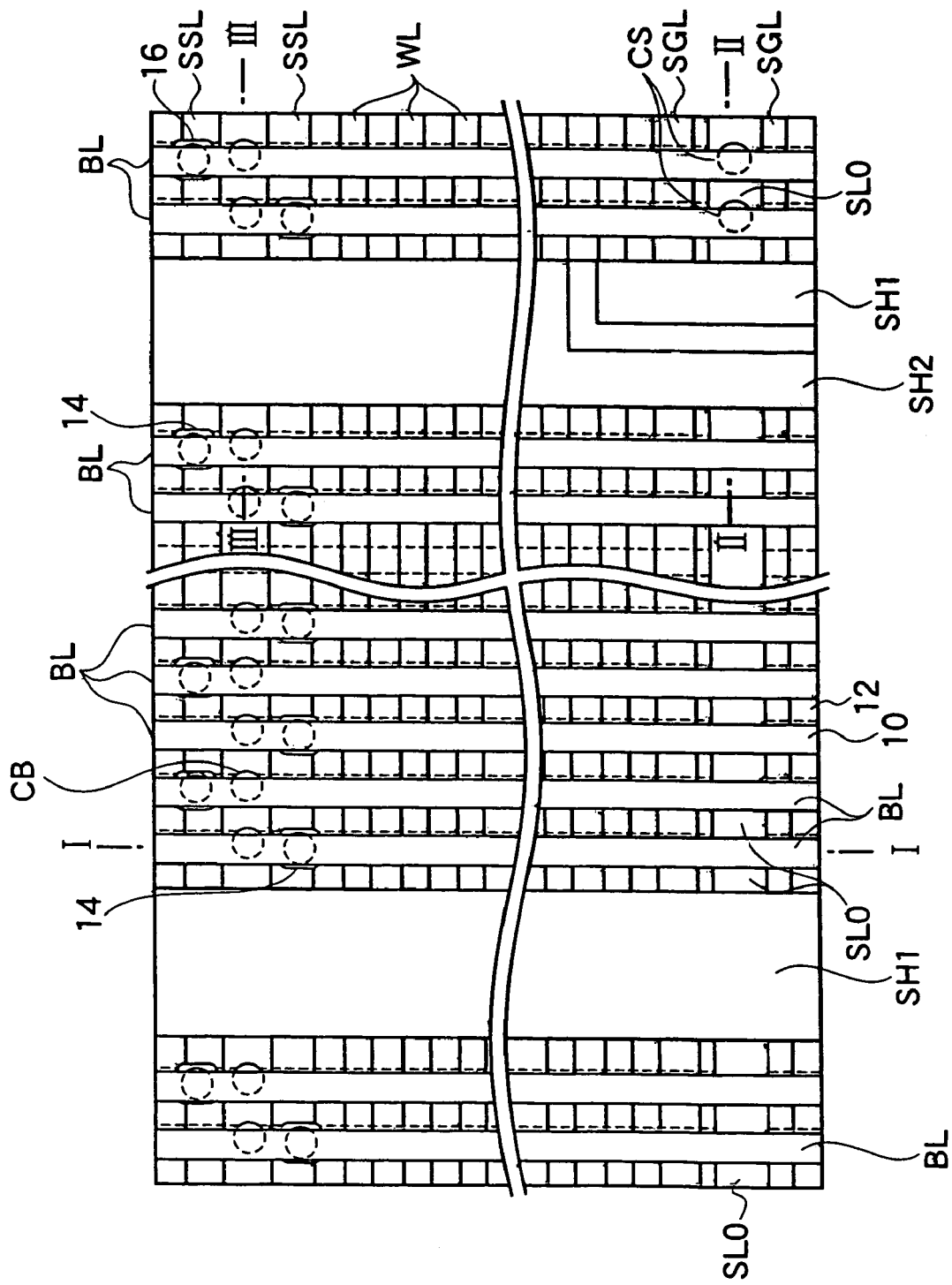
FIG. 63 is a detailed aerial pattern diagram of the memory cell array region for describing a step of the fabrication method for the nonvolatile semiconductor memory according to the first embodiment of the present invention.
Figure 64:
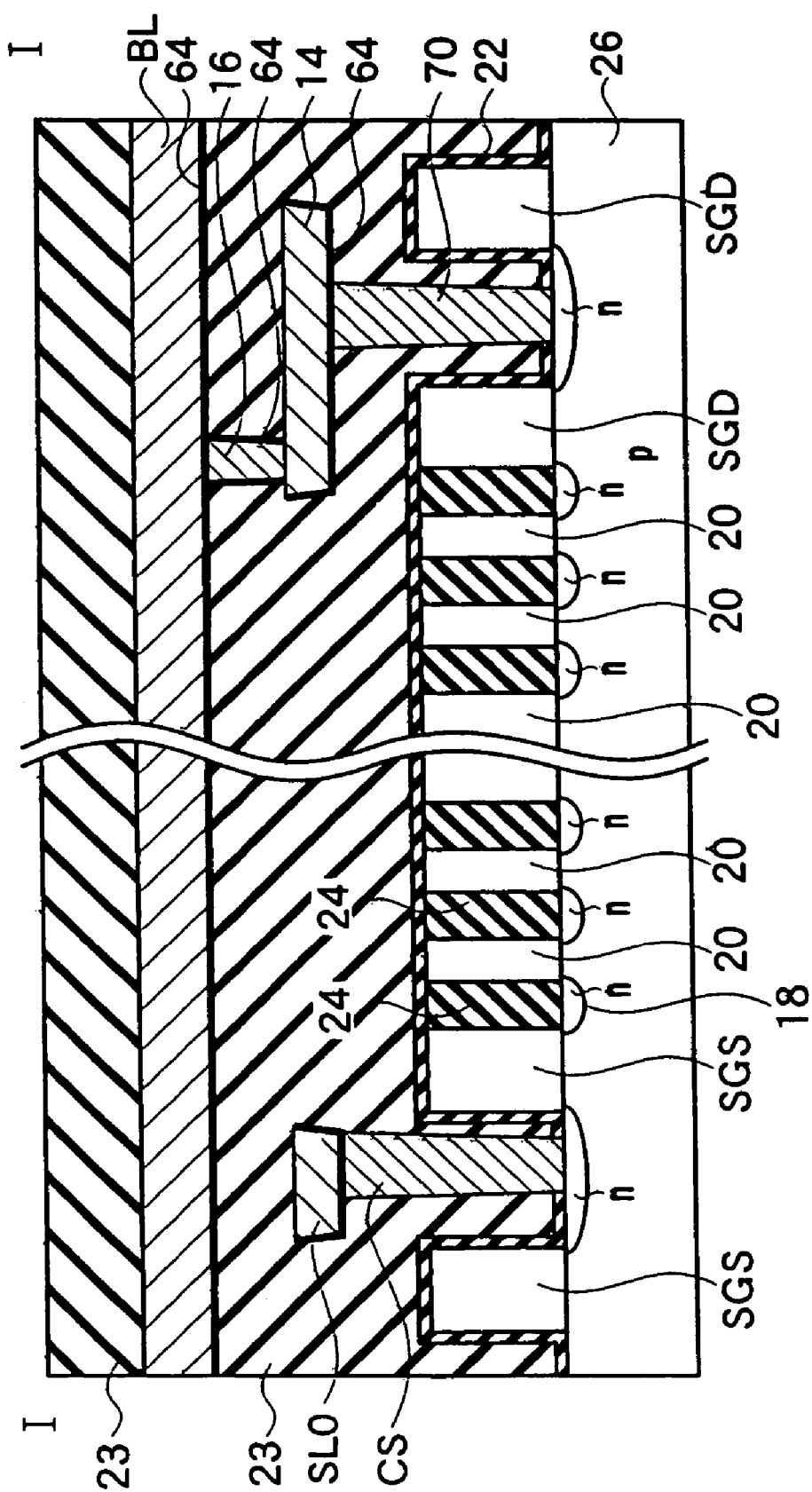
FIG. 64 is a schematic cross-sectional diagram cut along the line I-I of FIG. 63.
Figure 65:
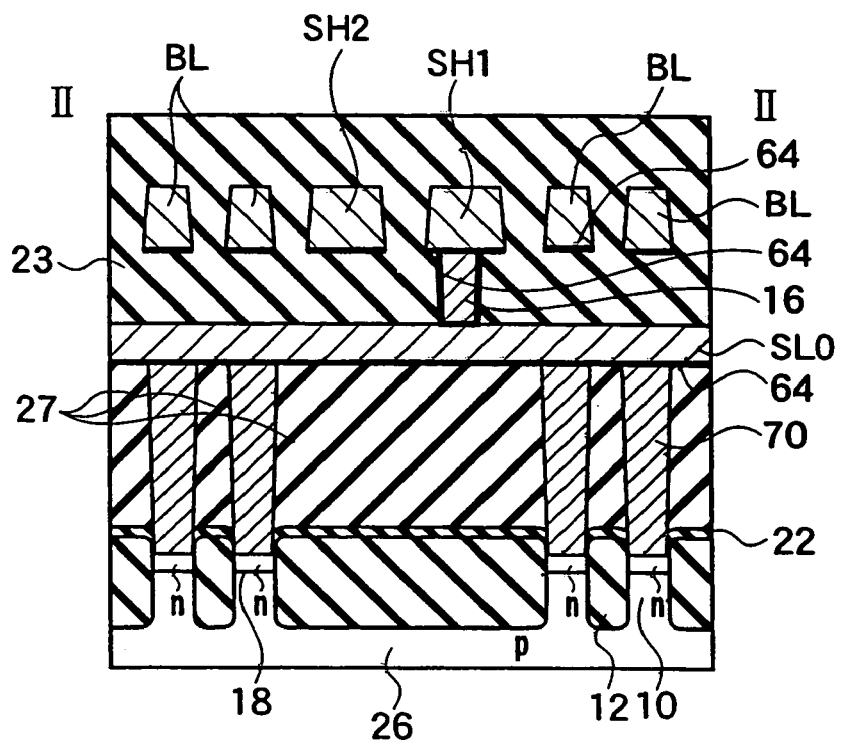
FIG. 65 is a schematic cross-sectional diagram cut along the line II-II of FIG. 63.
Figure 66:
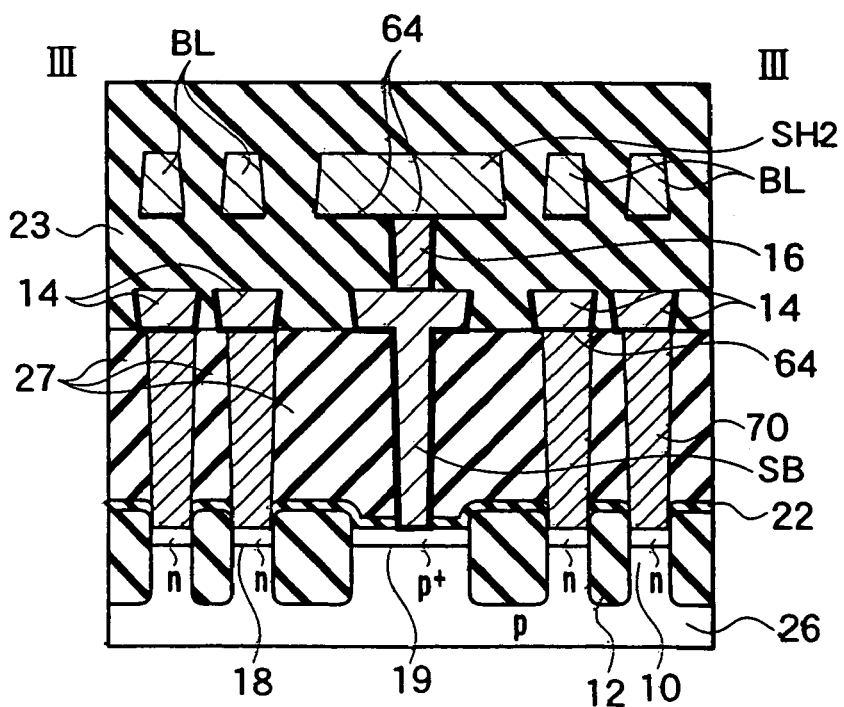
FIG. 66 is a schematic cross-sectional diagram cut along the line III-III of FIG. 63.
Figure 67:
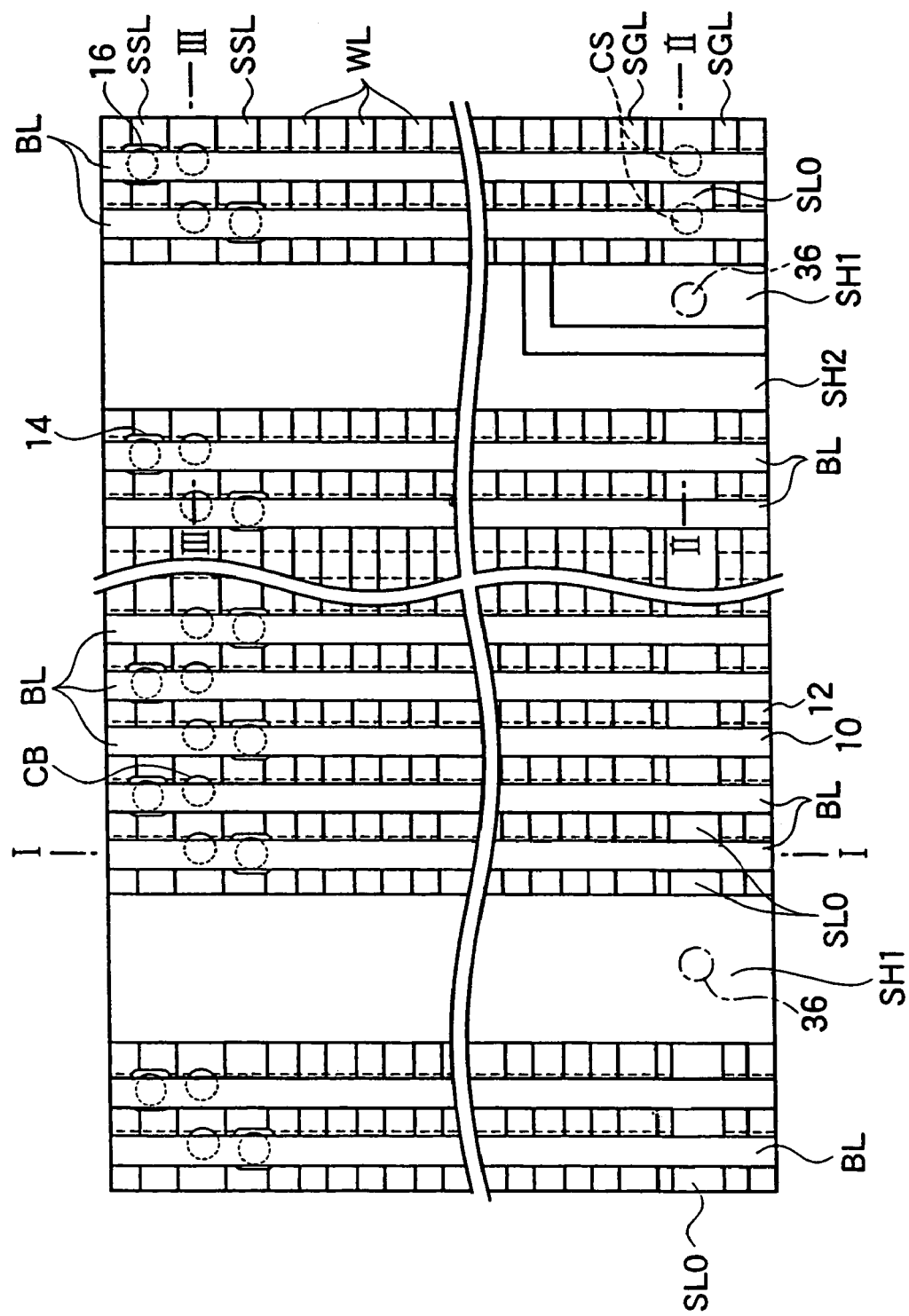
FIG. 67 is a detailed aerial pattern diagram of the memory cell array region for describing a step of the fabrication method for the nonvolatile semiconductor memory according to the first embodiment of the present invention.
Figure 68:
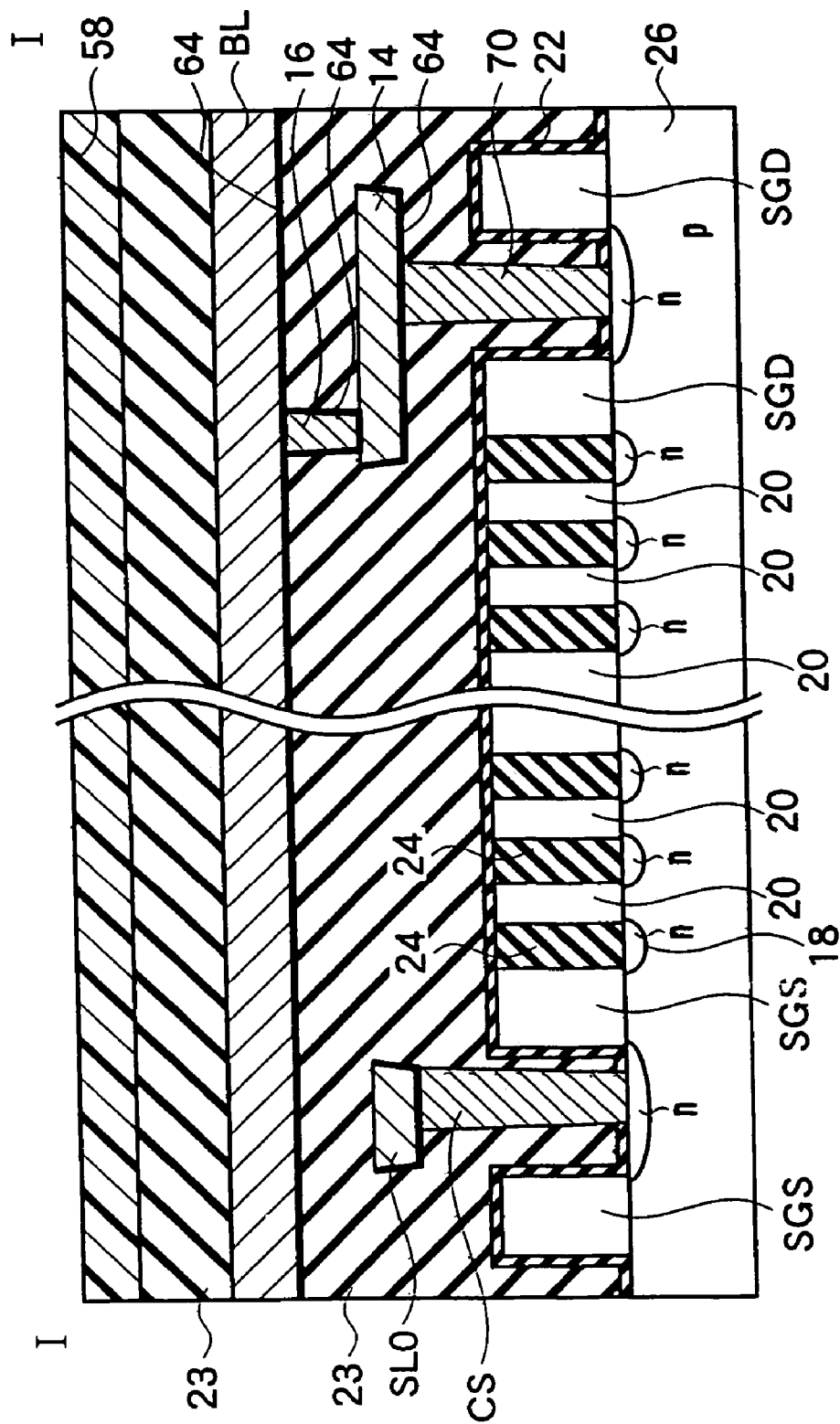
FIG. 68 is a schematic cross-sectional diagram cut along the line I-I of FIG. 67.
Figure 69:
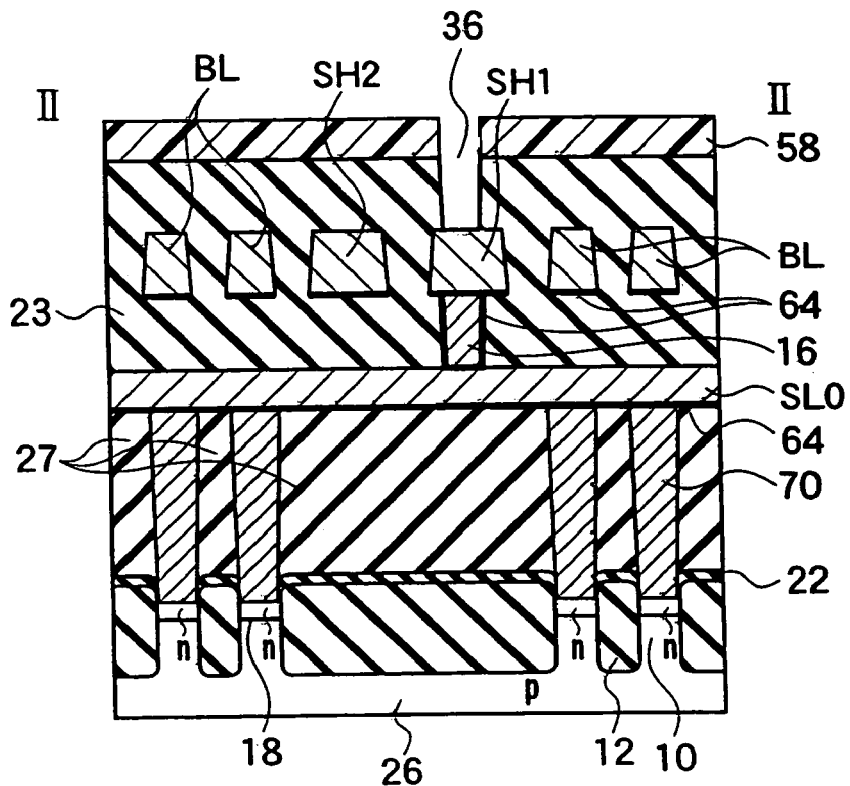
FIG. 69 is a schematic cross-sectional diagram cut along the line II-II of FIG. 67.
Figure 70:
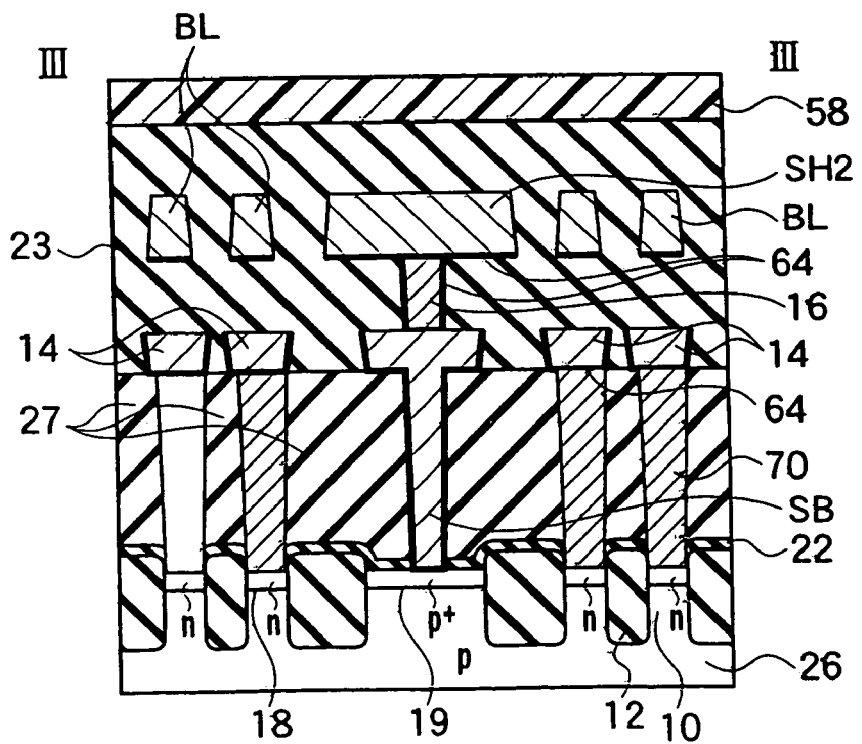
FIG. 70 is a schematic cross-sectional diagram cut along the line III-III of FIG. 67.
Figure 71:
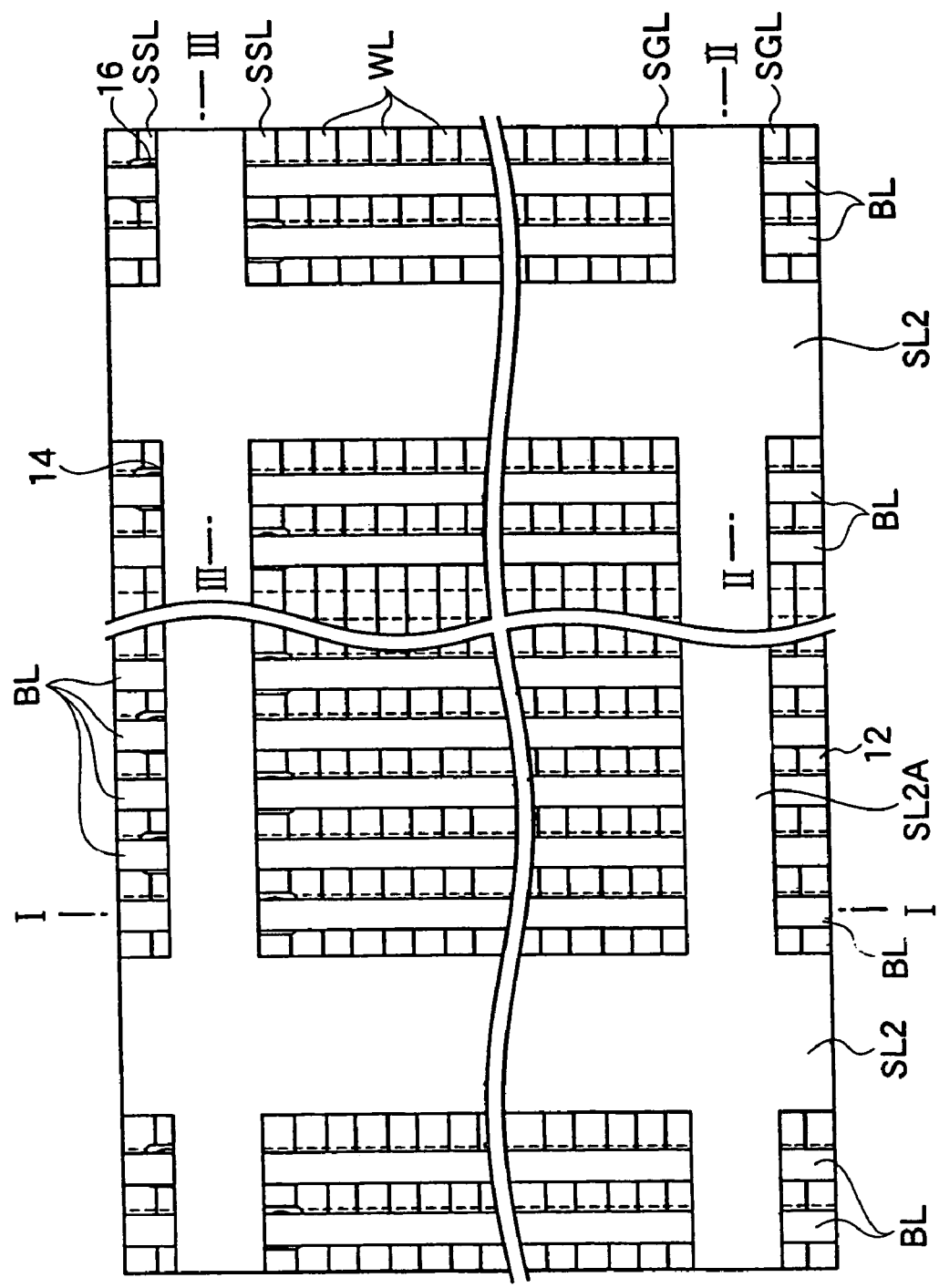
FIG. 71 is a detailed aerial pattern diagram of the memory cell array region for describing a step of the fabrication method for the nonvolatile semiconductor memory according to the first embodiment of the present invention.
Figure 72:
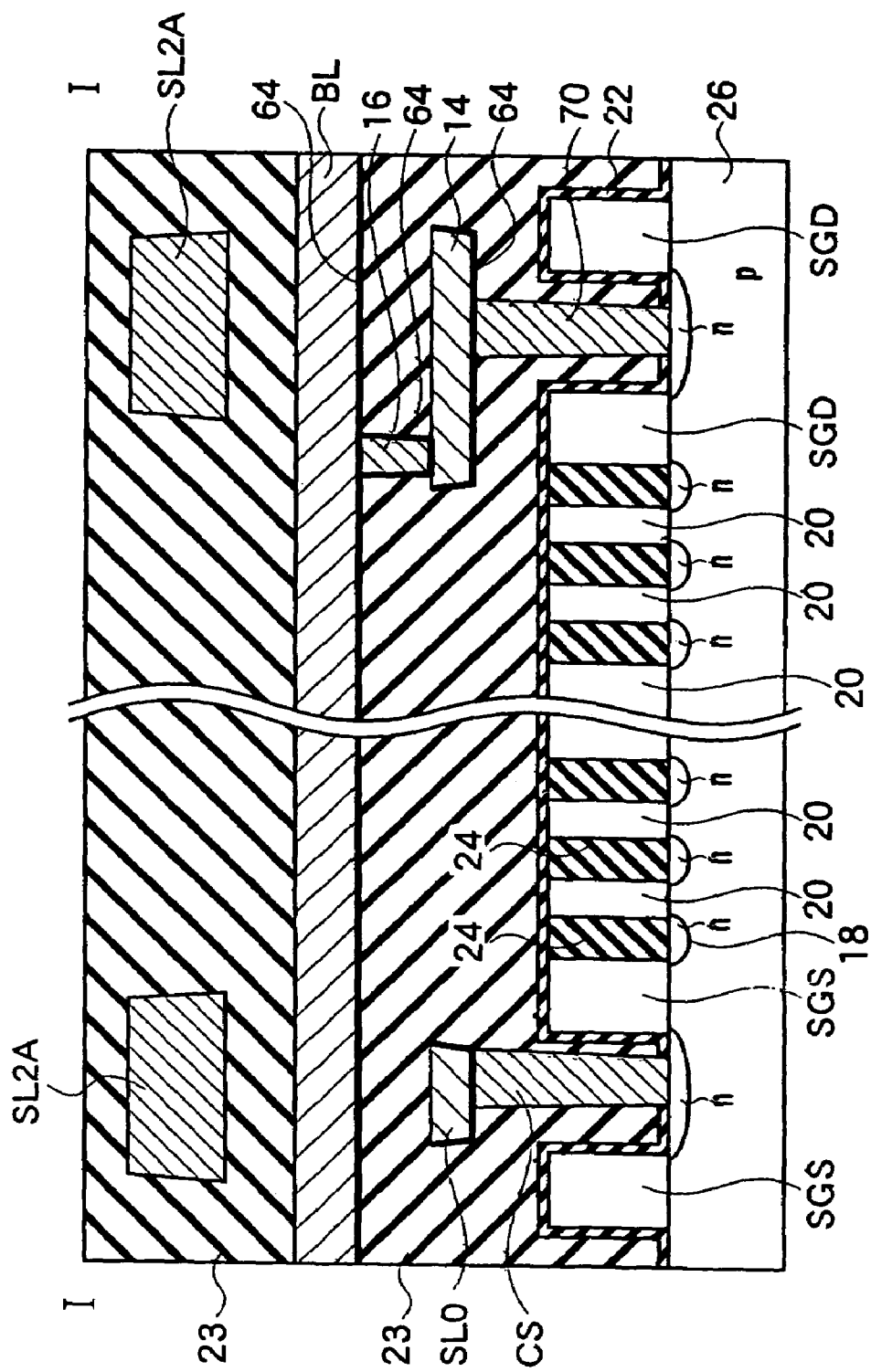
FIG. 72 is a schematic cross-sectional diagram cut along the line I-I of FIG. 71.
Figure 73:
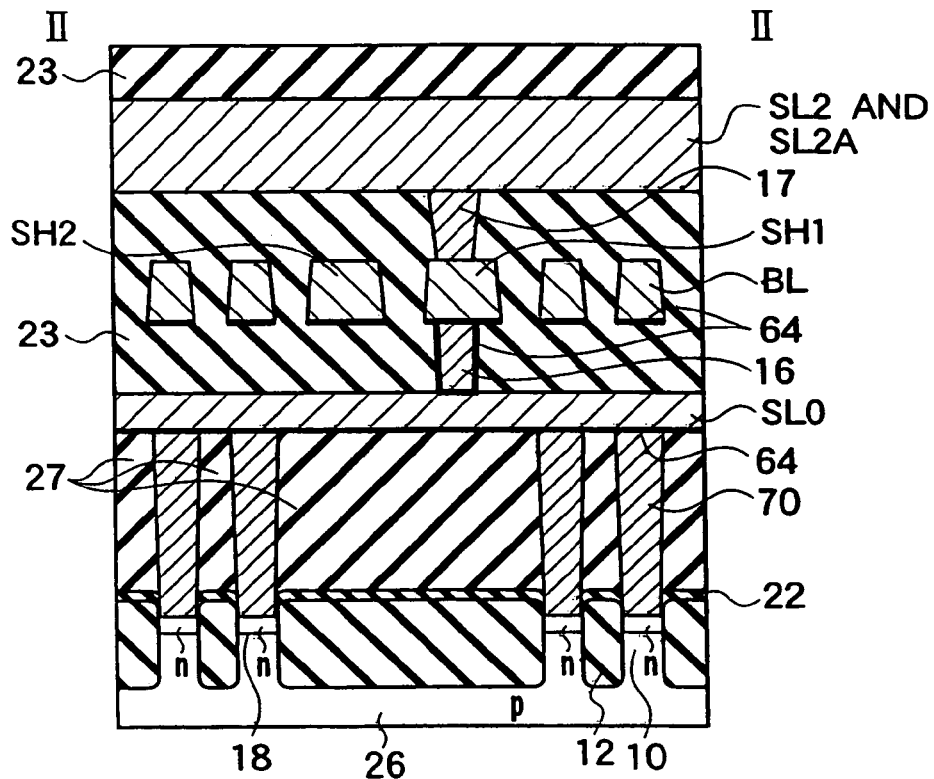
FIG. 73 is a schematic cross-sectional diagram cut along the line II-II of FIG. 71.
Figure 74:
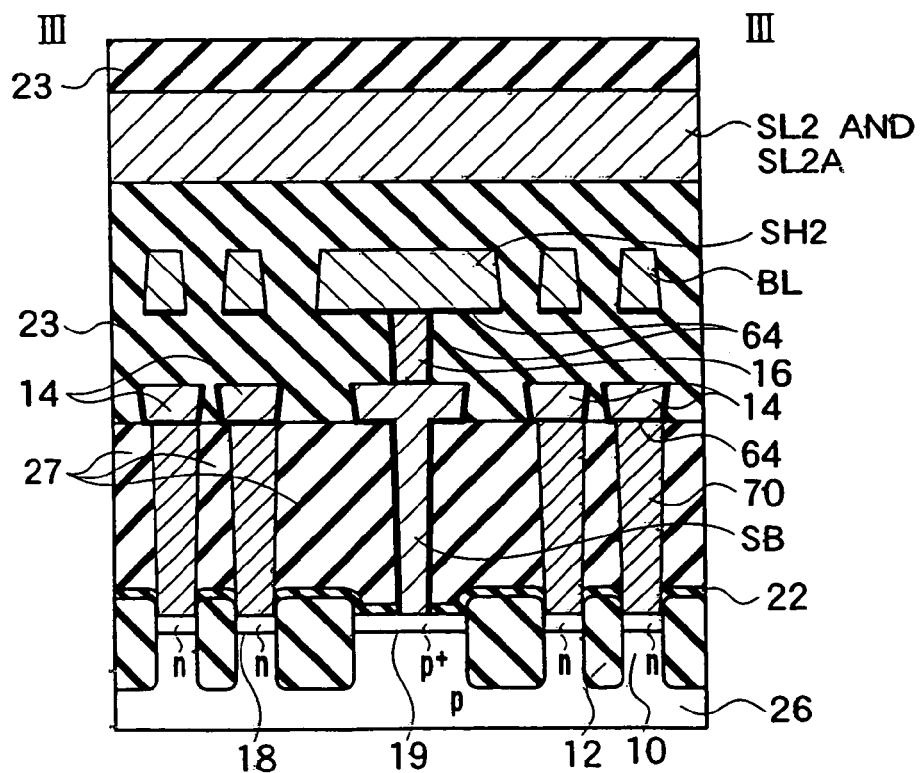
FIG. 74 is a schematic cross-sectional diagram cut along the line III-III of FIG. 71.

An exemplary fabrication method for the nonvolatile semiconductor memory according to the first embodiment of the present invention is described while referencing FIGS. 23 through 74.

To begin with, a device isolating region 12 made of a silicon insulator film or a silicon nitride film is formed with a depth of, for example, 0.1 to 0.4 „m on a first conductive semiconductor substrate or the well region 26 having a depth of 0.3 to 2 „m. The depth of the device isolating region 12 allows isolation of the adjacent second conductive device regions 10 via that device isolating region 12. In the drawings, while the first conductive semiconductor region is a p-type, and the second conductive region is an n-type, the first conductive region may alternatively bean n-type, and the second conductive region may be a p-type. With such a configuration, the device isolating regions 12 are formed with the same pitch as the data transfer line contacts CB to be formed later along the line I-I, and impurities with inverse conductivity to the semiconductor substrate 26 are doped into the semiconductor surface to be a depth of, for example, 0.05 to 0.3 „m. This allows connection of the diffused layers (n-type regions) 18 on the semiconductor surface, which are isolated by the device isolating regions 12, to respective interconnects, and electrical isolation of multiple n-type regions 18 on the semiconductor surface. In addition, such a contact aperture formation process is a problem in a design rule of 0.13 „m or less with which a KrF or an ArF exposure device makes a pattern using a phase shift mask; therefore, it is desirable that the pitch of the contacts is 0.13 „m×2F=0.26 „m or less. A conductive film such as phosphorus (P) or the like highly-doped polycrystalline silicon or a metal such as tungsten silicide is deposited to a thickness of 500 to 1000 nm, patterning for the data transfer lines BL is carried out by lithography processing, and the resulting surface is then subjected to anisotropic etching.

Next, a barrier insulator film 22, such as a silicon nitride film, a silicon oxide film, or an alumina film, is deposited to a thickness of 10 to 1000 nm. In this case, excessive etching due to lack of etching control when forming the source line contacts CS and the data transfer line contacts CB causes the source line contacts CS and the data transfer line contacts CB to invade the device isolating region 12 and develops a problem that the amount of the value of breakdown voltage between the p-well region 26 and the source line contacts CS and between the p-well region 26 and the data transfer line contacts CB cannot be provided. On the other hand, insufficient etching when forming the source line contacts CS and the data transfer line contacts CB develops a problem of an increase in the contact resistance between the n-type regions 18 and the data transfer line contacts CB. Therefore, when forming those data transfer line contacts, etching with sufficient selectivity, such as the etching speed for the barrier insulator film 22 being slower than that for the interlayer insulator film 23, and then etching the barrier insulator film 22 decreases the influence of changes in the film thickness of the interlayer insulator film 23 when etching the contacts. Alternatively, a silicon insulator film with a thickness of 1 to 50 nm may be formed on the semiconductor substrate 26 surface through oxidation or deposition before deposition of the barrier insulator film 22. Furthermore, on the resulting surface, an interlayer insulator film 23 made of a silicon insulator film, a silicon nitride film, silicade glass such as BPSG or PSG, or an interlayer film such as HSQ, MSQ, or SiLK, is then deposited to a thickness of approximately 10 to 1000 nm (FIGS. 23 through 26). The material of the barrier insulator film 22 needs to have a sufficient etch selectivity relative to the interlayer insulator films 23. The thickness of the barrier insulator film 22 needs to be approximately 10 to 1000 nm; so that this thickness, the etch selectivity, and the thickness of the interlayer insulator film 23 provide a sufficient fabrication margin to obtain an amount of the etching selectivity.

Next, patterning for the data transfer line contacts CB and the source line contacts CS is carried out using lithography, and patterning for the interlayer insulator films 23 is carried out using anisotropic etching (FIGS. 27 through 30). The etching condition needs to be a sufficient selectivity relative to a resist 58 and the barrier insulator film 22 in order to provide an amount of the fabrication margin.

Next, the barrier insulator film 22 is subjected to anisotropic etching after removal of the resist 58 (FIGS. 31 through 34). In this case, it is desirable that the etching condition be a sufficient selectivity relative to the semiconductor substrate 26 and the interlayer insulator film 23, so as to permit omission of wet-processing for peeling off the barrier insulator film 22 to be carried out as post processing, prevents excessive etching relative to the first interlayer insulator film 23, and maintains a forward tapered-shape and a small contact diameter.

After patterning, the source line contacts CS and the data transfer line contacts CB are filled with phosphorus or arsenic highly-doped polycrystalline silicon (second contact filling material 70, different material than the interconnect layers), and anisotropic etching or isotropic etching such as chemical dry etching (CDE) is used for etching back the phosphorus or arsenic highly-doped polycrystalline silicon (second contact filling material 70) (FIGS. 35 through 38). If the aspect ratios of each source line contact CS and each data transfer line contact CB increase, the coverage of the barrier metal 64 and the filling metallic material (second contact filling material 70) tends to be insufficient, and as a result, deposition error of the filling metallic material may occur, and/or leakage current between the semiconductor substrate 26 (or underlayer interconnect) and the contacts increases.

In the nonvolatile semiconductor memory according to the first embodiment of the present invention, since the source line contacts and the data transfer line contacts CB are filled with a semiconductor material such as polycrystalline silicon, the barrier metal is unnecessary in the high-aspect data transfer line contact CB portions. This prevents increase in leakage current due to an insufficient coverage of the barrier metal. In addition, since the lower portions of the data transfer line contacts CB are pre-filled, the actual aspect ratio, which influences the capability of filling in the interconnect layer and the upper regions of the data transfer line contacts CB, is low, and filling characteristics of the barrier metal or related metals are improved. In addition, since a semiconductor material such as polycrystalline silicon is filled in the data transfer line contacts CB, the data transfer line contacts CB with an extremely shallow junction depth can be formed without ion implantation of an n-type impurity in the lower portions of the data transfer line contacts CB. This allows improvement in the punch-through breakdown voltage between the n-type diffused layers 18 in which the data transfer line contacts CB are formed. Furthermore, if polycrystalline silicon, SiGe, amorphous silicon, or SiGe is used as the second contact filling material 70, the Si or the SiGe can be filled using the CVD method, resulting in provision of better coverage than the case of filling metal. This allows even a high aspect ratio structure to be stably filled. In addition, if impurity-doped polycrystalline silicon or SiGe is used as the second contact filling material 70, stable contact resistance can be obtained by diffusing impurities to the semiconductor substrate 26 without ion-implantation for re-diffusion. Furthermore, since the barrier metal is unnecessary for filling in the lower portions of the contacts, stable contact resistance with the n-type region can be obtained even with miniaturized contacts.

Next, patterning for the substrate contacts SB is carried out using lithography, and patterning for the interlayer insulator films 23 is carried out using anisotropic etching, forming openings 36 for the substrate contacts SB (FIGS. 39 through 42). At this time, since it is important to fill and protect the interior of the previously formed data transfer line contacts CB and the source line contacts CS with the resist. The etching condition needs to be a sufficient selectivity relative to a resist 58 and the barrier insulator film 22 in order to provide an amount of the fabrication margin.

Next, the barrier insulator film 22 is subjected to anisotropic etching after removal of the resist 58 (FIGS. 43 through 46). In this case, it is desirable that the etching condition be a sufficient selectivity relative to the semiconductor substrate 26, the interlayer insulator film 23, and pre-filled second filling material 70, which allows omission of wet-processing for peeling off the barrier insulator film 22 to be carried out as post processing, prevents excessive etching relative to the interlayer insulator film 23, and maintains a forward tapered-shape and a small contact diameter.

Thereafter, the resistivity of the n-type regions in the contact portions may be decreased by ion-implantation of impurities such as phosphorus or arsenic having a dosage of, for example, between $1\times10^{13}$ cm$^{-2}$ and $1\times10^{16}$ ions/cm$^2$.

Next, patterning for the source lines SL0 and the data transfer line extended regions 14 is carried out using lithography, and patterning for the interlayer insulator films 23 is carried out using anisotropic etching (FIGS. 47 through 50).

Trenches to be filled with the source lines SL0 and the data transfer line extended regions 14 are etched and formed; and the resist 58 is then removed. Afterwards, a barrier metal 64 such as Ti, Ta, TaN, or TiN is deposited to a thickness of 1 to 100 nm in the contacts and interconnect layers using sputtering or chemical vapor deposition (CVD) techniques; and an interconnect metallic material 69 such as tungsten, aluminum, or copper is then deposited to a thickness of 10 to 1000 nm, filling in the contacts and the interconnect layers. Note that in the steps shown in FIGS. 23 through 50, after formation of the interconnect trench for the source lines SL0 or the data transfer line extended regions 14, formation of the opening for the contacts in the data transfer line BL and formation of the opening for the contacts in the source line SL may be carried out in any order. However, when the contact diameter is small, patterning on the uneven foundation with high resolution lithography is difficult; therefore, use of a method by which the data transfer line contacts CB are opened first is desirable, and more desirably, the contacts are opened in the order described in the first embodiment of the present invention. Chemical mechanical polishing (CMP) is then used to planarize the deposited interconnect metallic material 69 (FIGS. 51 through 54). As for the barrier metal 64, the CVD technique is further desirable because uniform deposition in the contact hole with a higher aspect ratio is possible.

Subsequently, an interlayer insulator film 23 made of a silicon insulator film, silicade glass such as BPSG or PSG, or an interlayer film such as HSQ, MSQ, or SiLK is deposited to a depth of approximately 10 to 1000 nm.

Next, patterning for the first via contacts 16 is carried out using lithography, and patterning for the interlayer insulator films 23 is carried out using anisotropic etching (FIGS. 55 through 58). The etching condition needs to be a sufficient selectivity relative to the resist 58 and the interconnect metallic material 69, which is filled in the underlayer contacts, or the barrier metal 64 in order to provide an amount of the fabrication margin.

Next, the barrier metal 64 such as Ti, Ta, TaN, or TiN is deposited to a thickness of 1 to 100 nm in the first via contacts 16 using sputtering or the CVD technique after removal of the resist 58, and a metallic material such as W, Al, or Cu is then deposited to a thickness of 10 to 1000 nm, filling in the via contacts 16. Afterwards, chemical mechanical polishing (CMP) is used to etch back and planarize the entire surface of the device (FIGS. 59 through 62).

Subsequently, Al or AlCu is deposited to a thickness of approximately 10 to 1000 nm.

In addition, Al or AlCu is processed into a strip shape along the line. I-I through anisotropic etching, forming the data transfer lines BL and the source shunt lines SH1.

Subsequently, on the resulting surface, an interlayer insulator film 23 made of a silicon insulator film, a silicon nitride film, silicade glass such as BPSG or PSG, or an interlayer film such as HSQ, MSQ, or SiLK is then deposited to a thickness of approximately 10 to 1000 nm (FIGS. 63 through 66).

Next, patterning for the second via contacts 17 is carried out using lithography, and patterning for the interlayer insulator films 23 is carried out using anisotropic etching (FIGS. 67 through 70). The etching condition needs to be a sufficient selectivity relative to the resist 58 and the metallic material, which is filled in the underlayer contacts, or the barrier metal 64 in order to provide an amount of the fabrication margin.

Next, the barrier metal 64 such as Ti, Ta, TaN, or TiN is deposited to a thickness of 1 to 100 nm in the second via contacts 17 and on the interlayer insulator films 23 using sputtering or the CVD technique after removal of the resist 58, and a metallic material such as W, Al, or Cu is then deposited to a thickness of 10 to 100 nm, filling in the second via contacts 17 as well as to be the source line SL2 interconnect material (FIGS. 71 through 74). As described in the fabrication method for the first via contacts 16 and the data transfer lines BL, the barrier metal 64 such as Ti, Ta, TaN, or TiN is deposited to a thickness of 1 to 100 nm in the contacts using sputtering or the CVD technique, and a metallic material such as W, Al, or Cu is then deposited to a thickness of 10 to 1000 nm, filling in the second via contacts 17 and etching back the entire surface of the device using CMP, and Al or AlCu is deposited to a thickness of 10 to 1000 nm. Alternatively, in the first embodiment of the present invention, simultaneous deposition or the second via contacts 17 and the second source line SL conductive material allows simplification of process steps.

Finally, the shape of the nonvolatile semiconductor memory according to the first embodiment of the present invention can be achieved by processing the deposited Al or AlCu with a thickness of approximately 10 to 1000 nm using lithography and anisotropic etching (FIGS. 71 through 74).

While detailed description is omitted in the following, a passivation film such as a silicon nitride film or polyimede formed to a thickness of approximately 0.05 to 2.0 „m on the source lines SL2 using a plasma deposition technique reduces influences from external stresses such as the exposure to alpha particle rays, ultra violet rays, or the outer atmosphere. A silicon nitride film may be formed using hexachlorodisilane (HCD).

With the nonvolatile semiconductor memory according to the first embodiment of the present invention, when carrying out patterning for the source lines SL2, the source lines SL2 between the cell arrays extending along the line I-I with an additional line for those source lines SL2, which has a thickness of approximately 1 „m and extends along the line III-III, are directly connected, reducing the interconnect resistance of the source lines SL2 to be less than that of the related art example. In addition, since the additional line, which has connected the source lines SL2 to each other, is disposed on the bit line side select gate transistor SGD and the source line side select gate transistor SGS, it never covers the memory cell array region 1. Therefore, when hydrogen diffuses from the upper layer region, since the distribution of hydrogen that reaches the cells is uniform, an abnormal distribution of cell reliability may be controlled.

(Modified Example of the First Embodiment)

FIGS. 19 through 22 schematically show aerial pattern diagrams of planes of memory cell array regions in nonvolatile semiconductor memories, according to the first through the fourth modified example of the first embodiment of the present invention, respectively.

Figure 19:
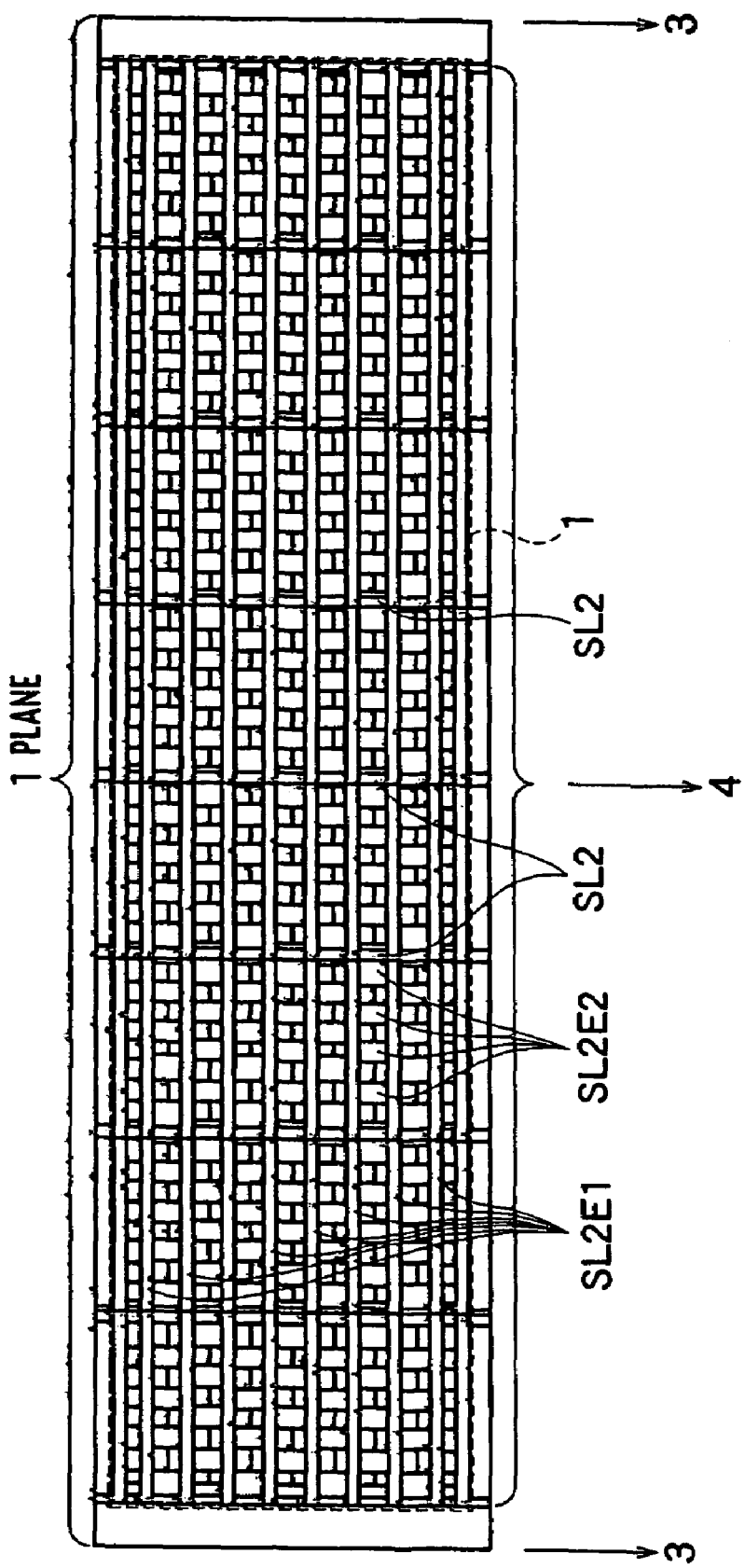
FIG. 19 is an aerial pattern diagram for describing a detailed source line pattern on a memory cell array region of a nonvolatile semiconductor memory according to a first modified example of the first embodiment of the present invention.
Figure 20:
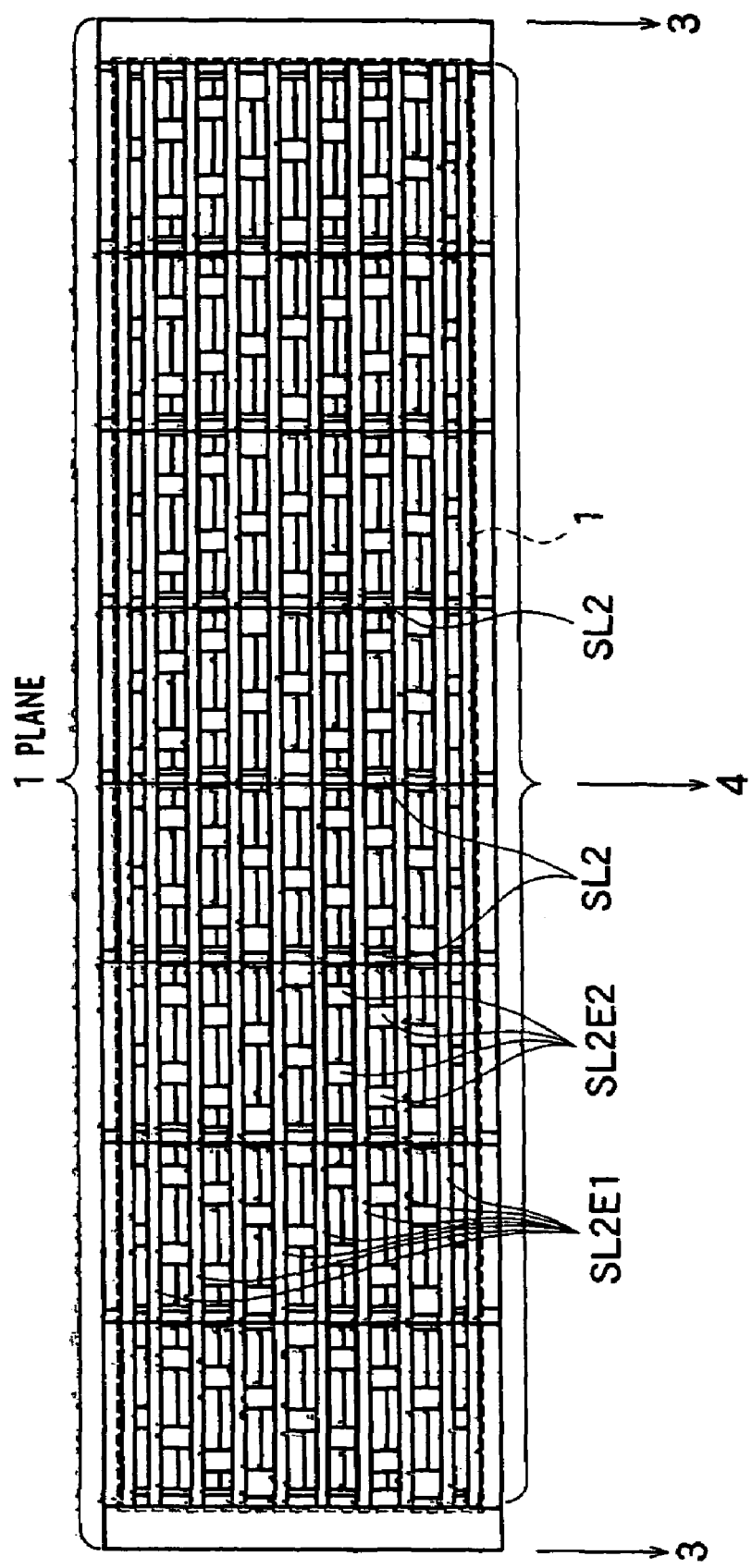
FIG. 20 is an aerial pattern diagram for describing a detailed source line pattern on a memory cell array region of a nonvolatile semiconductor memory according to a second modified example of the first embodiment of the present invention.
Figure 21:
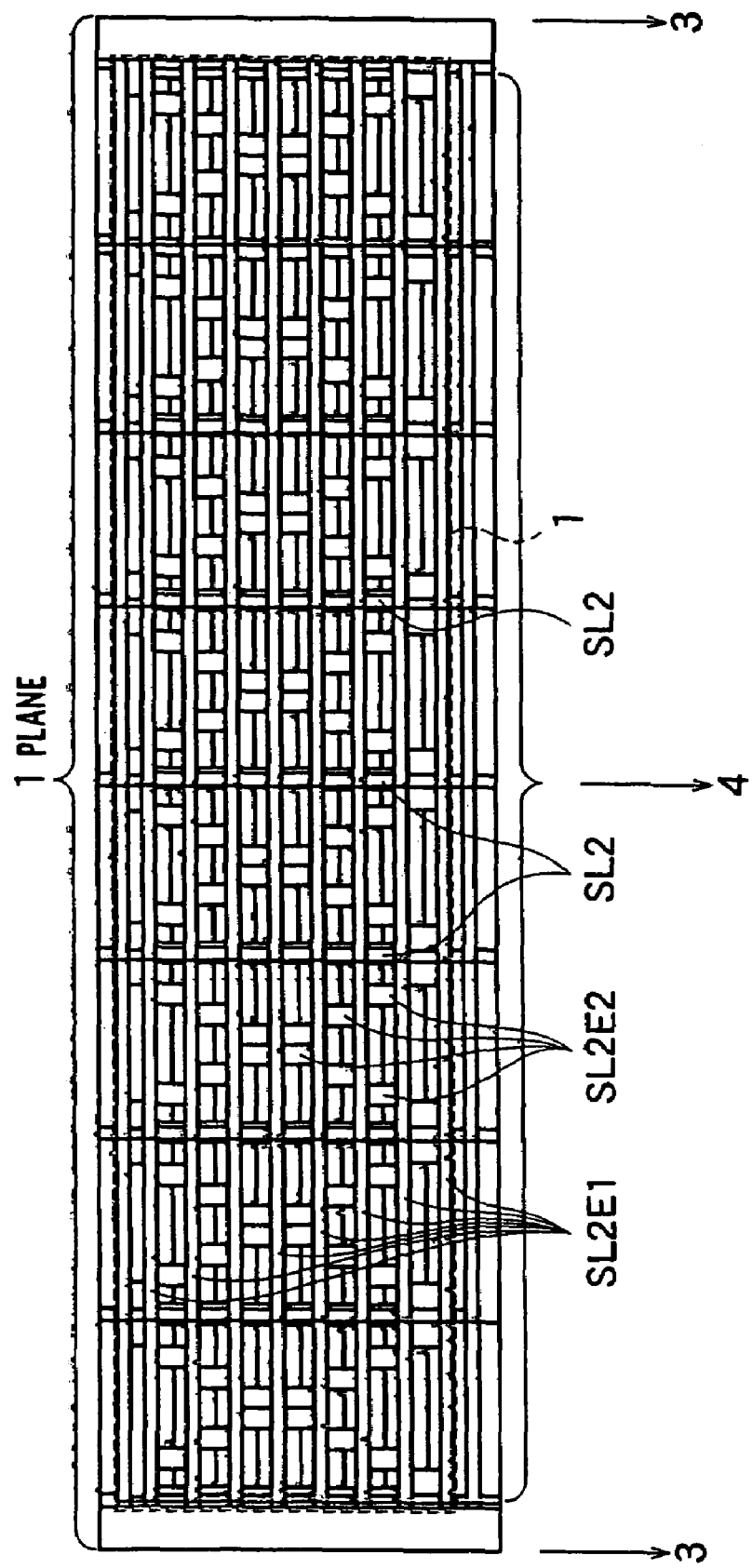
FIG. 21 is an aerial pattern diagram for describing a detailed source line pattern on a memory cell array region of a nonvolatile semiconductor memory according to a third modified example of the first embodiment of the present invention.
Figure 22:
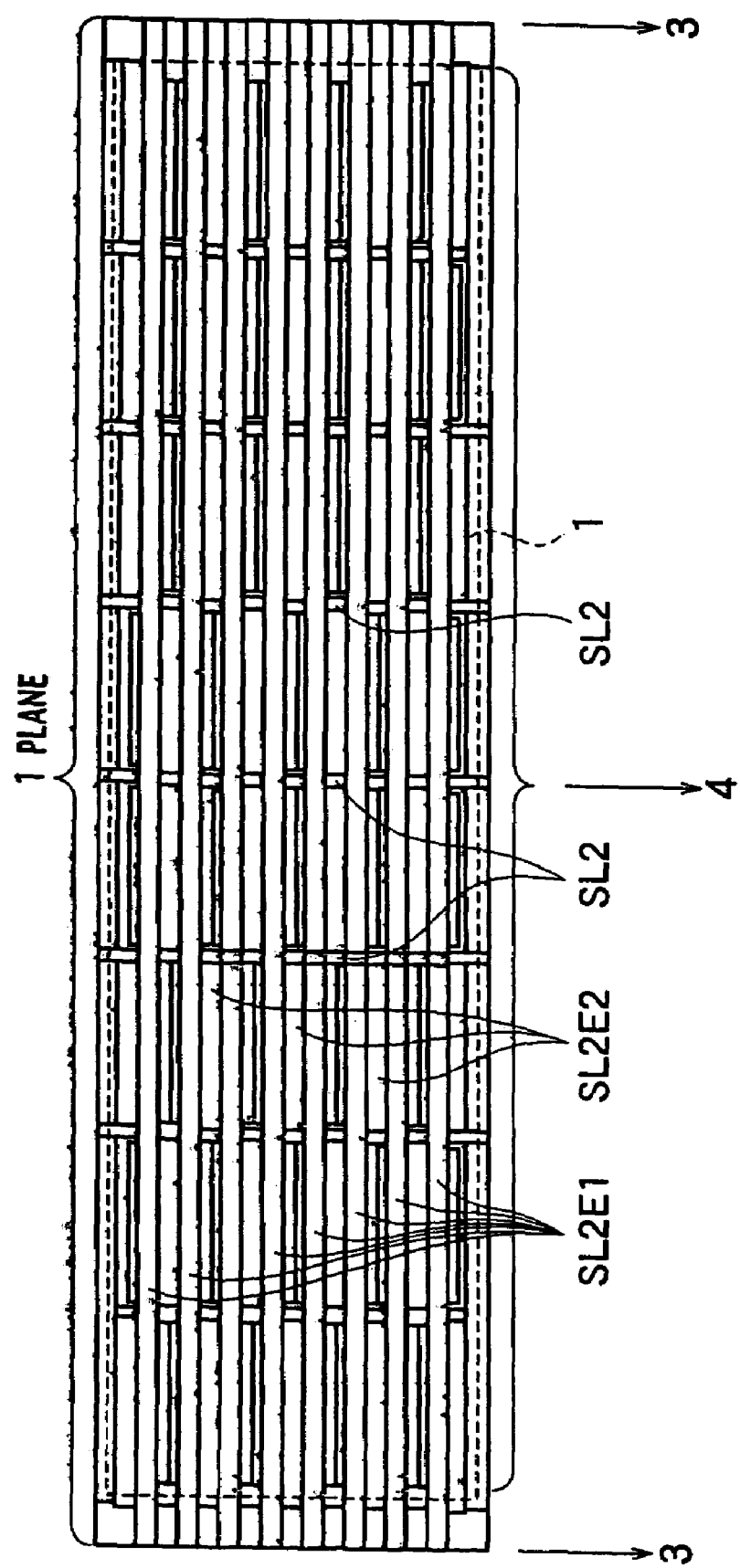
FIG. 22 is an aerial pattern diagram for describing a detailed source line pattern on a memory cell array region of a nonvolatile semiconductor memory according to a fourth modified example of the first embodiment of the present invention.

In the first through the fourth modified example of the first embodiment of the present invention, as shown in FIGS. 19 through 22, source line 2 elements 2 (SL2EL2) are additionally disposed between the source line 2 elements 1 (SL2EL1) in a grid. As shown in FIGS. 19 through 22, the grid pitch and SL2E2 pitch disposed between the SL2E1 are different in the first through the fourth modified example. For example, FIG. 19 shows the SL2E2, each of which is disposed alternately with the SL2E1 substantially in a grid. On the other hand, FIG. 20 shows the SL2E2, each being serially aligned in a slanting direction. In addition, FIG. 21 shows the SL2E2, each being systematically aligned in a slanting and crossing direction. Furthermore, in FIG. 22, each SL2E2 is formed so as a wide region, which is disposed with a designated pitch and used to fill in the region between the SL2E1.

Since the source line 2 elements 2 (SL2EL2) are formed in a grid, the cross section of each source line SL2 can be found in both cross-sectional structures cut along the line I-I, to which the data transfer lines BL extend, and cut along the line III-III, to which the data select lines WL extend. As a result, even when using a material with poor adhesion such as an interlayer fluorine-doped silicon insulator film (SiOF), SiC, HSQ, or MSQ as an insulator between or below the interconnects, the surface area of the cross-sectional region increases, improving adhesion. Therefore, a problem of peeling off the material with poor adhesiveness, such as the interlayer fluorine-doped silicon insulator film (SiOF), SiC, HSQ, or MSQ, for an interconnect foundation, is substantially prevented.

In addition, it is desirable that a relationship of r/2<y be satisfied; where r denotes the width of each source line 2 element 2 (SL2E2), and y denotes the distance between the source lines SL2 and the tunnel insulator film 44 of a memory cell transistor. More specifically, it is desirable that r be within the range of between 0.1 „m and 2 „m.

In general, a passivation film such as a silicon nitride film is formed after formation of the source lines SL2, and hydrogen generated during that formation also diffuses into the memory cell transistors. When the source lines SL2 do not cover the memory cell array region 1, diffused hydrogen easily reaches the tunnel insulator film (gate insulator film) 44, and is trapped in that tunnel insulator film 44, resulting in restoration of a part of the defective portion of that tunnel insulator film 44. In addition, when hydrogen diffuses to reach the interface between the tunnel insulator film 44 and the semiconductor substrate 26, termination of the interface state, a decrease in the threshold of each nMOS transistor, and a decrease in the subthreshold coefficient is achieved. In the case of isotropic diffusion of hydrogen as with the case of carrying out thermal treatment after formation of a passivation film, when r/2<y is satisfied, the hydrogen diffusion length from the passivation film is longer than y. Therefore, diffused hydrogen may reach the transistor gate insulator film beneath the source line 2 elements 2 (SL2E2). This eliminates the location dependency of the hydrogen density distribution within the gate insulator films of the bit line side select gate transistor SGD and the source line side select gate transistor SGS, and improves reliability of the semiconductor memory.

In addition, in the nonvolatile semiconductor memory according to the first through the fourth modified example of the first embodiment of the present invention, since low-resistance source line 2 elements 2 (SL2EL2) are also formed along the line I-I, resistance along the line I-I can be further reduced.

Figure 6:
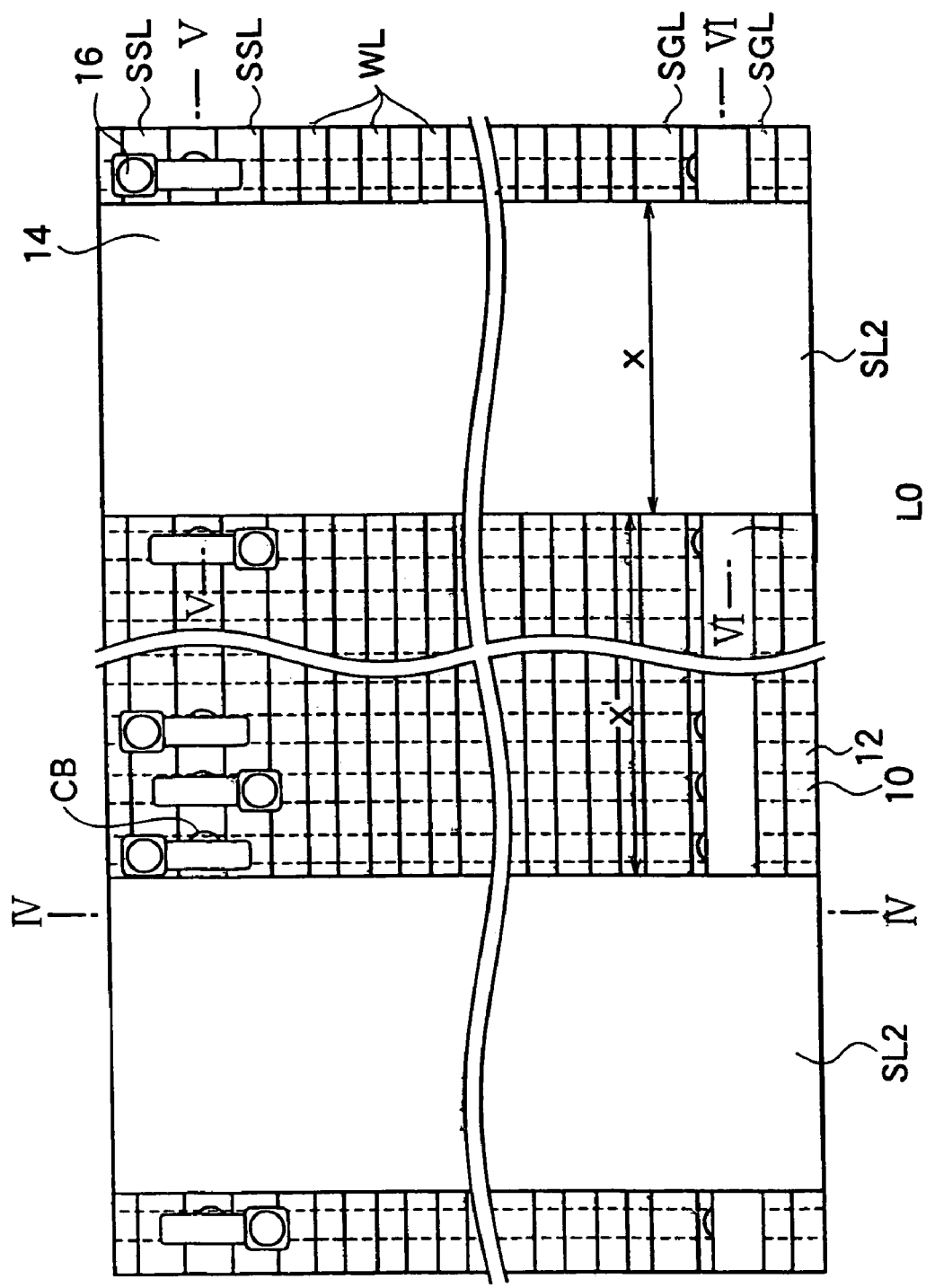
FIG. 6 is a detailed aerial pattern diagram of the memory cell array region in the nonvolatile semiconductor memory of the related art when source lines are made wider.
Figure 7:
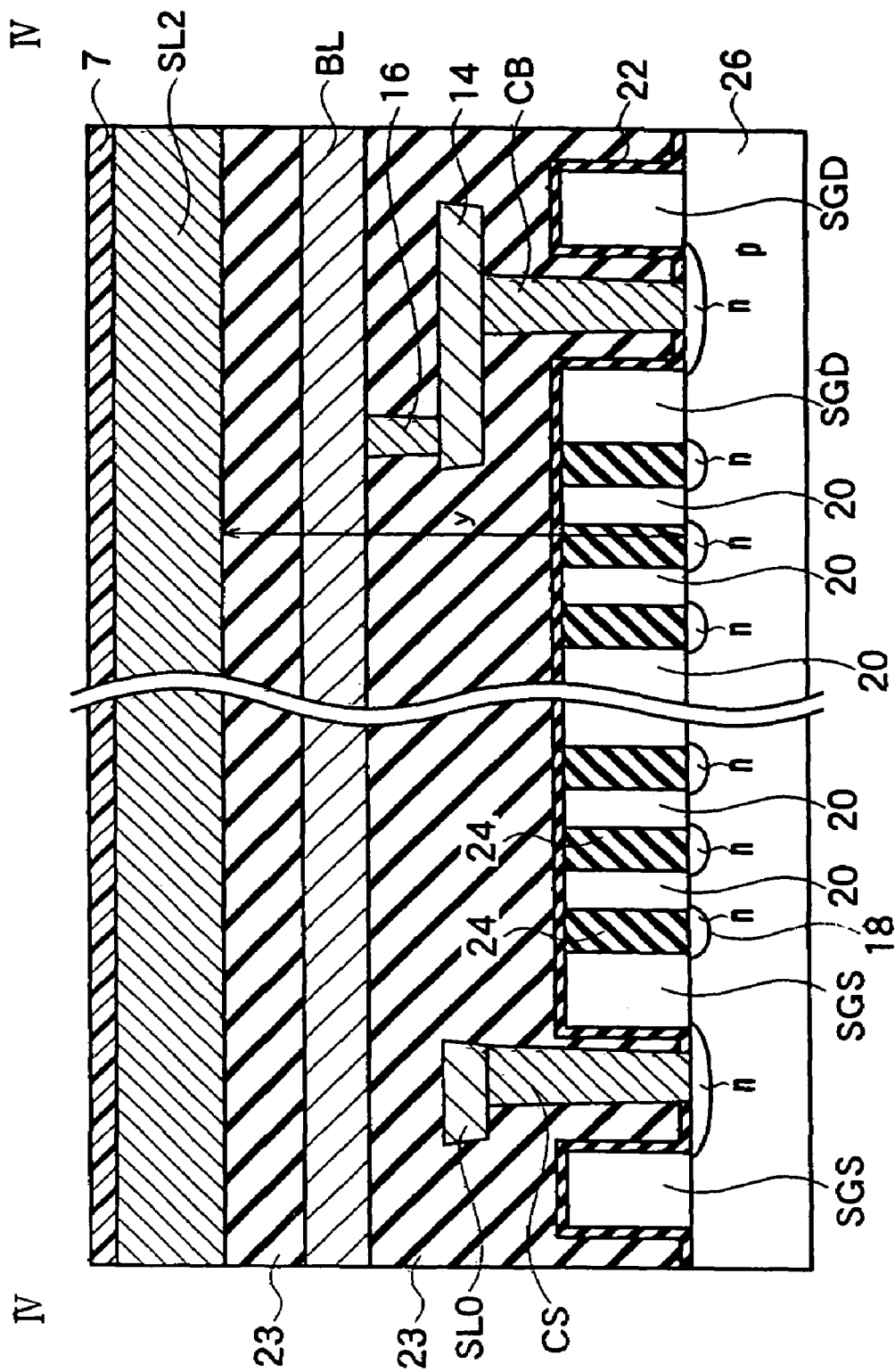
FIG. 7 is a schematic cross-sectional diagram cut along the line IV-IV of FIG. 6.
Figure 8:
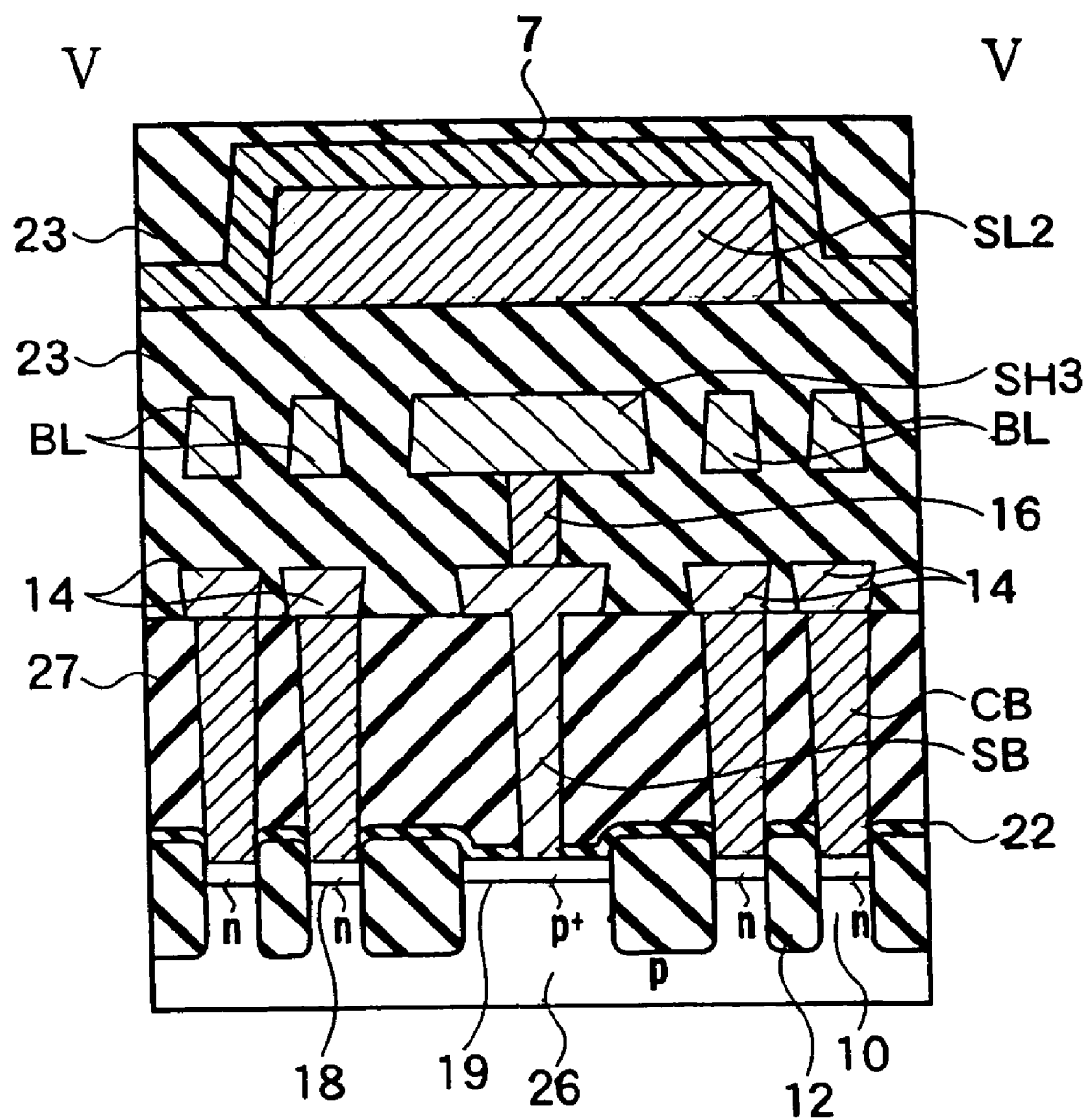
FIG. 8 is a schematic cross-sectional diagram cut along the line V-V of FIG. 6.
Figure 9:
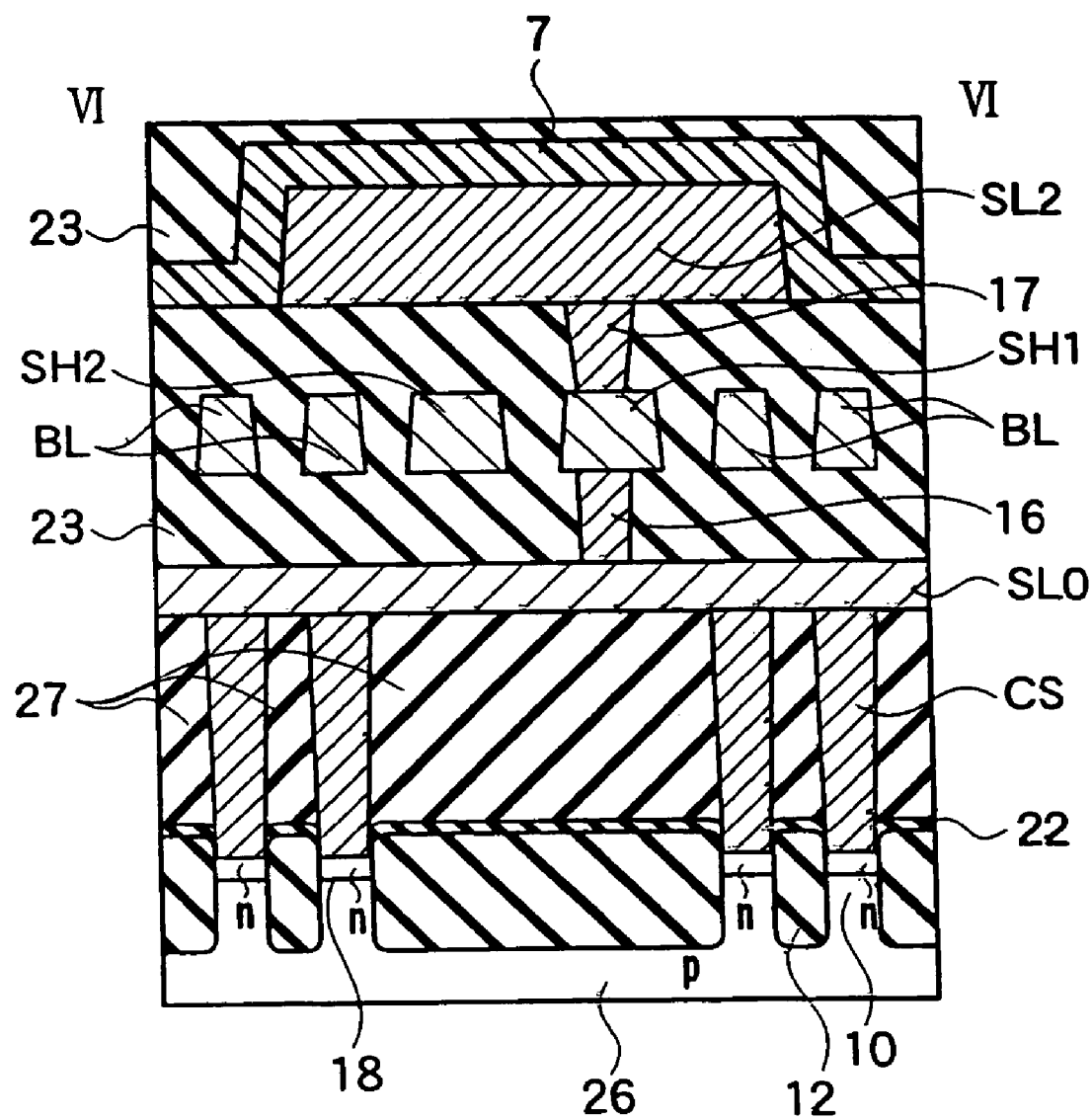
FIG. 9 is a schematic cross-sectional diagram cut along the line VI-VI of FIG. 6.

Furthermore, in the first through the fourth modified example of the first embodiment of the present invention, arrangement of the source line 2 elements 2 (SL2EL2) on data transfer lines BL in a grid allows reduction in the ratio of the source lines SL2 formed on the data transfer lines BL by more than half compared to the case of the source lines SL2 covering the entire surfaces of the data transfer lines BL. As a result, the capacitive coupling of the source lines SL2 and the data transfer lines BL decreases, and the capacitance of each data transfer line BL can be reduced to less than that for the case of forming the source lines SL2 on the entire surfaces of the data transfer lines BL. This allows control of the amount of charges, which charge/discharge the data transfer lines BL, to be relatively small, reduction in charge/discharge time, and high-speed read-out operation with low power consumption. In addition, among the first through the fourth modified example of the first embodiment of the present invention, each ratio of all vertically extending data transfer lines BL covered by the source lines SL2 is similar. This reduces variation in the capacitances of the data transfer lines BL in comparison with the related art shown in FIG. 6. As a result, variation in the CR time constants for the data transfer lines during reading may be controlled corresponding to reduced variation in capacities of the data transfer lines BL. This further reduces timing margins during reading, and achieves a faster nonvolatile semiconductor memory.

Second Embodiment

Figure 75:
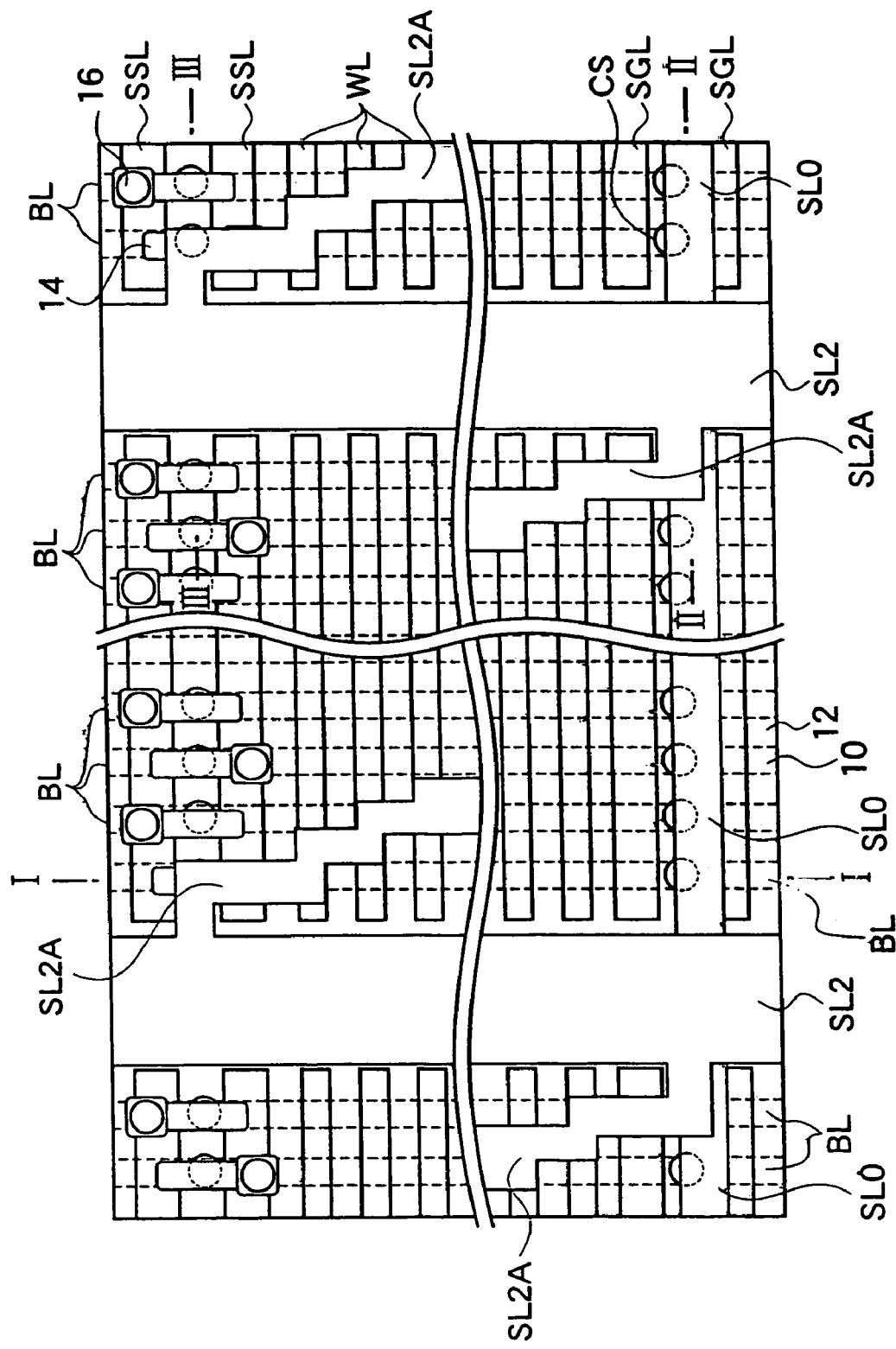
FIG. 75 is a detailed aerial pattern diagram of a memory cell transistor region of a nonvolatile semiconductor memory according to a second embodiment of the present invention.
Figure 76:
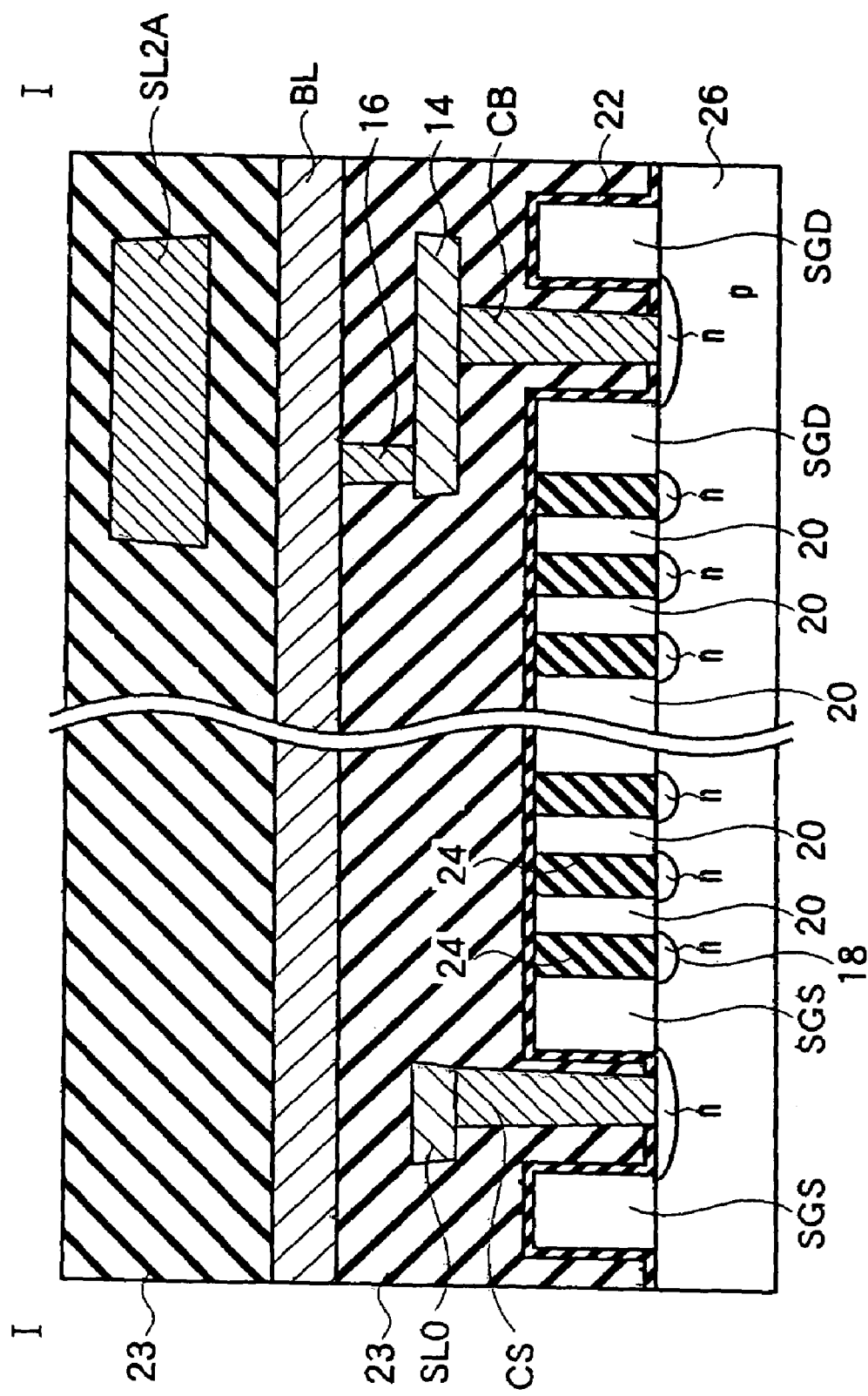
FIG. 76 is a schematic cross-sectional diagram cut along the line I-I of FIG. 75.
Figure 77:
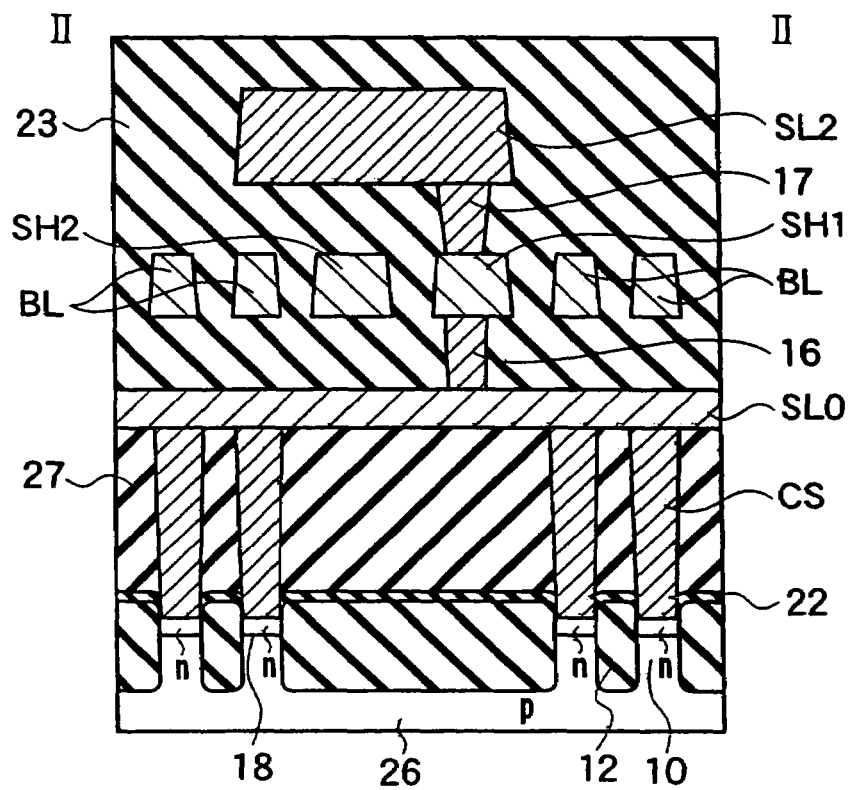
FIG. 77 is a schematic cross-sectional diagram cut along the line II-II of FIG. 75.
Figure 78:
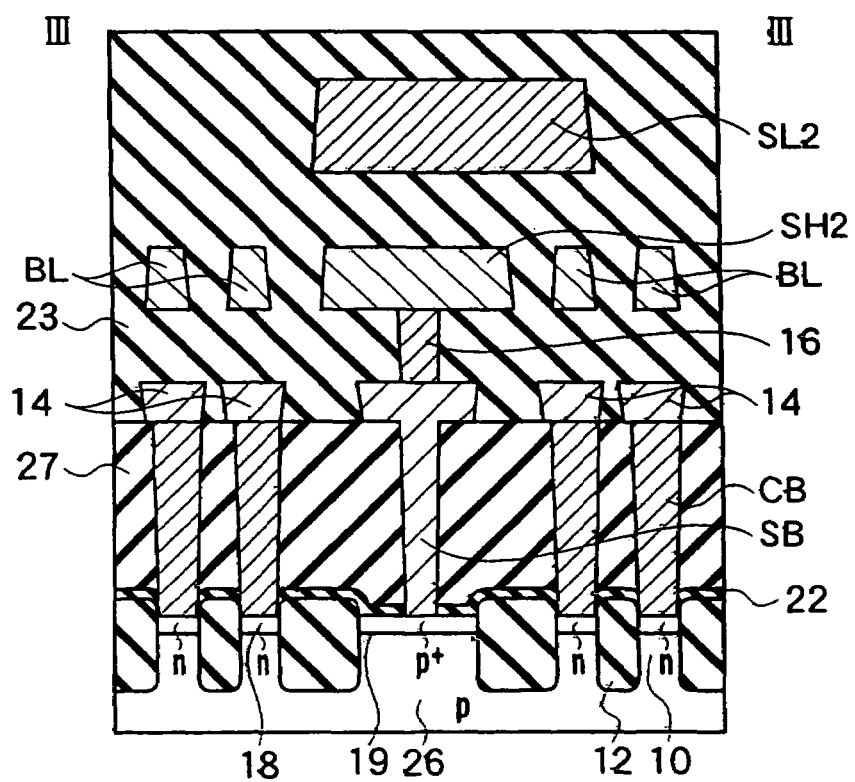
FIG. 78 is a schematic cross-sectional diagram cut along the line III-III of FIG. 75.

FIG. 75 schematically shows an enlarged aerial pattern on a memory cell array region of a nonvolatile semiconductor memory according to the second embodiment of the present invention. FIGS. 76 through 78 are schematic cross-sectional diagrams cut along the lines I-I, II-II, and III-III of FIG. 75, respectively. Hereinafter, the same reference numerals are attached to the same parts as the first embodiment, and description thereof is omitted. The nonvolatile semiconductor memory according to the second embodiment of the present invention naturally allows various arrangements of the power supply electrodes due to source electrodes, which are based on arrangements of the source lines SL2, the SL2E1, and the SL2E2. As a result, employing the same source electrode arrangement as shown in FIGS. 19 through 22 provides the same effects as those described in the first through the fourth modified example of the first embodiment.

Figure 79:
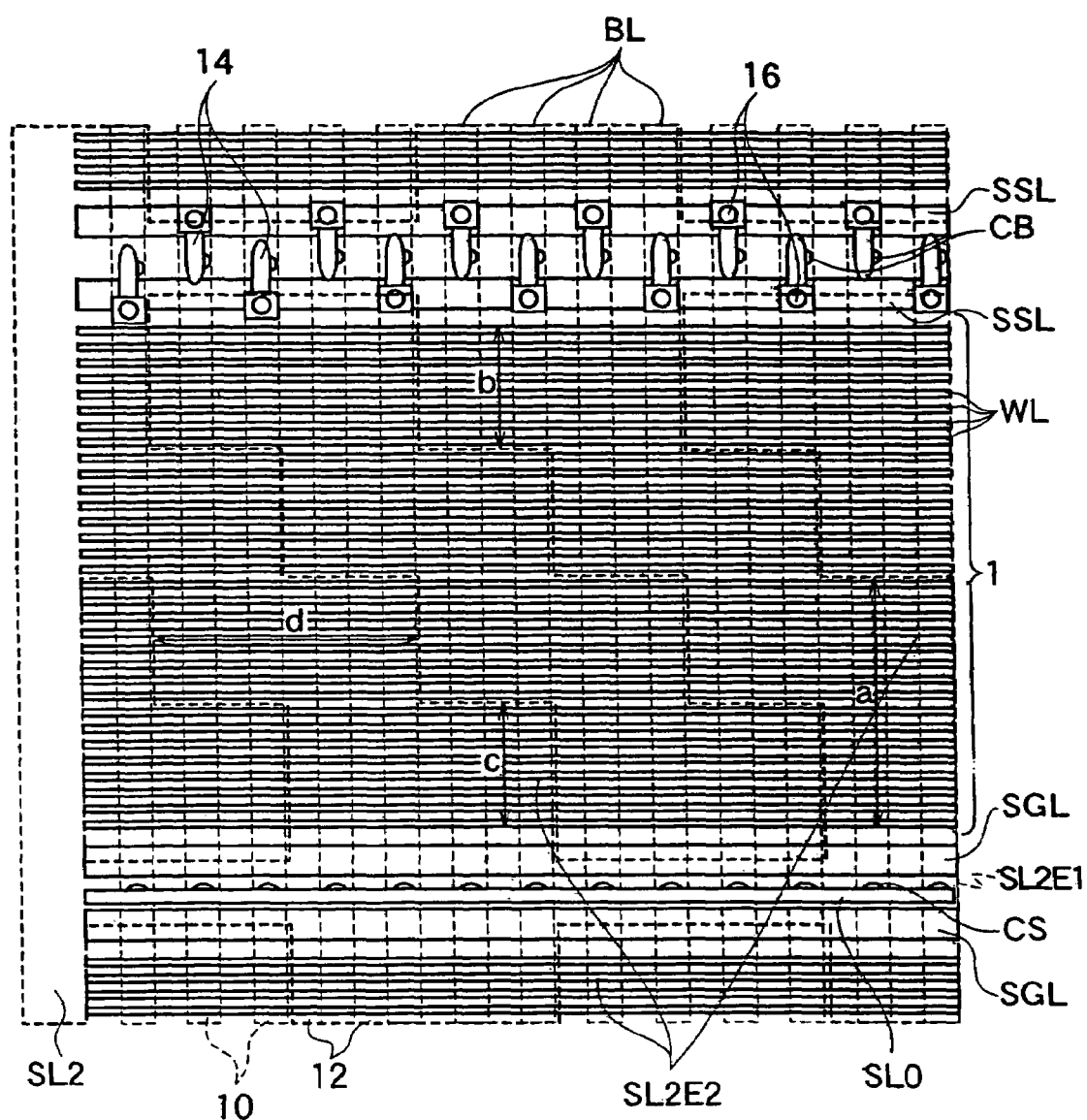
FIG. 79 is an aerial pattern diagram of a memory cell array region for describing a detailed source line pattern on the memory cell array region in the nonvolatile semiconductor memory according to the second embodiment of the present invention.

There is a difference from the nonvolatile semiconductor memory according to the first embodiment shown in FIGS. 14 through 18 in that additional source line interconnecting regions SL2A are disposed on the memory cell-array region 1 in order to further reduce the source line SL2 interconnect resistance. Since the potential of the source lines SL2 is transferred along the line I-I, even when additional interconnects are used for connection along the line III-III (orthogonal to the line I-I) in order to reduce the resistance, a sufficient reduction effect of the resistance of the source lines SL2 may not be obtained. Therefore, in the nonvolatile semiconductor memory according to the second embodiment of the present invention, as shown in FIG. 75, additional interconnects are formed as a stair-shape of source line additional interconnecting region SL2A, so as to reduce the interconnect resistance against the current flowing along the line I-I. In addition, FIG. 79 shows a specific structure of the source line SL2 element (EL) pattern in a NAND memory cell transistor string. FIG. 79 shows a source line 2 element 2 (SL2E2) pattern in a single NAND block indicated by a dashed line. FIG. 79 shows an exemplary NAND block including thirty two data select lines WL, one select gate line SSL, and one select gate line SGL; wherein memory cell transistors are formed at the intersects of the respective device regions and the memory cell data select lines WL.

In comparison with the nonvolatile semiconductor memory according to the first embodiment of the present invention, the nonvolatile memory according to the second embodiment of the present invention is characterized in that the source line 2 elements 2 (SL2E2) are formed in a stair-shape within a single NAND block. More specifically, the number of the data select lines WL included in the range of width a shown in FIG. 79 (sixteen in the drawing) is almost equal to the total number of data select lines WL included in the range of widths b and c shown in FIG. 79 (8+8=16 in the drawing), and each coverage rate of the source lines SL2 formed over a single NAND string is almost the same. In this manner, for all NAND strings included in all data transfer lines BL, all coverage rates of the source lines SL2 formed over the respective NAND strings are almost the same. In addition, in the nonvolatile semiconductor memory according to the second embodiment of the present invention, the ratio of the area of the covered area of source lines SL2 to the area of each single cell can be almost the same throughout the region (single block) between the select gate line SSL and the select gate line SGL and region between the source lines SL2, by aligning the source line SL2 layout patterns with cell pitch. As a result, even when hydrogen diffuses from the above layer, but does not reach the underlayer of the gate insulator film due to being trapped by the barrier metal 64 or the like of the source line SL2, it is possible to control the uniformity of the ratio of the covered area of source lines SL2 to the area of each single cell, to a certain extent, better than the first through the fourth modified example of the first embodiment of the present invention, by aligning the source line SL2 layout with the cell pitch. Furthermore, since the coverage rate of the source lines SL2 formed in the upper region of each NAND string is almost the same, the periodical intervals along the source line 2 element 2 (SL2E2) blocks can be shorter than those of the first through the fourth modified example of the first embodiment of the present invention. As a result, since periodical intervals along the data transfer lines BL can also be provided, the variations of the value of the parasitic capacitance among data transfer lines BL may be reduced.

Note that FIG. 79 shows a structure including sixteen memory cell data select lines WL within the width a and within the width (b+c); alternatively, the number of data select lines WL may be a submultiple of the number of the NAND strings. For example, if the number of NAND strings is thirty two, the number of data select lines WL may be available for sixteen, eight, four, or two. However, the minimum fabrication line width of each source line SL2 is typically more than four times the minimum fabrication line width of each memory cell transistor in order to fabricate the source lines SL2 with a thick film. Therefore, any of two, four, eight, or sixteen is desirable as for the number of data select lines WL, and the line width greater than 0.1 „m is desirable. In addition, while it is unnecessary for the width d of each source line 2 element 2 (SL2EL2) extending along the data select lines WL to be the same, it is desirable to be between 0.1 „m and 2 „m to sufficiently diffuse hydrogen into the memory cell transistors thereunder.

Since the fabrication method is almost the same as the fabrication method shown in FIGS. 23 through 74 described in the first embodiment of the present invention, description thereof is omitted. The barrier metal 64 such as Ti, Ta, TaN, or TiN is deposited to a thickness of 1 to 100 nm in the second via contacts 17 and the interlayer insulator films 23 using sputtering or CVD after formation of the second via contacts 17. A metallic material such as W, Al, or Cu is then deposited to a thickness of 10 to 1000 nm, filling in the second via contacts 17 to be a source line SL2 interconnect material. The source line SL2 layout in the nonvolatile semiconductor memory according to the second embodiment of the present invention can easily be achieved by carrying out patterning in a desired stair-shape using lithography (FIGS. 75 through 79).

Third Embodiment

Figure 80:
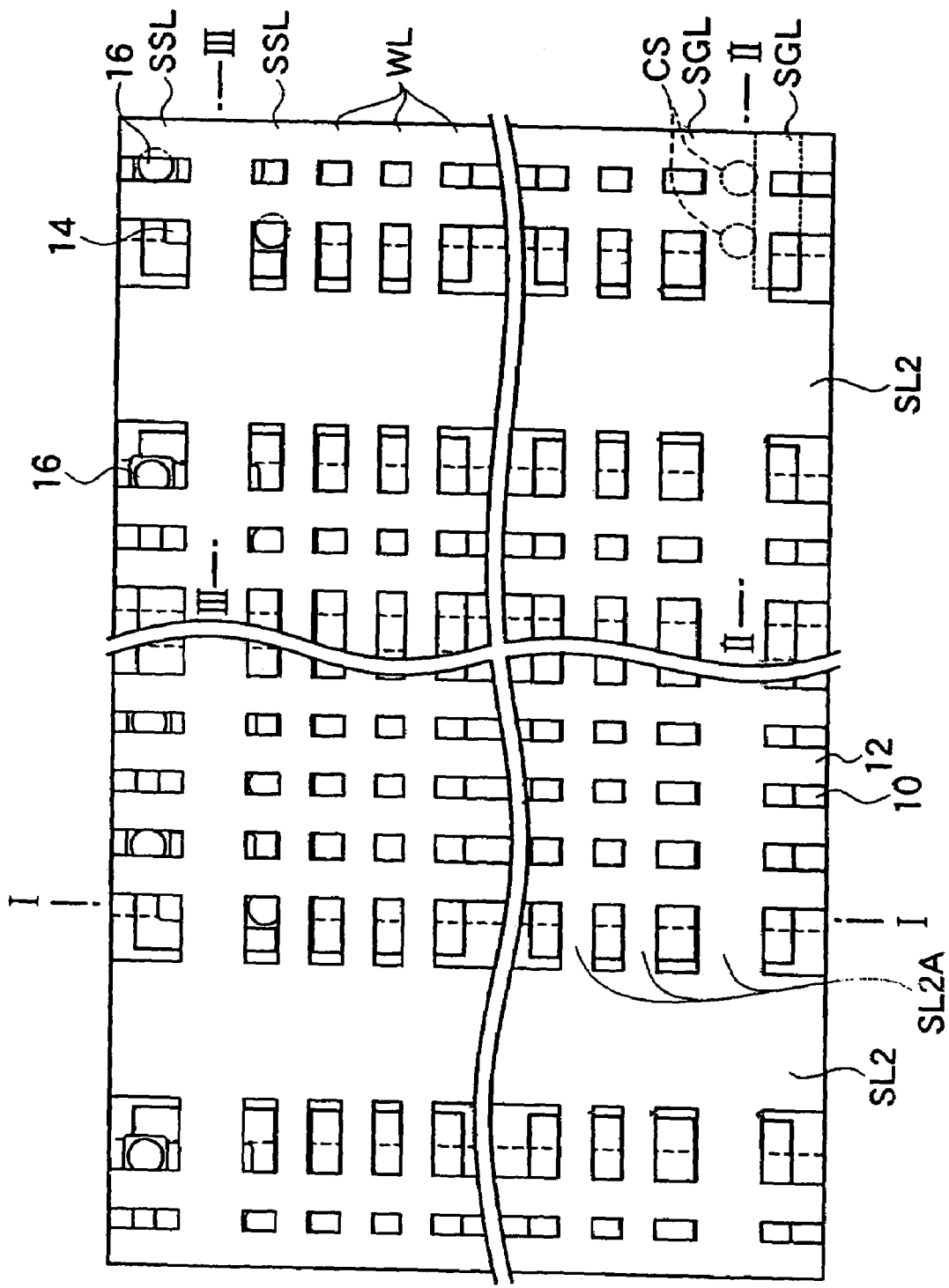
FIG. 80 is a detailed aerial pattern diagram of a memory cell transistor region of a nonvolatile semiconductor memory according to a third embodiment of the present invention.
Figure 81:
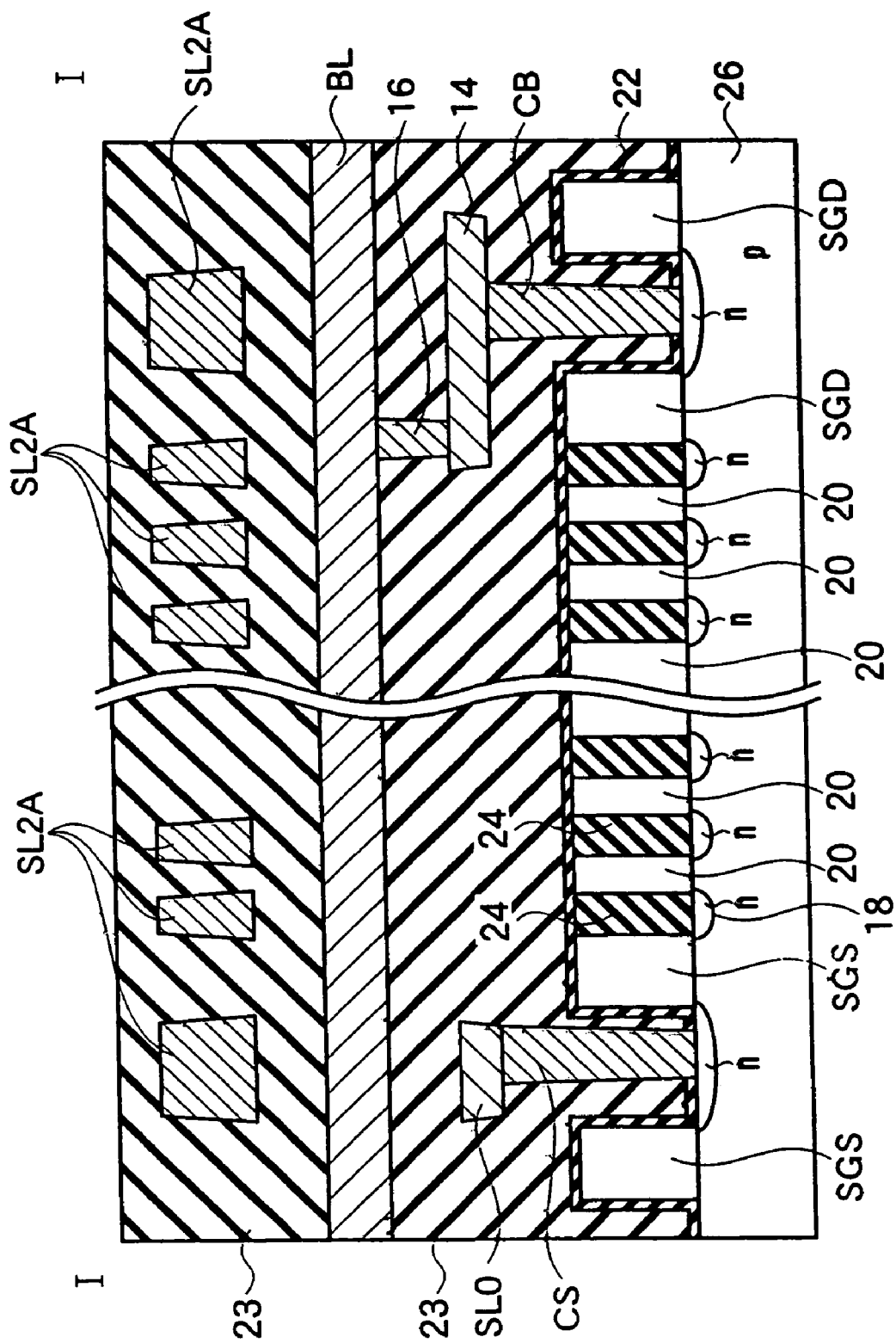
FIG. 81 is a schematic cross-sectional diagram cut along the line I-I of FIG. 80.
Figure 82:
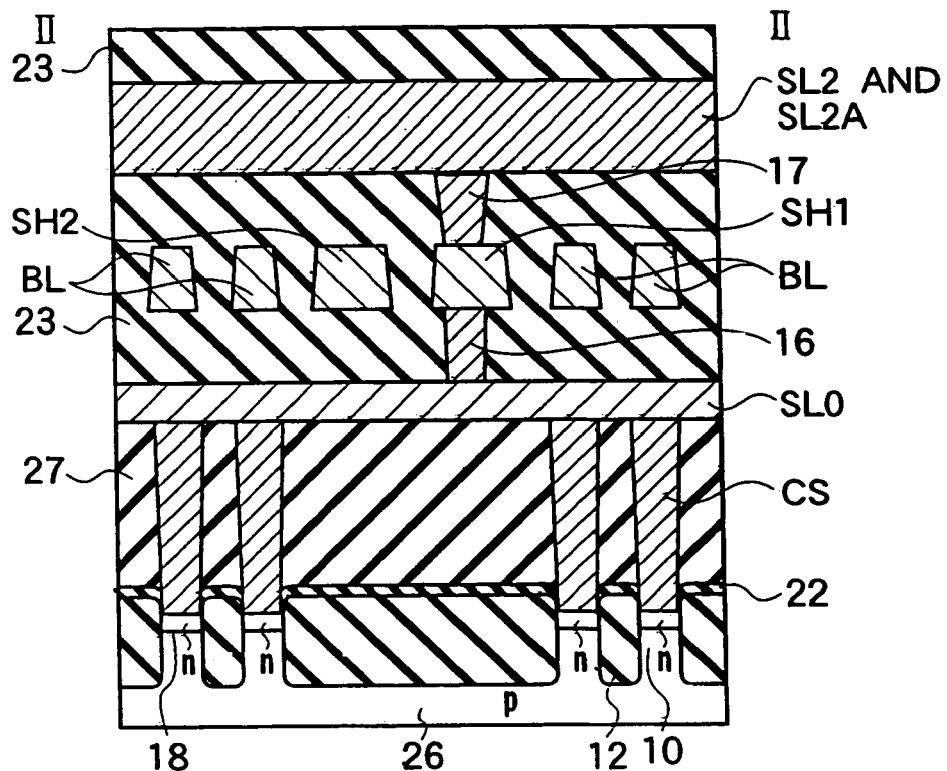
FIG. 82 is a schematic cross-sectional diagram cut along the line II-II of FIG. 80.
Figure 83:
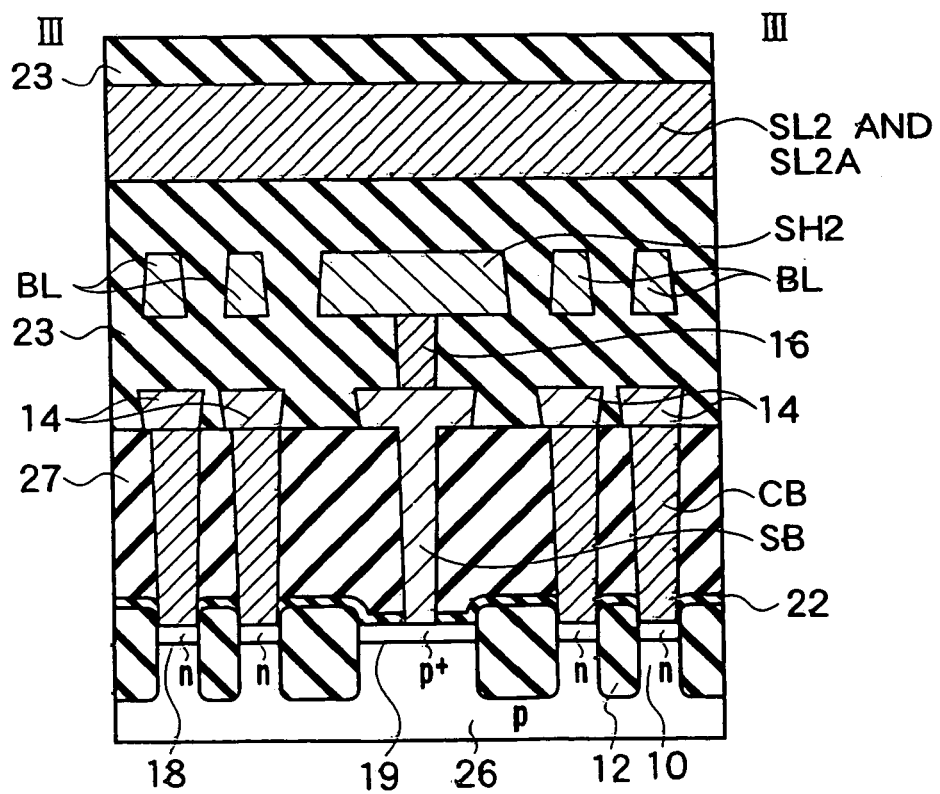
FIG. 83 is a schematic cross-sectional diagram cut along the line III-III of FIG. 80.

FIG. 80 schematically shows an enlarged aerial pattern on a memory cell array region 1 of a nonvolatile semiconductor memory according to the third embodiment of the present invention. FIGS. 81 through 83 are schematic cross-sectional diagrams cut along the lines I-I, II-II, and III-III of FIG. 80, respectively.

A difference from the nonvolatile semiconductor memory according to the second embodiment of the present invention shown in FIGS. 75 through 79 is that additional interconnects are disposed in a grid in order to further reduce the interconnect resistance as well as to connect the source line additional interconnecting regions SL2A in a stair-shape. In addition, since periodical intervals along the data transfer lines BL can also be provided by aligning the additional interconnects with the pitch of the memory cell transistors, hydrogen diffused during a passivation process uniformly affects the memory cell transistors, and the variations of the value of the parasitic capacitance among data transfer lines BL may be reduced. A fabrication method for the nonvolatile semiconductor memory according to the third embodiment of the present invention is substantially the same as the fabrication method for the nonvolatile semiconductor memory according to the first embodiment described in FIGS. 23 through 74. The shape of the third embodiment of the present invention can be easily achieved by arranging the second source line SL2 lithographic pattern in a grid as shown in FIG. 80. Since effects of the nonvolatile semiconductor memory according to the third embodiment of the present invention are the same as those of the first through the third modified example of the first embodiment, description thereof is omitted.

[Modified Example of the Third Embodiment]

Figure 84:
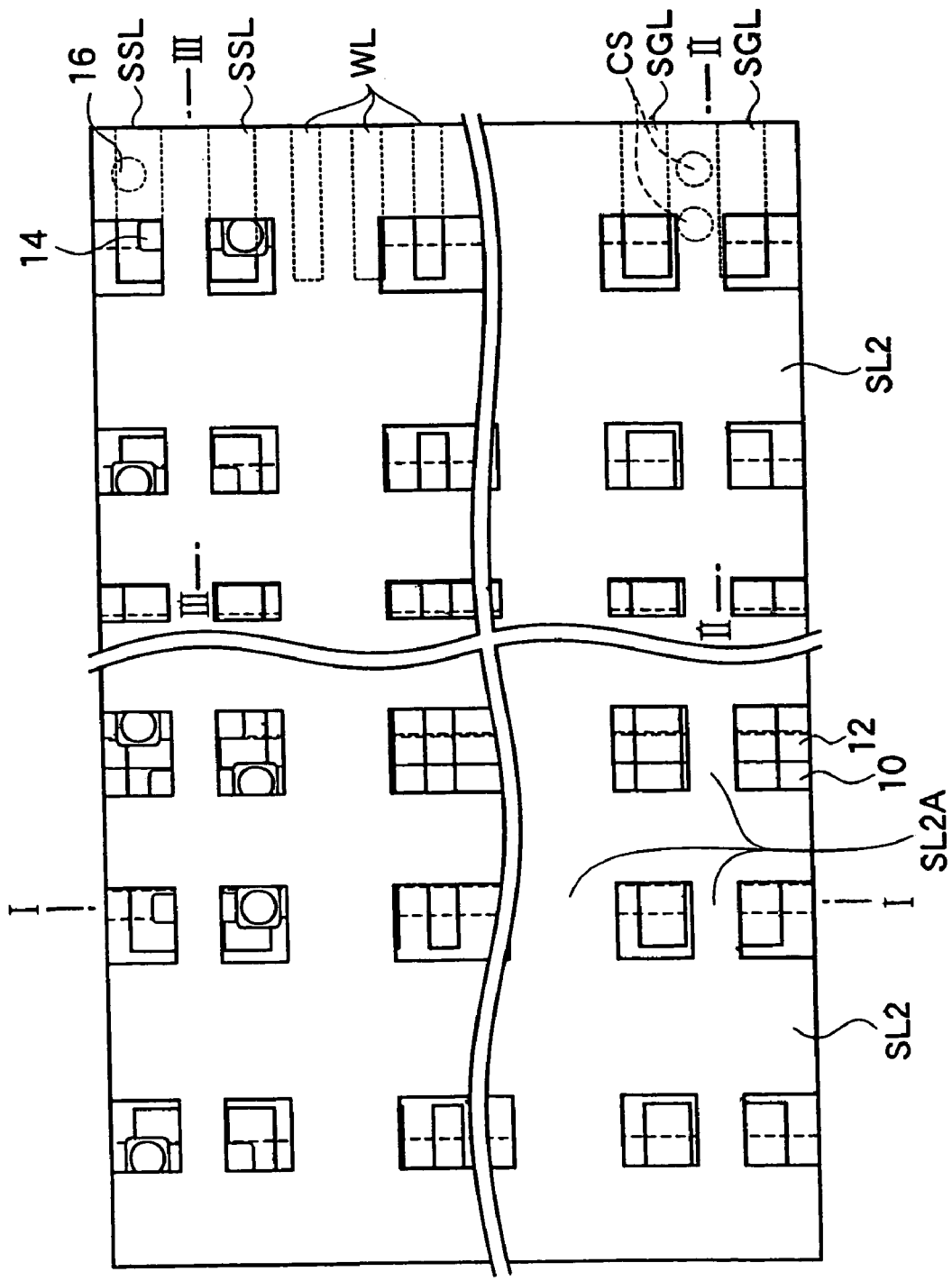
FIG. 84 is a detailed aerial pattern diagram of a memory cell array region of a nonvolatile semiconductor memory according to a modified example of the third embodiment of the present invention.
Figure 85:
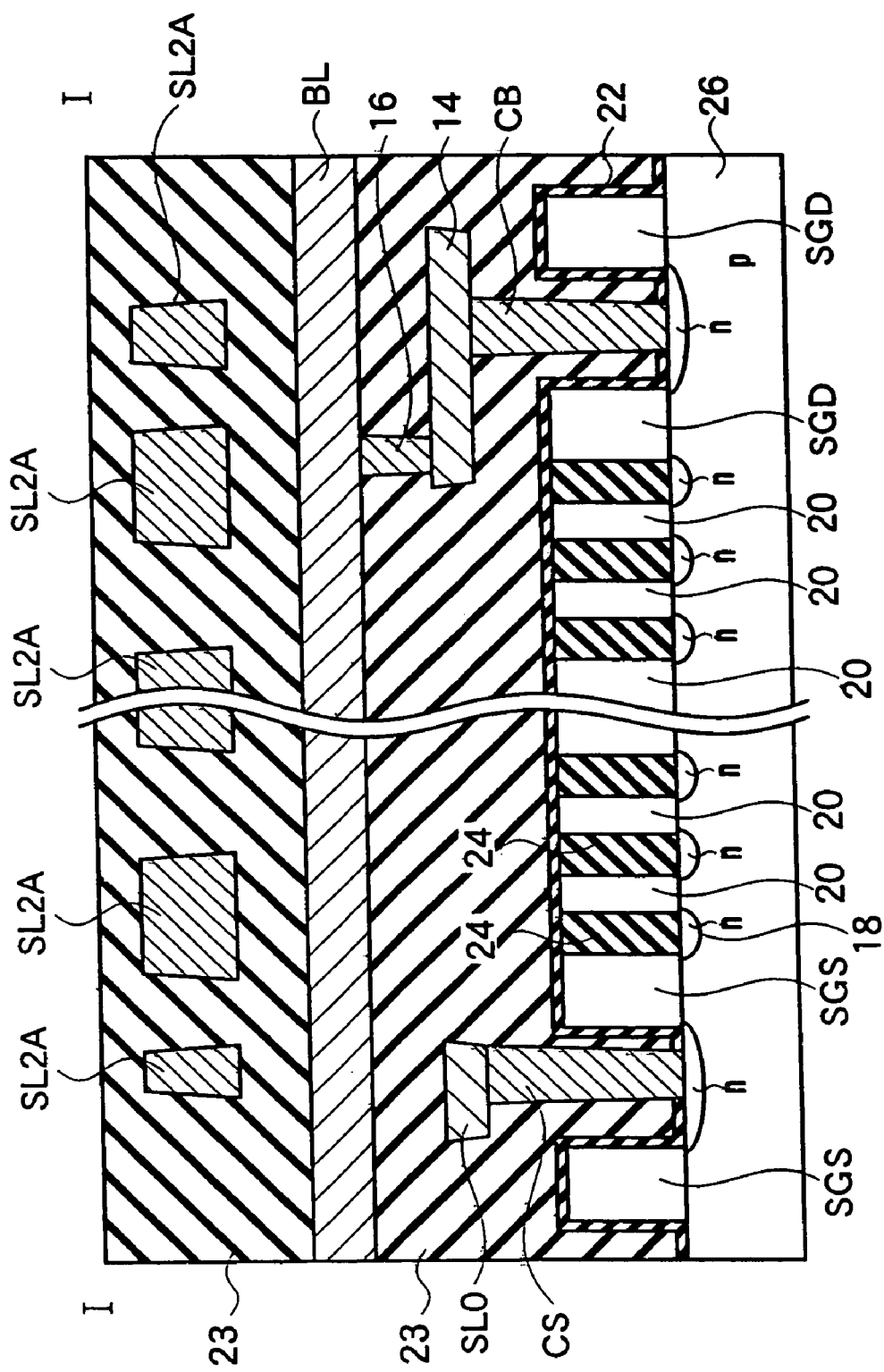
FIG. 85 is a schematic cross-sectional diagram cut along the line I-I of FIG. 84.
Figure 86:
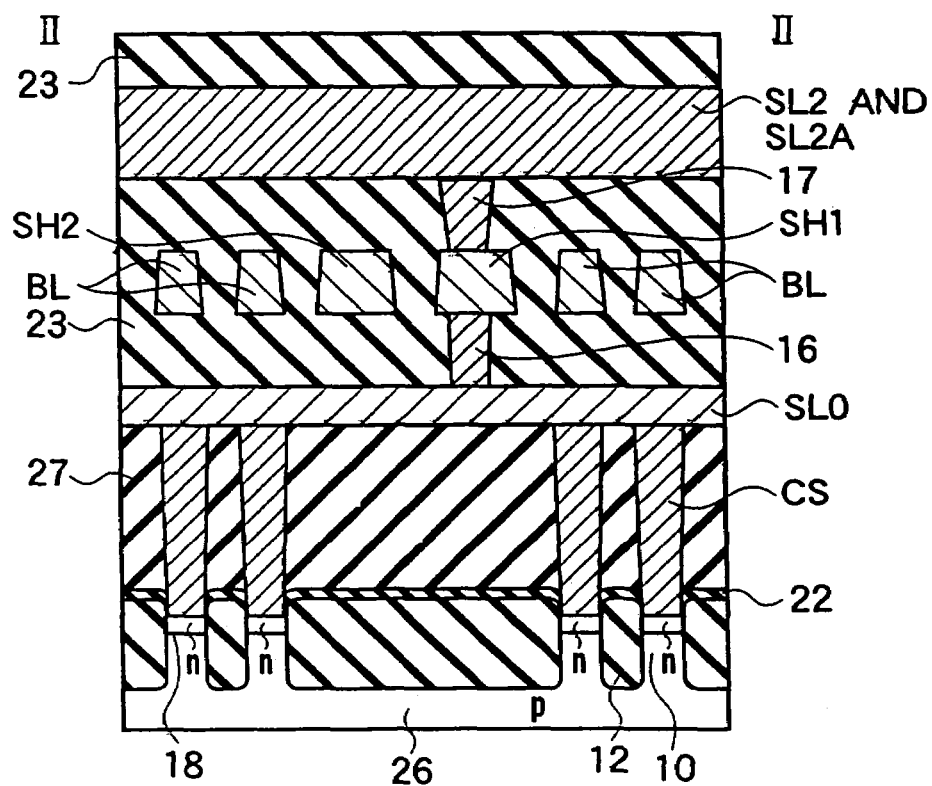
FIG. 86 is a schematic cross-sectional diagram cut along the line II-II of FIG. 84.
Figure 87:
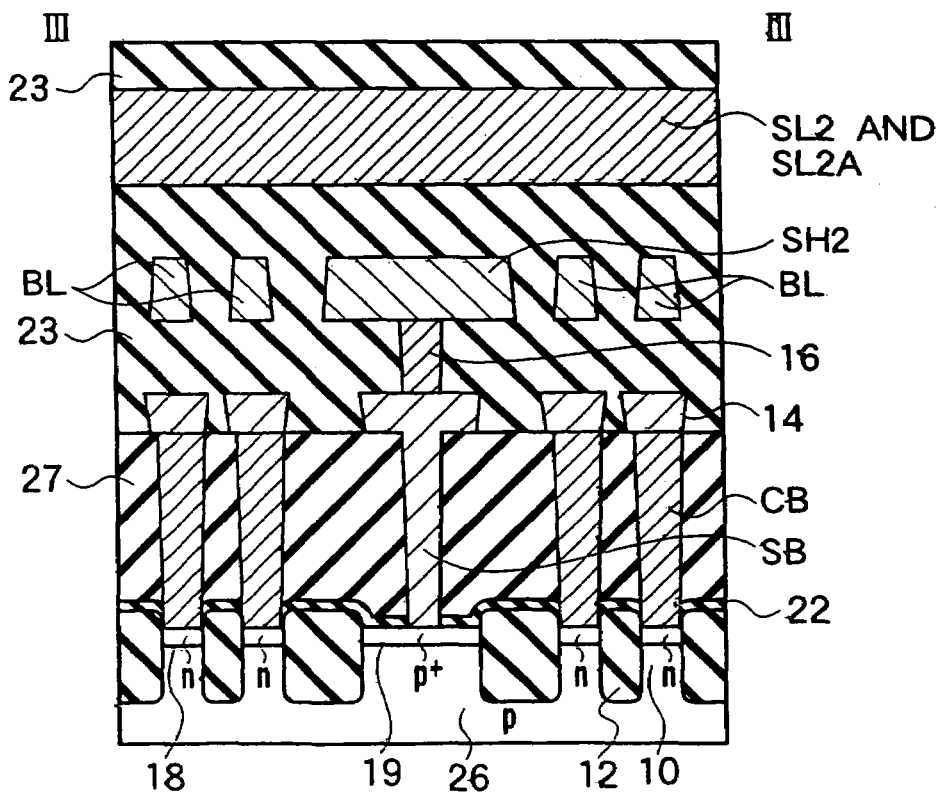
FIG. 87 is a schematic cross-sectional diagram cut along the line III-III of FIG. 84.

FIG. 84 schematically shows an enlarged aerial pattern on a memory cell array region of a nonvolatile semiconductor memory according to a modified example of the third embodiment of the present invention. FIGS. 85 through 87 are schematic cross-sectional diagrams cut along the lines I-I, II-II, and III-III of FIG. 84, respectively.

While the source line additional interconnecting regions SL2A described in the third embodiment shown in FIGS. 80 through 83 are aligned with the pitch of the memory cell transistors in a grid, the modified example is characterized in that there is a pattern of source lines SL2 being connected for every integral multiple of memory cell transistor pitch such as every four memory cell transistors (2×2) in a grid. The effects are the same as the case of alignment with the memory cell transistor pitch, except that the lithographic margin can be provided by using wider interconnects. In this modified example, the source lines SL2 are connected for every four cells; alternatively, they may be connected in a unit of any number of memory cell transistors such as six cells or eight cells as long as additional interconnects can be periodically connected in a grid. The manufacturing method is the same as that of the first or the third embodiment described above, and can easily provide the shape of the modified example of the third embodiment of the present invention by arranging the source line SL2 lithographic pattern in a grid as shown in FIG. 84. Since the effects of the nonvolatile semiconductor memory according to the modified example of the third embodiment of the present invention are the same as those of the first through the fourth modified example of the first embodiment, description thereof is omitted.

Fourth Embodiment

Figure 88:
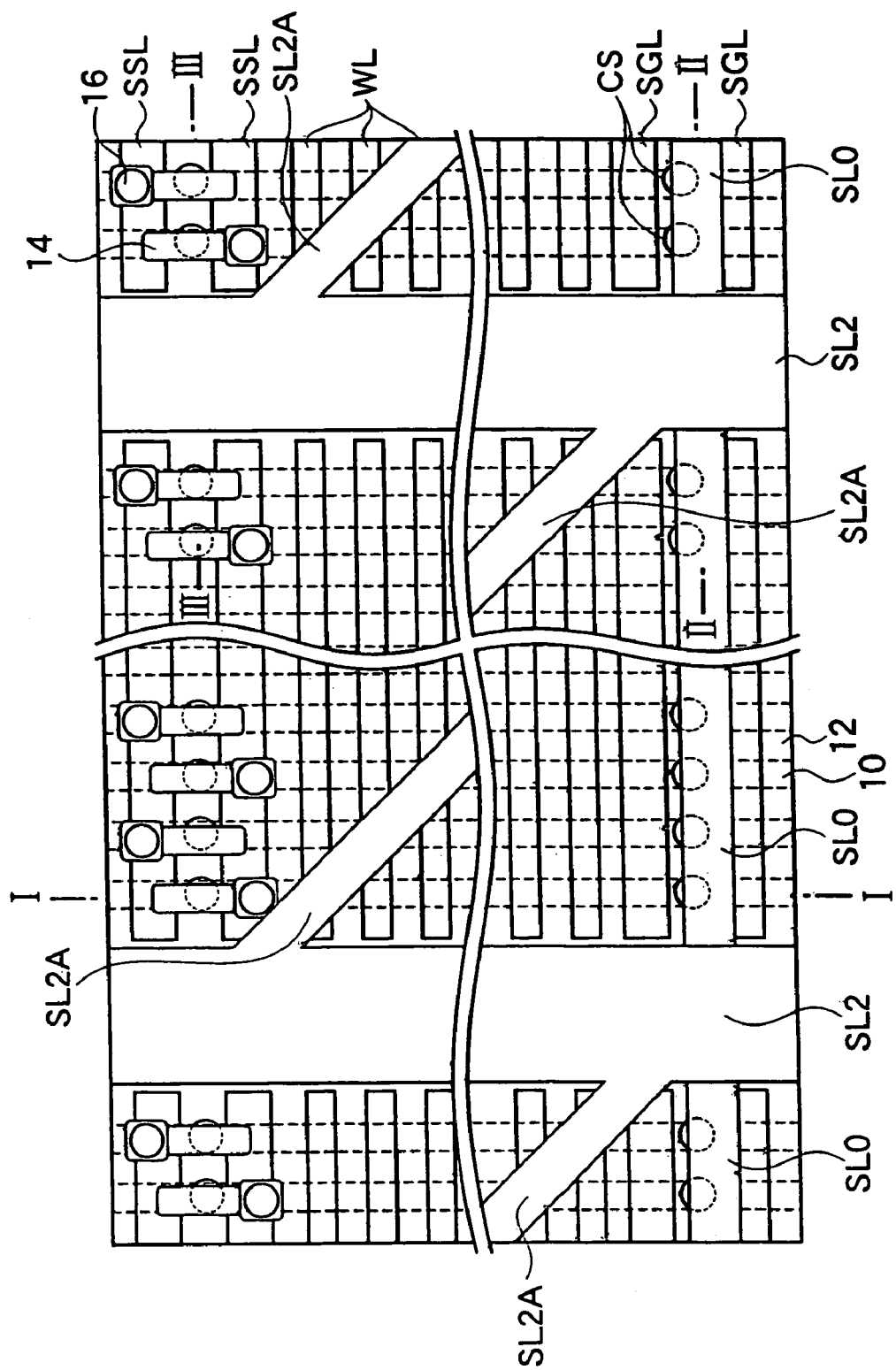
FIG. 88 is a detailed aerial pattern diagram of a memory cell array region of a nonvolatile semiconductor memory according to a fourth embodiment of the present invention.
Figure 89:
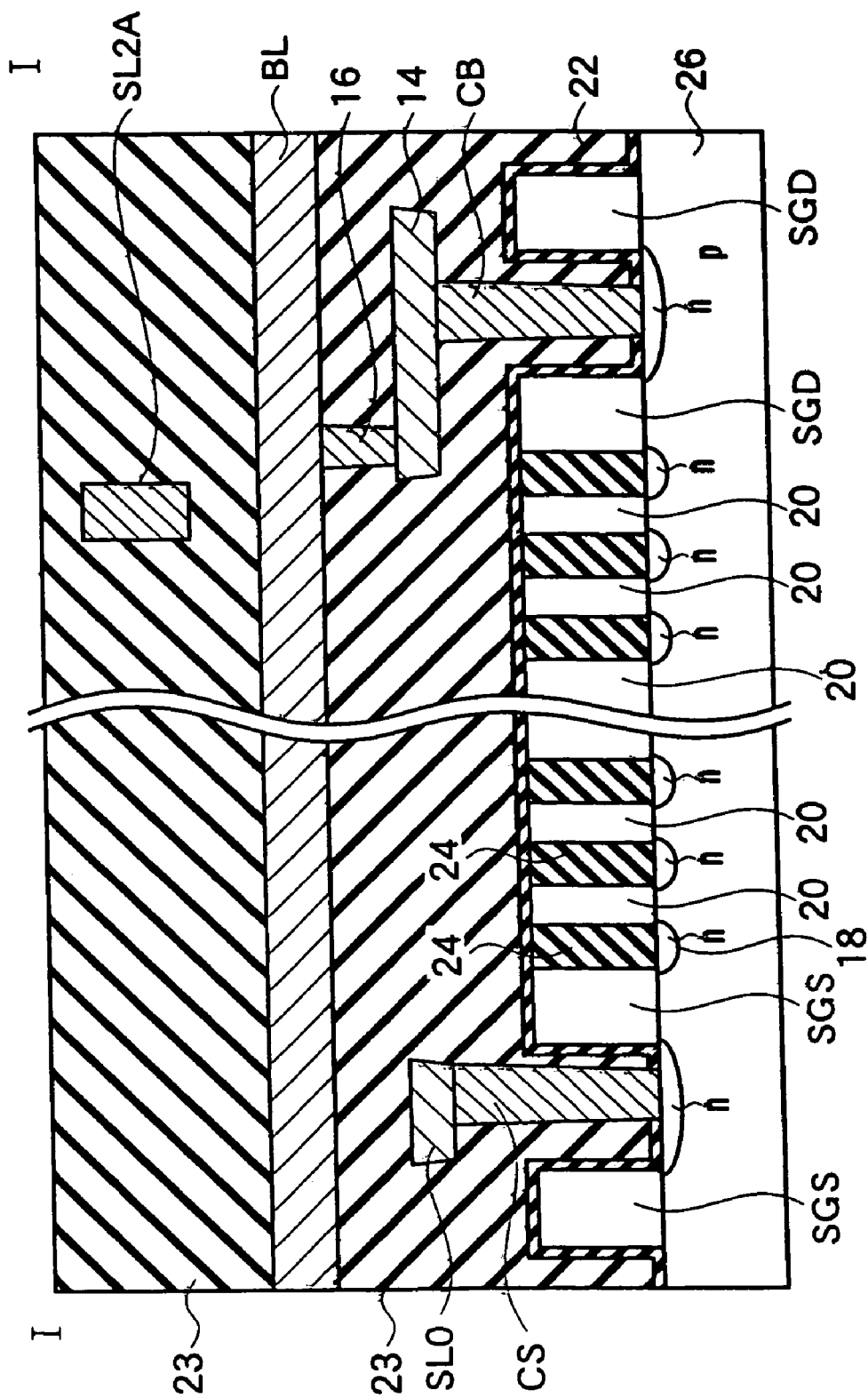
FIG. 89 is a schematic cross-sectional diagram cut along the line I-I of FIG. 88.
Figure 90:
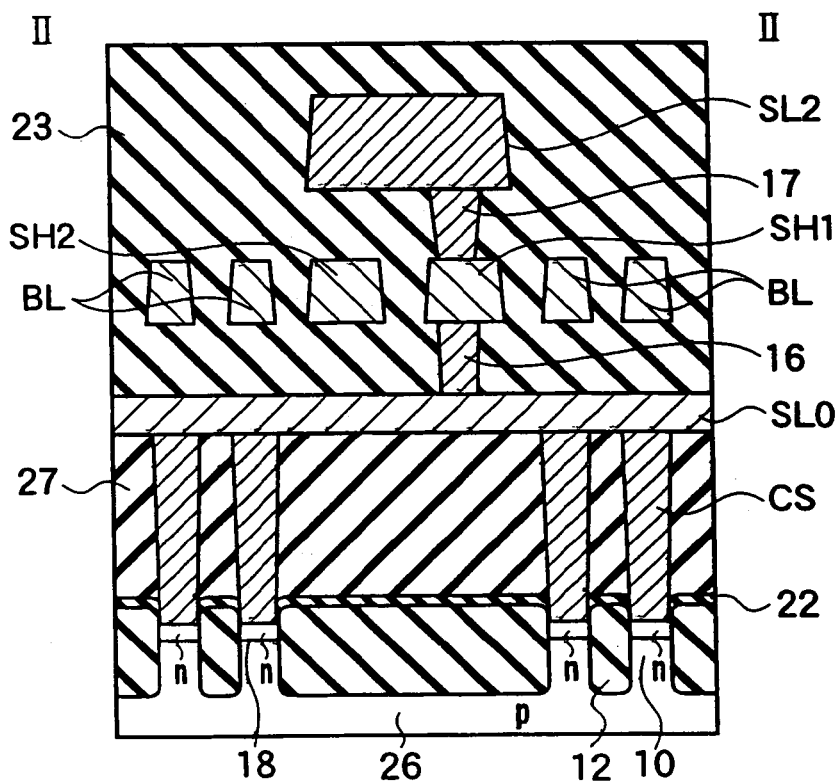
FIG. 90 is a schematic cross-sectional diagram cut along the line II-II of FIG. 88.
Figure 91:
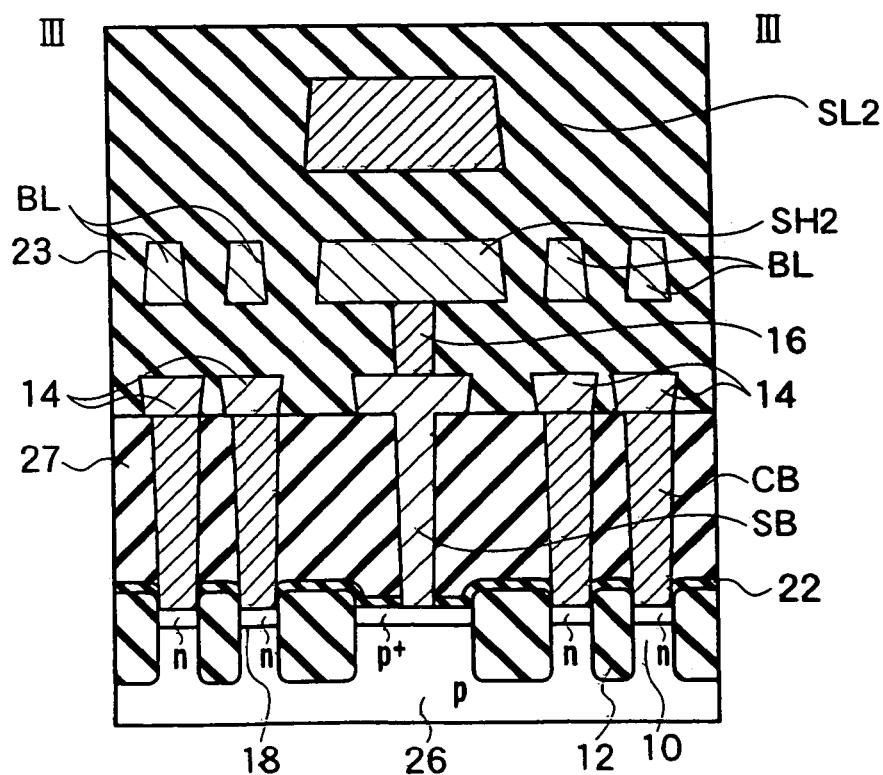
FIG. 91 is a schematic cross-sectional diagram cut along the line III-III of FIG. 88.

FIG. 88 schematically shows an enlarged aerial pattern on a memory cell array region of a nonvolatile semiconductor memory according to the fourth embodiment of the present invention. FIGS. 89 through 91 are schematic cross-sectional diagrams cut along the lines I-I, II-II, and III-III of FIG. 88, respectively.

There is a difference from the second and the third embodiment of the present invention shown in FIGS. 75 through 79 and FIGS. 80 through 83, respectively, in that each of the source line additional interconnecting lines SL2A is connected in a 'diagonal', not connected in a stair-shape or in a ladder-shape. Here, 'diagonal' means that there is a component aligned diagonal to the directions of each data transfer line and each data select line, and may be a linear diagonal. Alternatively, the fine structure may include a fine stair-shape.

The nonvolatile semiconductor memory, according to the fourth embodiment of the present invention, can have a shortened peripheral length and a shortened total extension length of the source line 2 elements 2 (SL2E2) with the same SL2E2 interconnect widths and pattern pitch as those of the second embodiment. As a result, the resistance of the vertical component can be reduced to a minimum by connecting the interconnects in a 'diagonal' as with the fourth embodiment of the present invention. In addition, damage to the interconnect edges during fabrication of the source lines SL2 can be reduced to less than that in the case of the nonvolatile semiconductor memory according to the second embodiment, resulting in improvement of reliability.

Figure 92:
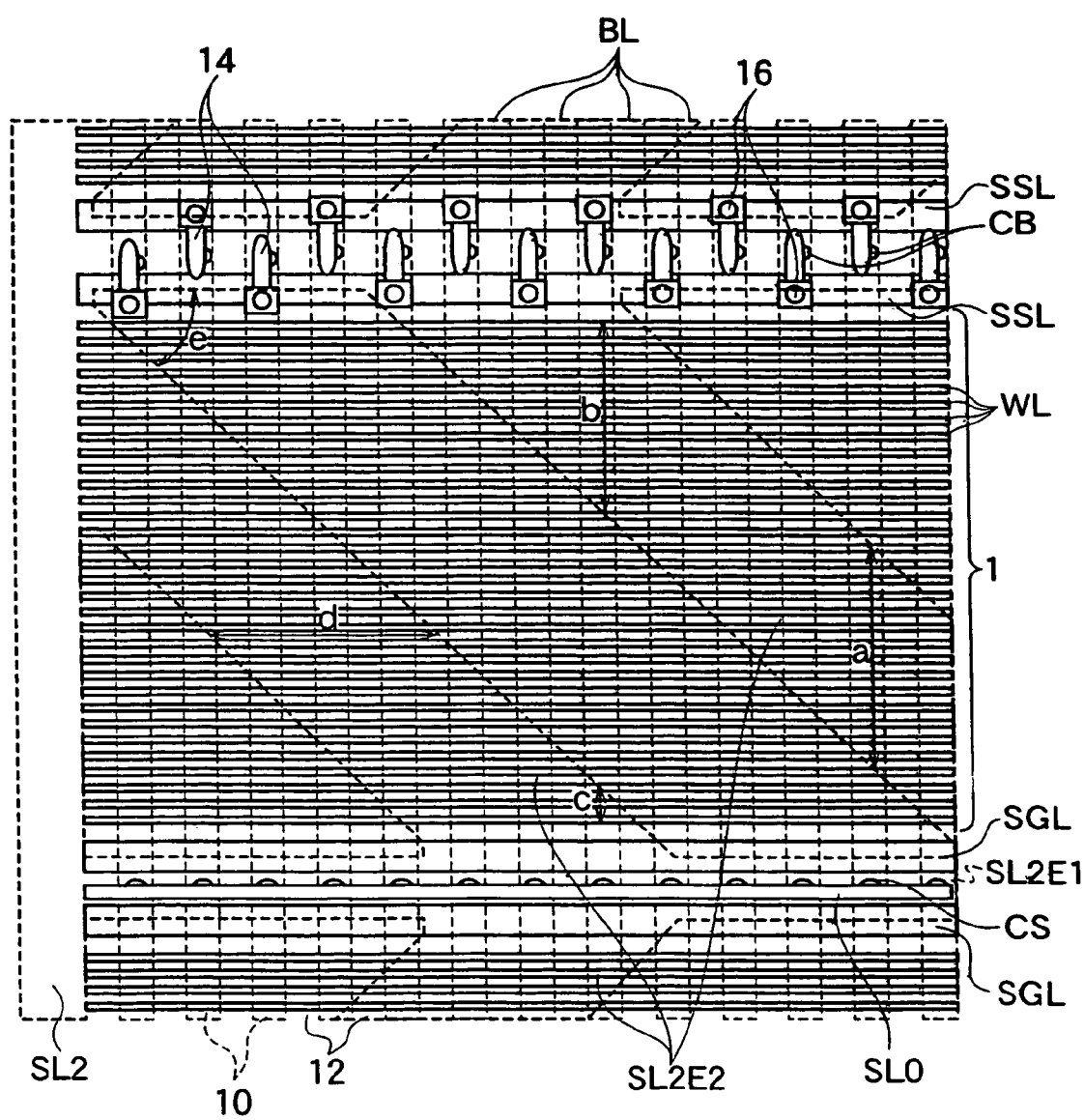
FIG. 92 is an aerial pattern diagram for describing a detailed source line pattern on the memory cell array region of the nonvolatile semiconductor memory according to the fourth embodiment of the present invention.

FIG. 92 shows a specific pattern diagram of the source line SL2 elements in a NAND memory cell string. FIG. 92 shows source line 2 element 2 (SL2E2) patterns in a single NAND block, each indicated by a dashed line. FIG. 92 shows an exemplary NAND block including thirty two data select lines. WL, one select gate line SSL, and one select gate line SGL; wherein memory cell transistors are formed at the intersections between the respective device regions and the memory cell data select lines WL. Different from the nonvolatile semiconductor memory according to the second embodiment of the present invention shown in FIGS. 75 through 79, the source line SL2 elements 2 (SL2E2) are diagonally formed within a single NAND block. More specifically, the number of the data select lines WL included in the range of width a shown in FIG. 92 (14 in the drawing) is almost equal to the sum of the number of the data select lines WL included in the range of widths b and c shown in FIG. 92 (12+2=14 in the drawing), making the coverage rate of the source lines SL2 formed over a single NAND string almost the same.

In this manner, throughout all NAND strings included in all data transfer lines BL, the coverage rate of the source lines SL2 formed over each NAND string is almost the same. Note that FIG. 92 shows a structure including fourteen memory cell data select lines WL with a width of a, and a width of (b+c); alternatively, any number thereof is available as far as the width a is almost equal to the width (b+c). However, the minimum fabrication line width of each of the source lines SL2 is typically more than four times the minimum fabrication line width of each of the memory cell transistors in order to fabricate thick source lines SL2. Therefore, it is desirable that the number of the memory cell data select lines WL is two or more, and the line width thereof is between 0.1 „m and 2 „m. In addition, while it is unnecessary for the width d of each of the source line 2 element 2 (SL2EL2) extending along the data select lines WL to be the same, it is desirable for the width to be between 0.1 „m and 2 „m to sufficiently diffuse hydrogen into the memory cell transistors thereunder. Furthermore, it is desirable that the angle of the diagonal is 45 degrees for mask data processing.

In addition, with the nonvolatile semiconductor memory according to the fourth embodiment of the present invention, as with the case shown in the second and the third embodiment, the ratio of the source line additional interconnecting region SL2A covering each single cell is designed so as to be the same within a single block. Since effects thereof are the same as the second embodiment of the present invention, description thereof is omitted. In addition, since a fabrication method is the same as the first embodiment, description thereof is omitted.

Fifth Embodiment (Virtual Ground AND Type)

Figure 93:
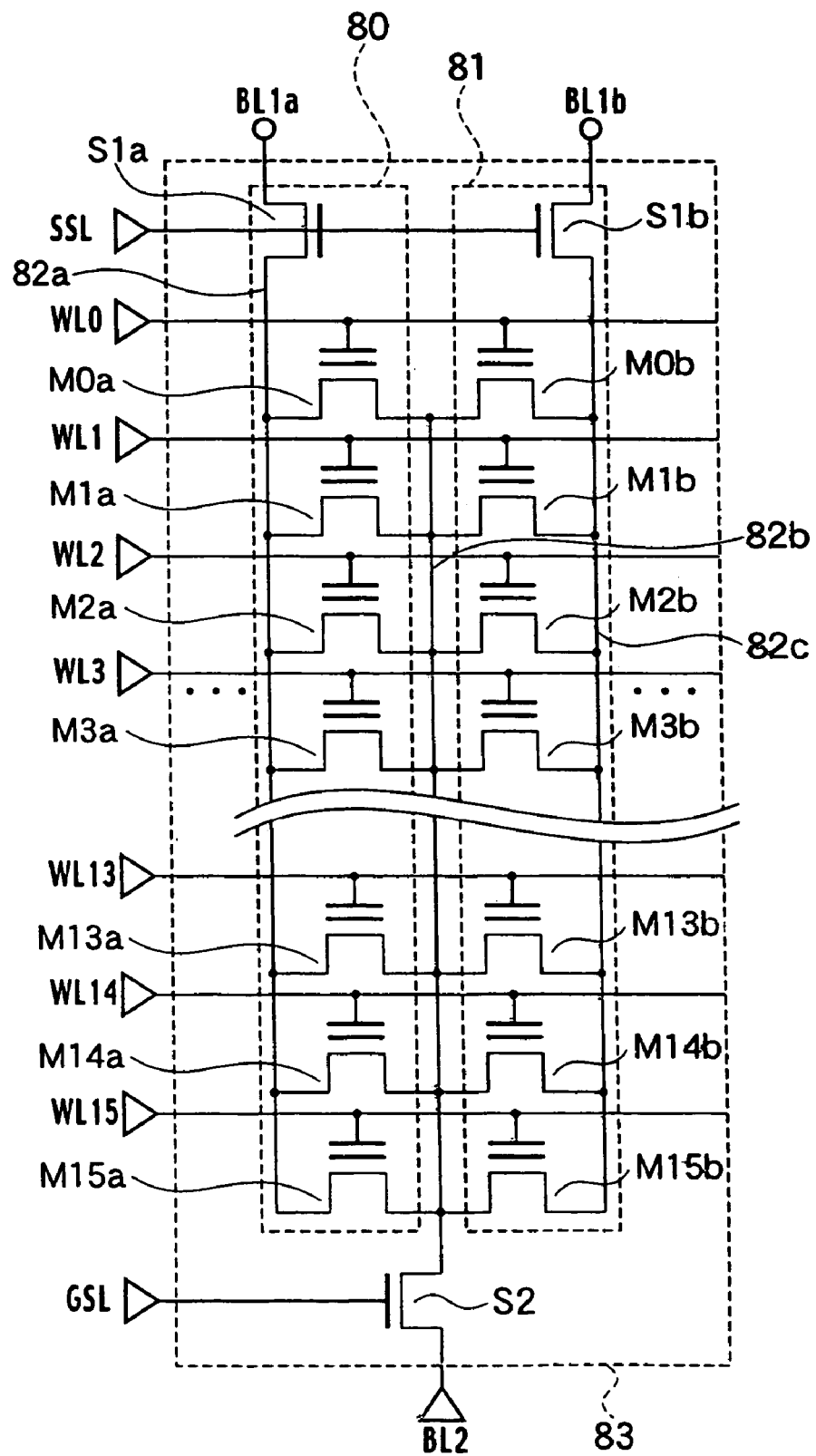
FIG. 93 is a circuit diagram of a virtually ground AND memory cell array of a nonvolatile semiconductor memory according to a fifth embodiment of the present invention.
Figure 94:
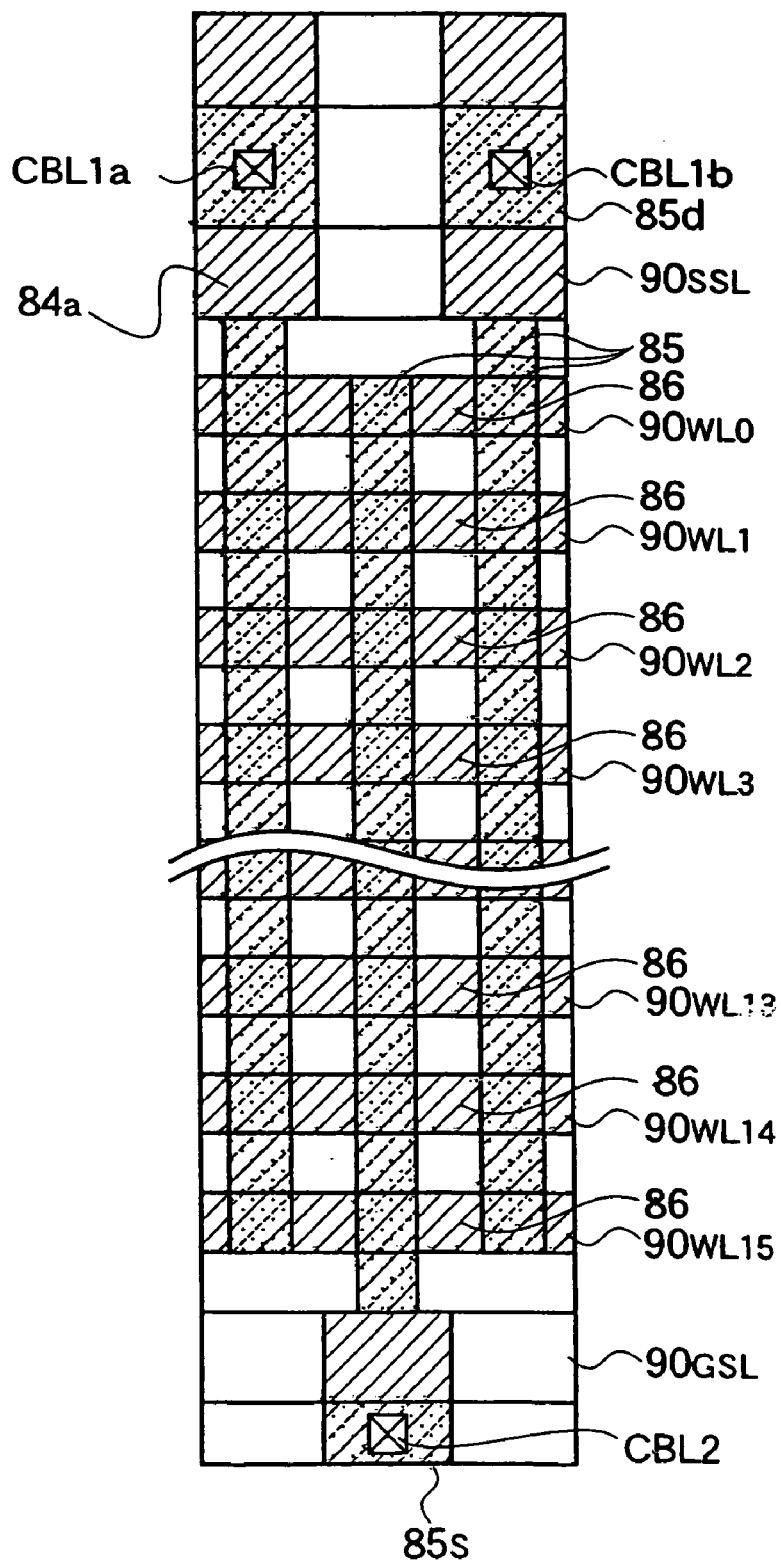
FIG. 94 is an aerial pattern diagram of the virtually ground AND memory cell array of the nonvolatile semiconductor memory according to the fifth embodiment of the present invention.

FIGS. 93 and 94 show a semiconductor memory according to the fifth embodiment of the present invention. In the fifth embodiment of the present invention, virtual ground memory cell units 83 are used in place of the NAND memory cell units 51 in the first through the fourth embodiment. The same reference numerals are attached to identical parts among the first through the fourth embodiment, and description thereof is omitted.

FIGS. 93 and 94 are a schematic circuit diagram and a schematic aerial pattern diagram of a virtual ground memory cell unit, respectively. In FIG. 93, the virtual ground memory cell unit 83 includes a first memory cell unit 80 connected between local data lines 82a and 82b, and a second memory cell unit 81 connected between local data lines 82b and 82c. The current terminals of nonvolatile memory cell transistors M0a to M15a with the basic structure shown in FIGS. 10 and 11 are connected in parallel, and one end thereof is connected to a data transfer line BL1a via a block select transistor S1a. In addition, the other end thereof is connected to an adjacent data transfer line BL2 via a block select transistor S2. The control electrodes of the nonvolatile memory cell transistors M0a to M1a are connected to the data select lines WL0 to WL15, respectively. Furthermore, to select a single memory cell block from among multiple memory cell blocks aligned along the data transfer lines BL and connect the selected block to the data transfer lines BL, the control electrode of the block select transistor S1b is connected to a block select gate line SSL. In addition, the control electrode of the block select line transistor S2 is connected to a block select gate line GSL. Furthermore, respective nonvolatile memory cell transistors M0b to M15b are formed adjacent to the nonvolatile memory cell transistors M0a to M15a in the extending direction of the data select lines WL0 to WL10, and both cells are connected to a local data transfer line 82b. As a result, the so-called virtual ground memory cell unit 83 (indicated by a dashed line) is formed. In the fifth embodiment, the block select gate lines SSL and GSL are formed using the interconnects in the same layer as that for the data select lines WL0 to WL15 of the memory cell transistors. In addition, it is desirable to establish a high density structure in which a single virtual ground memory cell unit 83 has at least one block select line formed parallel to the data select lines. While in the fifth embodiment, the example where sixteen ($=2^4$) memory cell transistors are connected to the virtual ground memory cell unit 83 is given, a plurality of the memory cell transistors should be connected to the data transfer lines BL and the data select lines WL, and more specifically, $2^n$ (n is a positive integer) is desirable for decoding addresses. FIG. 93 shows only the structure beneath the gate control lines $90_{WL0}$ to $90_{WL15}$ in order to clarify the cell structure.

Block select lines $90_{SSL}$ and $90_{GSL}$ are connected to the select gate line SSL and the select gate line GSL, respectively, and formed in the same layer as that for the EEPROM control lines WL0 to WL15. As shown in FIGS. 93 and 94, the block select transistor S1 is a MOSFET made up of n-type diffused layers 85 and 85d used as a source and a drain region, and a block select line $90_{SSL}$ used as a gate electrode; and a block select transistor S2 is a MOSFET made up of n-type diffused layers 85 and 85s used as a source and a drain region, and a block select line 90$_{GSL}$ used as a gate electrode.

In the fifth embodiment of the present invention, since virtual ground memory cell transistors are used, the resistance of the serially connected memory cell units can be small and constant, which is preferable for stabilizing the thresholds for a multivalue structure. Furthermore, a bit of data can be stored in each of the nearby areas of two n-type diffused layers in a single transistor in conformity with the current flow direction, and can be read out therefrom. This is desirable to establish a high density structure. Furthermore, in the fifth embodiment, in addition to the features of the first through the fourth embodiment, since the memory cell transistors are connected in parallel, a cell current large amount can be used and, data can be read out at a high speed.

While in the first through the fourth embodiment of the present invention, a nonvolatile semiconductor memory, which uses a NAND memory cell unit as the basic structure of a memory cell array region, has been described, a similar power supply and electrode layout may be used for the nonvolatile semiconductor memory, which uses a virtual ground memory cell unit isolated by select gates as the basic structure of a memory cell array region, and similar effects may be achieved.

[Modified Example of the Fifth Embodiment]

(AND Type)

Figure 95:
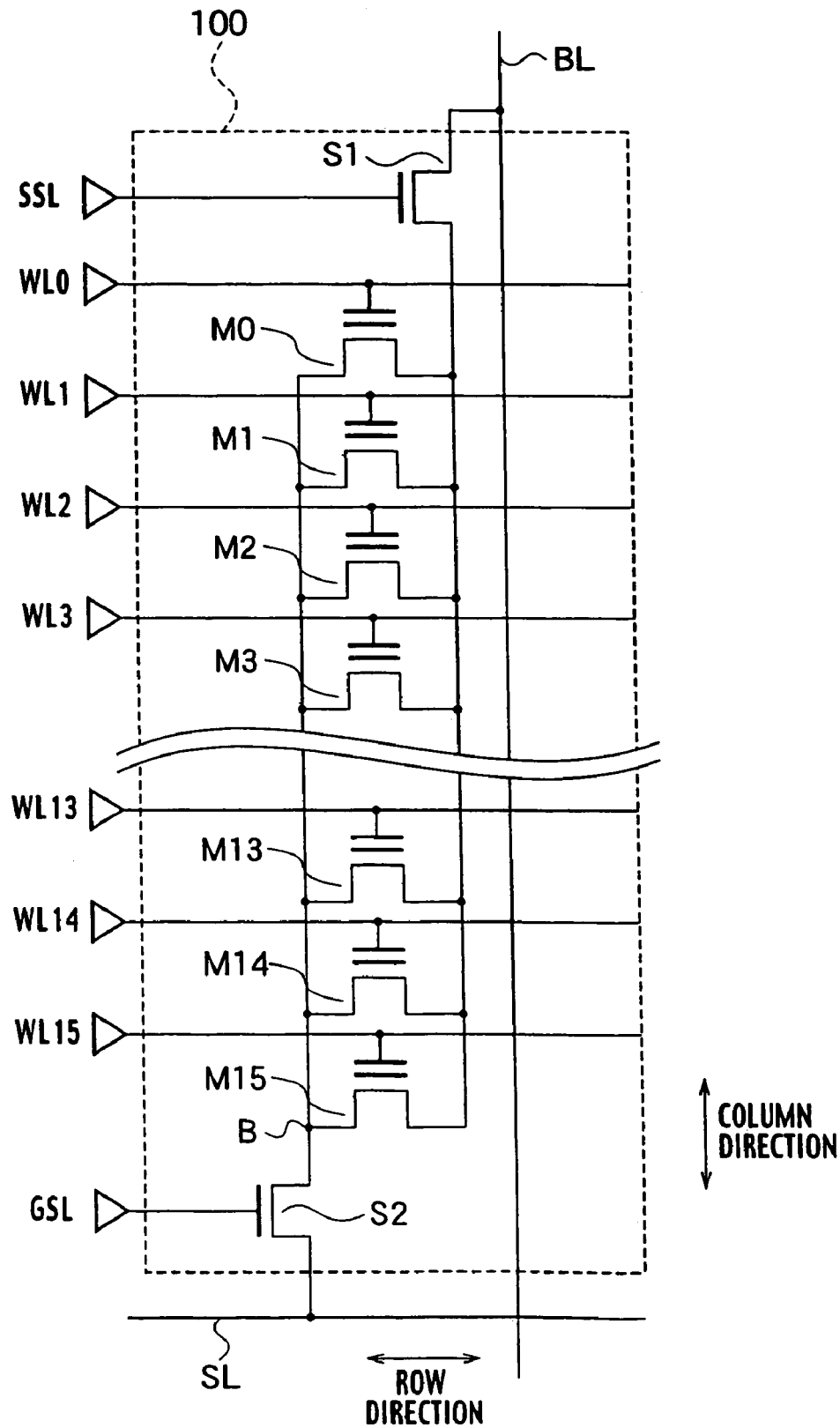
FIG. 95 is a circuit diagram of an AND memory cell array of a nonvolatile semiconductor memory according to a sixth embodiment of the present invention.
Figure 96:
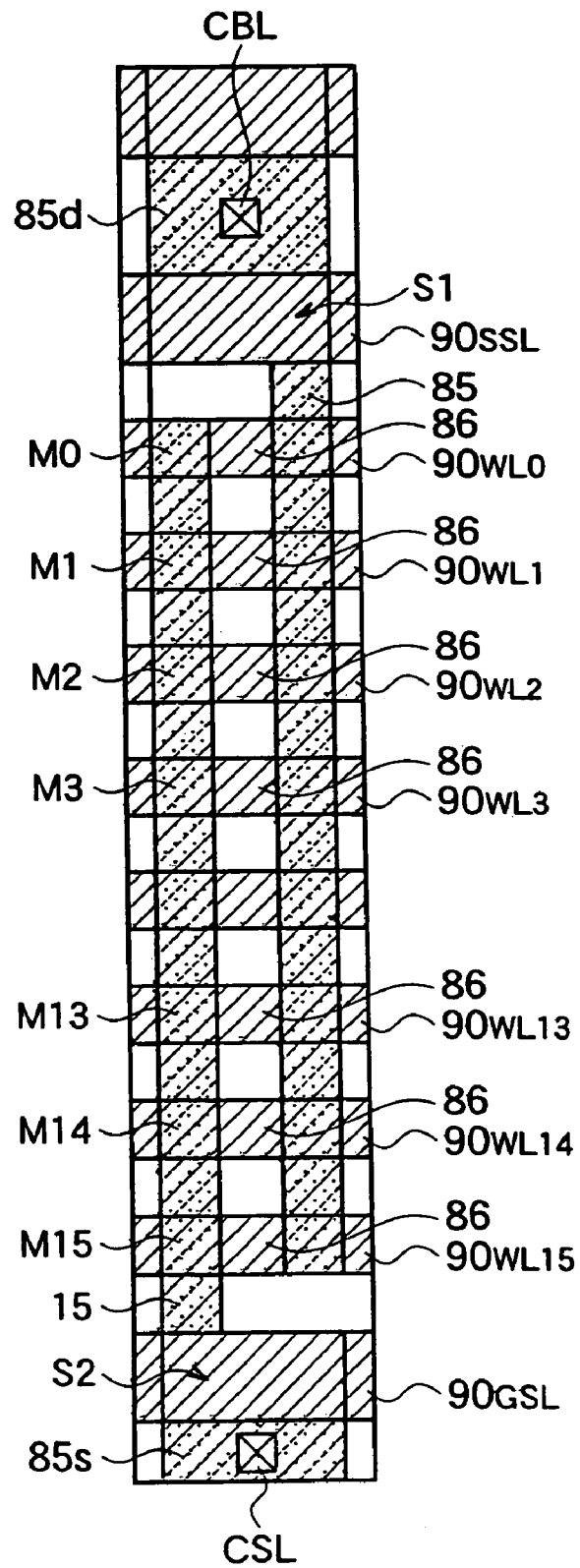
FIG. 96 is an aerial pattern diagram of the AND memory cell array of the nonvolatile semiconductor memory according to the sixth embodiment of the present invention.

FIGS. 95 and 96 show a modified example of the nonvolatile semiconductor memory according to the fifth embodiment of the present invention. FIG. 95 shows a schematic circuit diagram of an exemplary AND memory cell unit, and FIG. 96 shows a schematic aerial pattern diagram of an exemplary AND memory cell unit 100 in FIG. 95. The basic structure of the AND memory cell unit is substantially the same as the virtual ground AND structure described in the fifth embodiment. In other words, as is found from a comparison of FIGS. 93 and 95 or FIGS. 94 and 96, the AND memory cell unit 100 is structured by using only either a memory cell unit 80 or 81 in the virtual ground memory cell unit 83, which is made up of the first memory cell unit 80 and the second memory cell unit 81. Since the circuit structure and the aerial pattern structure of the AND memory cell unit 100 are substantially the same as those of the virtual ground memory cell unit, description thereof is omitted.

In the first through the fourth embodiment of the present invention, a nonvolatile semiconductor memory, which uses a NAND memory cell unit as the basic structure of a memory cell array region has been described. A similar power supply and electrode layout can be used for a nonvolatile semiconductor memory, which uses an AND memory cell unit isolated by select gates as the basic structure of a memory cell array region, and similar effects can be obtained.

Other Embodiments

As described above, the present invention is described according to the first through the fifth embodiment; however, it should not be perceived that descriptions forming a part of this disclosure and drawings are intended to limit the present invention. Various alternative embodiments, working examples, and operational techniques will become apparent from this disclosure for those skills in the art. In this manner, the present invention naturally includes various embodiments not described herein.

The method of forming a device isolating film or an insulator film may use, for example, doping oxygen ions into deposited silicon or oxidizing the deposited silicon, other than the method of converting silicon into a silicon insulator film or a silicon nitride film. In addition, $TiO_2$, $Al_2O_3$, a tantalum insulator film, strontium titanate, barium titanate, lead zirconium titanate, a ZrSiO film, a HfSiO film, a HfSiON film, or a stacked layer thereof may be used for the inter-polysilicon insulator film 42. Furthermore, a sidewall insulator film and a mask insulator film may be an oxidization-proof insulator film such as an $Al_2O_3$ film, a ZrSiO film, a HfSiO film, a ZrSiON film, a HfSiON film, a SiN film, a SiON film, or a stacked layer thereof. While the p-silicon substrate is considered as the semiconductor substrate 26 in the embodiments, an n-silicon substrate, a silicon-on-insulator (SOI) silicon layer of an SOI substrate, or a silicon-included single crystal semiconductor substrate, such as a SiGe mixed crystal or a SiGeC mixed crystal, may be used instead. Moreover, while formation of an n-MOSFET upon the p-type semiconductor substrate 26 has been described above, it may be replaced with formation of a p-MOSFET on the n-type semiconductor substrate. In this case, a n-type region in the above embodiments may be substituted with a p-type region, and a p-type region substituted with a n-type region, and the doping impurities As, P, and Sb may be replaced with either In or B. Furthermore, a silicon semiconductor, a SiGe mixed crystal, a SiGeC mixed crystal, or a stacked layer thereof may be used for the gate electrode. In addition, a silicide or a polycide such as TiSi, NiSi, CoSi, TaSi, WSi, or MoSi, or a metal such as Ti, Al, Cu, TiN, or W may be used as a metallic material for the control gate. Furthermore, a new source line SL2 layout is shown in the embodiments; however, a similar layout may be used for a well shunt interconnect in the memory cell array. In this case, the potential of the p-well region where a memory cell transistor is formed is further stabilized. As a result, change in the well potential developed due to the data transfer lines boosted when reading or writing data may be controlled, and the timing margin may decrease until the well potential becomes stable. This allows even faster read-out and write-in operation.

In addition, the embodiments of the present invention can be modified and implemented in various ways as long as not deviating from the summary of the present invention. Accordingly, a technical range of the present invention is determined only by specified features of the invention according to the above-mentioned descriptions and appropriate appended claims.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A nonvolatile semiconductor memory, comprising:
   memory cell units including parallel data select lines, data transfer lines crossing the data select lines and aligned in parallel to each other, and electrically rewritable memory cell transistors disposed at intersections of the data transfer lines and the data select lines;

a memory cell array block in which the memory cell units are disposed along the data select lines;

first source lines connected to one end of the memory cell units and aligned along the data select lines; and second source lines electrically connected to the first source lines, the second source lines including interconnects that are each formed in a stair-shape.

2. The nonvolatile semiconductor memory of claim 1, further comprising:

a power supply interconnect; and a first transistor disposed between the power supply interconnect and the second source lines.

3. The nonvolatile semiconductor memory of claim 2, wherein the power supply interconnect is connected to a power supply interconnect pad provided on only one side of a chip.

4. The nonvolatile semiconductor memory of claim 1, wherein the first source lines are W or WSi, and the second source lines are aluminum or copper.

5. The nonvolatile semiconductor memory of claim 1, wherein the second source lines are provided at intervals that are integer multiples of an interval of the memory cell units.

6. The nonvolatile semiconductor memory of claim 1, wherein 'z' denotes a width of each second source line, 'y' denotes a height from the semiconductor substrate to the second source line, and the width 'z' satisfies a relation 'z/2<y'.

7. A nonvolatile semiconductor memory, comprising:

memory cell units including parallel data select lines, data transfer lines crossing the data select lines and aligned in parallel to each other, and electrically rewritable memory cell transistors disposed at intersections of the data transfer lines and the data select lines;

a memory cell array block in which the memory cell units are disposed along the data select lines;

first source lines connected to one end of the memory cell units and aligned along the data select lines; and second source lines electrically connected to the first source lines, the second source lines including interconnects that are each formed in a linear diagonal shape.

8. The nonvolatile semiconductor memory of claim 7, further comprising:

a power supply interconnect; and a first transistor disposed between the power supply interconnect and the second source lines.

9. The nonvolatile semiconductor memory of claim 8, wherein the power supply interconnect is connected to a power supply interconnect pad provided on only one side of a chip.

10. The nonvolatile semiconductor memory of claim 7, wherein the first source lines are W or WSi, and the second source lines are aluminum or copper.

11. The nonvolatile semiconductor memory of claim 7, wherein the second source lines are provided at intervals that are integer multiples of an interval of the memory cell units.

12. The nonvolatile semiconductor memory of claim 7, wherein 'z' denotes a width of each second source line, 'y' denotes a height from the semiconductor substrate to the second source line, and the width 'z' satisfies a relation 'z/2<y'.

13. A nonvolatile semiconductor memory, comprising:

memory cell units including parallel data select lines, data transfer lines crossing the data select lines and aligned in parallel to each other, and electrically rewritable memory cell transistors disposed at intersections of the data transfer lines and the data select lines;

a memory cell array block in which the memory cell units are disposed along the data select lines;

first source lines connected to one end of the memory cell units and aligned along the data select lines; and second source lines electrically connected to the first source lines, the second source lines including interconnects that are each formed in one of a stair-shape and a linear diagonal shape, wherein the second source lines are provided above the first source lines.

14. The nonvolatile semiconductor memory of claim 13, further comprising:

a power supply interconnect; and a first transistor disposed between the power supply interconnect and the second source lines.

15. The nonvolatile semiconductor memory of claim 14, wherein the power supply interconnect is connected to a power supply interconnect pad provided on only one side of a chip.

16. The nonvolatile semiconductor memory of claim 13, wherein the first source lines are W or WSi, and the second source lines are aluminum or copper.

17. The nonvolatile semiconductor memory of claim 13, wherein the second source lines are provided at intervals that are integer multiples of an interval of the memory cell units.

18. The nonvolatile semiconductor memory of claim 13, wherein 'z' denotes a width of each second source line, 'y' denotes a height from the semiconductor substrate to the second source line, and the width 'z' satisfies a relation 'z/2<y'.

19. The nonvolatile semiconductor memory of claim 13, wherein the second source lines are provided above the memory cell transistors.

* * * * *